US009767893B2

(12) United States Patent
Nii et al.

(10) Patent No.: US 9,767,893 B2
(45) Date of Patent: *Sep. 19, 2017

(54) SEMICONDUCTOR MEMORY DEVICE THAT CAN STABLY PERFORM WRITING AND READING WITHOUT INCREASING CURRENT CONSUMPTION EVEN WITH A LOW POWER SUPPLY VOLTAGE

(71) Applicant: RENESAS ELECTRONICS CORPORATION, Tokyo (JP)

(72) Inventors: Koji Nii, Tokyo (JP); Shigeki Obayashi, Tokyo (JP); Hiroshi Makino, Tokyo (JP); Koichiro Ishibashi, Tokyo (JP); Hirofumi Shinohara, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/274,852

(22) Filed: Sep. 23, 2016

(65) Prior Publication Data

US 2017/0011794 A1     Jan. 12, 2017

Related U.S. Application Data

(63) Continuation of application No. 14/942,822, filed on Nov. 16, 2015, now Pat. No. 9,496,028, which is a
(Continued)

(30) Foreign Application Priority Data

May 23, 2005  (JP) ................................. 2005-149265
Apr. 10, 2006  (JP) ................................. 2006-107643

(51) Int. Cl.
*G11C 5/14*       (2006.01)
*G11C 11/419*   (2006.01)
(Continued)

(52) U.S. Cl.
CPC ............ *G11C 11/419* (2013.01); *G11C 5/063* (2013.01); *G11C 11/412* (2013.01)

(58) Field of Classification Search
CPC ... G11C 11/412; G11C 11/413; G11C 7/1006; G11C 7/14; G11C 7/22; G11C 8/12; G11C 7/18
(Continued)

(56) References Cited

U.S. PATENT DOCUMENTS 4,288,865 A   9/1981  Graham
4,310,900 A   1/1982  Tsujide
(Continued)

FOREIGN PATENT DOCUMENTS

JP       55-64686      5/1980
JP       60-038796     2/1985
(Continued)

OTHER PUBLICATIONS

Japanese Office Action, and English translation thereof, issued in Japanese Patent Application No. 2011-271914 dated Nov. 27, 2012.
(Continued)

*Primary Examiner* — Fernando Hidalgo
(74) *Attorney, Agent, or Firm* — McDermott Will & Emery LLP

(57) ABSTRACT

Cell power supply lines are arranged for memory cell columns, and adjust impedances or voltage levels of the cell power supply lines according to the voltage levels of bit lines in the corresponding columns, respectively. In the data write operation, the cell power supply line is forced into a floating state according to the bit line potential on a selected column and has the voltage level changed, and a latching capability of a selected memory cell is reduced to write data
(Continued)

fast. Even with a low power supply voltage, a static semiconductor memory device that can stably perform write and read of data is implemented.

6 Claims, 48 Drawing Sheets

Related U.S. Application Data continuation of application No. 14/151,581, filed on Jan. 9, 2014, now Pat. No. 9,218,873, which is a continuation of application No. 13/492,530, filed on Jun. 8, 2012, now Pat. No. 8,630,142, which is a continuation of application No. 13/186,769, filed on Jul. 20, 2011, now Pat. No. 8,218,390, which is a continuation of application No. 12/367,871, filed on Feb. 9, 2009, now Pat. No. 8,009,500, which is a continuation of application No. 11/438,668, filed on May 23, 2006, now Pat. No. 7,502,275.

(51) Int. Cl.
*G11C 5/06* (2006.01)
*G11C 11/412* (2006.01)

(58) Field of Classification Search
USPC ......... 365/154, 189.07, 189.08, 189.09, 196, 365/189.16, 226, 189.06, 230.03
See application file for complete search history.

(56) References Cited

U.S. PATENT DOCUMENTS

| | | | |
|---|---|---|---|
| 4,685,087 A | 8/1987 | Shah | |
| 5,060,200 A | 10/1991 | Miura et al. | |
| 5,060,230 A | 10/1991 | Arimoto et al. | |
| 5,072,286 A | 12/1991 | Minami et al. | |
| 5,159,571 A | 10/1992 | Ito et al. | |
| 5,519,650 A | 5/1996 | Ichimura et al. | |
| 5,535,172 A | 7/1996 | Reddy et al. | |
| 6,903,962 B2 | 6/2005 | Nii | |
| 8,218,390 B2 | 7/2012 | Nii et al. | |
| 2002/0167849 A1 | 11/2002 | Ohbayashi et al. |
| 2002/0176306 A1 | 11/2002 | Abe et al. |
| 2003/0002329 A1 | 1/2003 | Wong |
| 2003/0090928 A1 | 5/2003 | Takemura |
| 2004/0109361 A1 | 6/2004 | Eby et al. |
| 2004/0125644 A1 | 7/2004 | Komatsuzaki |
| 2004/0125681 A1 | 7/2004 | Yamaoka et al. |
| 2004/0130933 A1 | 7/2004 | Kanehara et al. |
| 2004/0227542 A1 | 11/2004 | Bhavnagarwala et al. |
| 2004/0246805 A1 | 12/2004 | Nii |
| 2005/0226077 A1 | 10/2005 | Itoh et al. |
| 2006/0044866 A1 | 3/2006 | Tsukamoto et al. |
| 2006/0056229 A1 | 3/2006 | Maeda et al. |

FOREIGN PATENT DOCUMENTS

| | | |
|---|---|---|
| JP | 02-108297 | 4/1990 |
| JP | 09-147564 | 6/1997 |
| JP | 2000-182380 A | 6/2000 |
| JP | 2002-042476 A | 2/2002 |
| JP | 2003-022677 A | 1/2003 |
| JP | 2003-151277 A | 5/2003 |
| JP | 2004-199829 A | 7/2004 |
| JP | 2004-303340 A | 10/2004 |
| JP | 2004-362695 A | 12/2004 |

OTHER PUBLICATIONS

Taiwanese Office Action with English Translation issued in Taiwanese Application No. 095117242 mailed Jun. 26, 2013.
Japanese Office Action, with English Translation, issued in Japanese Patent Application No. 2006-107643, mailed Nov. 1, 2011.
Final Decision for Rejection Japanese Patent Application No. 2013-229191 dated Mar. 17, 2015 with English translation.
Non-Final Office Action U.S. Appl. No. 14/151,581 dated Jan. 9, 2014.
Notice of Allowance U.S. Appl. No. 14/151,581 dated Aug. 14, 2015.
Japanese Office Action issued in Japanese Application No. 2013-229191 dated Jul. 8, 2014, with English translation.
Non-Final Office Action U.S. Appl. No. 14/942,822 dated Apr. 22, 2016.
Notice of Allowance U.S. Appl. No. 14/942,822 dated Jun. 24, 2016.
Office Action Taiwanese Patent Application No. 104138423 dated Nov. 29, 2016 with full translation.

SEMICONDUCTOR MEMORY DEVICE THAT CAN STABLY PERFORM WRITING AND READING WITHOUT INCREASING CURRENT CONSUMPTION EVEN WITH A LOW POWER SUPPLY VOLTAGE

CROSS-REFERENCE TO RELATED APPLICATIONS

This application is a Continuation application of U.S. Ser. No. 14/942,822, filed Nov. 16, 2015, which is a Continuation of U.S. application Ser. No. 14/151,581, filed on Jan. 9, 2014, now U.S. Pat. No. 9,218,873, which is a Continuation of U.S. application Ser. No. 13/492,530, filed on Jun. 8, 2012, now U.S. Pat. No. 8,630,142, which is a Continuation of U.S. application Ser. No. 13/186,769, filed on Jul. 20, 2011, now U.S. Pat. No. 8,218,390, which is a Continuation of U.S. application Ser. No. 12/367,871, filed on Feb. 9, 2009, now U.S. Pat. No. 8,009,500, which is a Continuation of U.S. application Ser. No. 11/438,668, filed on May 23, 2006, now U.S. Pat. No. 7,502,275, claiming priority of Japanese Patent Application No. 2005-149265, filed on May 23, 2005 and Japanese Patent Application No. 2006-107643, filed on Apr. 10, 2006. The subject matter of each is incorporated herein by reference in entirety.

BACKGROUND OF THE INVENTION

Field of the Invention

The present invention relates to a semiconductor memory device, and particularly to a static semiconductor memory device (Static Random Access Memory; SRAM) of which memory cells include inverter latches. More particularly, the invention relates to a configuration for stably writing and reading data even under a low power supply voltage condition in a static semiconductor memory device.

Description of the Background Art

When transistors are miniaturized with development of miniaturization technology, voltage scaling according to the miniaturization is required from the viewpoint of reliability and power consumption. However, an influence by variations in manufacturing parameters increases in accordance with miniaturization, and accordingly, threshold voltages of transistors forming memory cells vary increasingly so that an operation margin of a memory lowers, and it becomes difficult to perform stable reading and writing with a low power supply voltage.

Various configurations have been proposed aiming to stably write and read data in the SRAM (Static Random Access Memory) even with such a low power supply voltage.

For example, a prior art reference 1 (Japanese Patent Laying-Open No. 2002-042476) has disclosed such a configuration that a voltage at the same level as an external power supply voltage is supplied to SRAM cells as an operation power supply voltage in a data read operation, and a voltage (VCC−VTH) lower than the external power supply voltage is supplied to the memory cells as the operation power supply voltage in a data write operation. In the data write operation, a Static Noise Margin (SNM) of the memory cell selected by a word line decreases so that data held in the memory cell can be easily inverted, and a write margin is improved.

A prior art reference (Japanese Patent Laying-Open No. 2004-303340) has disclosed a configuration in which substrate (back gate) potentials are controlled in units of SRAM cell columns so that the back gate potentials of the memory cells in a selected column are made different between the data writing and the data reading, to speed up the data writing. In the data writing, the source to the back gate is deeply reverse-biased, to reduce the static noise margin of the memory cell for performing fast data writing. In the read operation, the source to the back gate of the memory cell transistor is shallowly reverse-biased, to increase the static noise margin for holding the data stably.

Further, a prior art reference 3 (Japanese Patent Laying-Open No. 2004-362695) has disclosed a configuration in which voltage levels of VDD and VSS source lines supplying high and low-power supply voltages to the memory cells are controlled in units of SRAM cell columns. In the standby state and the data write operation, levels of power supply voltages VDD/VSS are set to a level at which an absolute value of a gate-source voltage of a memory cell transistor is reduced so that a gate leakage current is suppressed, and a current consumption in the write operation and standby state is reduced. In a read operation, the VDD/VSS source line potential in the selected column are set to a level at which the absolute value of the gate to source voltage of the memory cell transistor is increased to increase a current drive power of the memory cell transistor for achieving fast data reading.

In the configuration disclosed by the prior art reference 1, a common voltage is supplied from a voltage supply circuit to the memory cells in the memory cell array as an internal power supply voltage of the memory cells. Therefore, the write margin can be improved by lowering the internal voltage (operation power supply voltage) of the memory cells in the write cycle. All the memory cells connected to the word line that is selected and activated by a row decoder have the internal voltage lowered. Therefore, the static noise margin decreases in the memory cell on the column that is selected by a column decoder as a write target, allowing easy writing. At the same time, however, the static noise margins similarly lower in the memory cells of non-write-target on an unselected column and the selected row, and writing of data (inversion of held data) is liable to occur in these memory cells. Therefore, read margins (static noise margins) decrease in these memory cells on the selected row and the unselected column, and a bit line current (column current) may invert the data to cause destruction of stored data.

The configuration disclosed in the prior art reference 2 changes the substrate potentials on a column-by-column basis for improving the write margin. A column address signal is used for controlling the setting of substrate potentials of a selected column and unselected columns. For controlling the voltage on a column-by-column basis, the substrate region is formed of a well region common to the memory cells in one column, and has relatively large resistance and capacitance. In particular, when the memory cell capacity is increased, an increased number of memory cells are arranged in one column. For suppressing the interconnection resistance and capacitance of the substrate region in such a state, it is desired to arrange switching elements in a plurality of positions of each column for selecting a substrate potential. For selecting the substrate potential in this case, a column address signal interconnection for the column selection must be made for the switching elements provided for selecting the substrate potential. This increases the number of interconnection lines to increase an interconnection layout area, resulting in an increased area of a memory cell array. Further, a drive circuit and others are additionally required for fast transmission of a column address signal (column select signal) to the switching elements provided for the substrate potential selection, and this configuration increases a circuit scale as well as current consumption. Further, the above configuration increases lengths of interconnection lines that transmit signals for controlling the switching elements provided for the substrate potential selection, which increases the charge/discharge currents on the interconnection lines transmitting the switching element control signals, and thus increases power consumption.

It is necessary to make an adjustment between timing of change of the substrate potential and timing of change of the column address signal so that data writing into the memory cell may be performed in such a state that the static noise margin of the memory cell is lowered. This results in a problem that timing design is difficult.

In the configuration disclosed by the prior art reference 3, the potentials of the VDD/VSS source lines are controlled in units of memory cell columns. Although high-side power supply potential (VDD source potential) of the memory cells or the low-side power supply voltage (VSS source potential) of the memory cells is controlled, this prior art reference 3 aims at reducing the power consumption by reducing the gate leakage current of the memory cell on the unselected column or in the standby state and reducing the charging/discharging currents of the bit lines on the selected column. The prior art reference 3 fails to disclose a configuration for improving the write margin in the data writing. Since the column select signal is used for controlling the potentials of the VDD and VSS source lines, problems similar to those in the prior art reference 2 may occur depending on arrangements of the potential control switches.

SUMMARY OF THE INVENTION

An object of the invention is to provide a semiconductor memory device that can stably perform writing and reading without increasing current consumption even with a low power supply voltage.

Another object of the invention is to provide a static semiconductor memory device that allows easy adjustment of a high-side power supply voltage and/or a potential of a low-side power supply line in a selected column in units of columns with a simple circuit construction.

A semiconductor memory device according to a first aspect of the invention includes a plurality of memory cells arranged in rows and columns; a plurality of bit lines arranged corresponding to memory cell columns and each connected to the memory cells on a corresponding column; a plurality of cell power supply lines, arranged corresponding to the memory cell columns, respectively, each for supplying a first power supply voltage to the memory cells on a corresponding column; and a plurality of write assist circuits, arranged corresponding to the memory cell columns, respectively, each for selectively shutting off the supply of the first power supply voltage to the corresponding cell power supply line according at least to a voltage on the bit line in the corresponding column.

In a preferred embodiment, a dummy source line is provided for transmitting a voltage at a voltage level different from that of the voltage on the cell power supply line. Each write assist circuits shuts off the supply of the first power supply voltage to the corresponding cell power supply line in response to the potential of the corresponding bit line, also shuts off the supply of a second power supply voltage to the dummy source line and electrically couples the corresponding cell power supply line to the dummy source line. This dummy source line is preferably arranged corresponding to each of the memory cell columns.

A semiconductor memory device according to a second aspect of the invention includes a plurality of memory blocks each having a plurality of memory cells arranged in rows and columns; a plurality of local bit lines, arranged corresponding to respective memory cell columns in each of the memory blocks, each connected to the memory cells in the corresponding column; a plurality of cell power supply lines, arranged corresponding to the respective memory cell columns in each of the memory blocks, each for supplying a first power supply voltage to the corresponding memory cells; a plurality of global bit lines provided commonly to the plurality of memory blocks, and arranged corresponding to the respective memory cell columns; and a plurality of write assist circuits, arranged corresponding to the cell power supply lines, each for shutting off the supply of first power supply voltage to the corresponding cell power supply line according to the voltage on the global bit line in the corresponding column.

A semiconductor memory device according to a third aspect of the invention includes a plurality of memory cells arranged in rows and columns; well regions arranged corresponding to memory cell columns, respectively, extending in the column direction and each supporting transistors of the memory cells in the corresponding columns, and write assist circuits, arranged corresponding to the columns, each for controlling voltage supply to the well region in a corresponding column according to a voltage on a bit line in the corresponding column.

A semiconductor memory device according to a fourth aspect of the invention includes a plurality of memory cells arranged in rows and columns; a plurality of bit lines, arranged corresponding to memory cell columns, each connected to the memory cells in the corresponding column; a plurality of first cell power supply lines, arranged corresponding to the memory cell columns, respectively, each for transmitting a first power supply voltage to the memory cells in the corresponding column; a plurality of second cell power supply lines, arranged corresponding to the memory cell columns, respectively, each for transmitting a second power supply voltage to the memory cells in the corresponding column; and a plurality of write assist circuits, arranged corresponding to the memory cell columns, respectively, each for setting voltage levels of the first and second power supply lines so as to reduce a voltage difference between the first and second power supply lines in the corresponding column according to the potential of the bit line in the corresponding column.

A semiconductor memory device according to a fifth aspect of the invention includes a plurality of memory cells arranged in rows and columns; a plurality of bit lines, arranged corresponding to memory cell columns, respectively, each connected to the memory cells in the corresponding column; a plurality of first cell power supply lines, arranged corresponding to the memory cell columns, respectively, each for transmitting a first power supply voltage to the memory cells in the corresponding column; a plurality of second cell power supply lines, arranged corresponding to the memory cell columns, respectively, each for transmitting a second power supply voltage to the memory cells in the corresponding column; and a plurality of write assist circuits, arranged corresponding to the memory cell columns, respectively, each for setting voltage levels of the first and second power supply lines so as to reduce a voltage difference between the first and second power supply lines in the corresponding column according to a write mode instruction signal and a column select signal.

A voltage supply to a cell power supply line in a memory cell column or to a well region is controlled according to the bit line potential. Therefore, the voltage control for the cell power supply line or the well region can be performed in units of memory cell columns without utilizing a column address signal and performing complicated timing control. Further, by shutting off the supply of the first power supply voltage to the cell power supply line, the cell power supply line attains the floating state or another voltage level, and the power supply potentials of the memory cells in the selected column change to reduce a static noise margin so that fast writing can be achieved. In a standby state or read operation, the bit line potential does not change or changes only slightly, and data can be held and read stably by continuing the power supply to the cell power supply line. By adjusting the voltage to the well region, a back gate bias effect of the memory cell transistor can increase a current driving power of the memory cell transistor so that the data can be written fast.

Since the column select signal is not used, a circuit configuration for controlling the voltage on the power supply lines can be simple, and timing design can be made without considering the timing of the select signal, which facilitates the design. Further, it is not particularly necessary to use the column select signal, and the power consumption can be reduced.

By using the first and second cell power supply lines for adjusting the power supply potential of the memory cell, the potential difference between these cell power supply lines can be changed rapidly, and the write assistance can function at a faster timing so that the writing can be performed fast.

By adjusting the potentials of the first and second cell power supply lines according to the write mode instruction signal and column select signal, the cell power supply voltage in the selected column can be changed before the change of the bit line potential so that the write operation can be performed faster. In the case of utilizing the column select signal, the power supply voltage can be changed for the memory cells in the column subject to the writing, and the first and second power supply voltages are supplied in the data read operation and to the cell power supply lines in the unselected column so that the write and read operations can be performed stably without impairing data storage characteristics of the unselected memory cells and without reducing the operation margin in the data read operation.

Although the column select signal is utilized, the potential adjustment is effected on only the cell power supply line much smaller in parasitic capacitance and parasitic resistance than the substrate region, and therefore can be sufficiently made merely by arranging switching elements for writing assistance at the opposite ends of the cell power supply line, respectively. By arranging this write assist circuit near the column select circuit, complication of the interconnections can be prevented. Further, it is possible to suppress increase in interconnection length, and therefore to suppress increase in current consumption of a column select signal producing section for controlling the potential of the cell power supply line.

Owing to the above, the write and read of data can be stably performed even with a low power supply voltage, and the whole power consumption of the semiconductor memory device can be reduced by lowering the power supply voltage.

The write and read can be performed stably, and margins in write and read can be improved even when transistor characteristics such as a threshold voltage are varied increasingly due to miniaturization of the components. Therefore, yield can be improved, and cost can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[Whole Construction]

Figure 1:
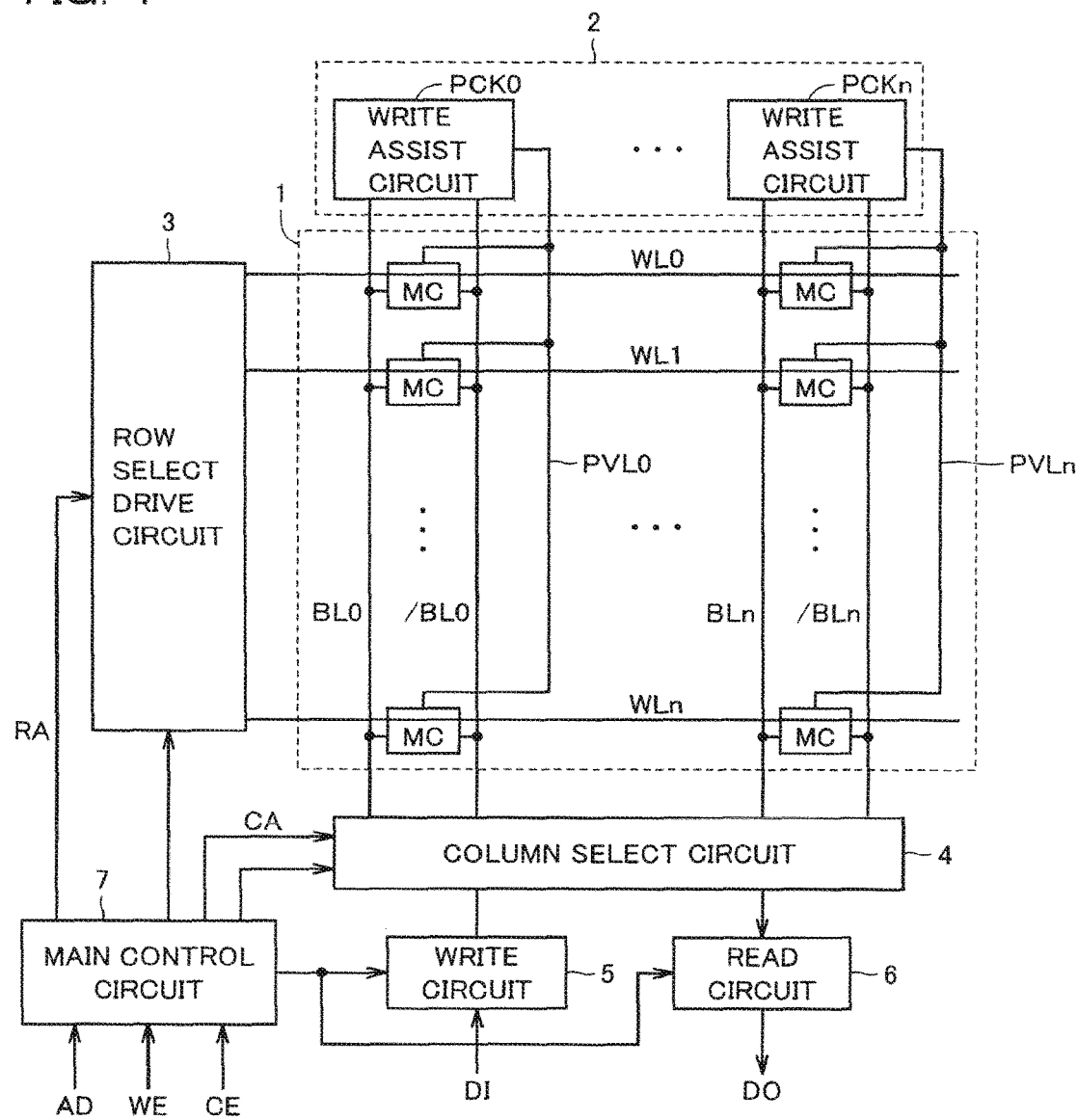
FIG. 1 schematically shows a whole construction of a semiconductor memory device according to the invention.

FIG. 1 schematically shows a whole construction of a semiconductor memory device according to the invention. In FIG. 1, the semiconductor memory device includes a memory cell array 1 having memory cells MC arranged in rows and columns, and a cell power supply control unit 2 that controls memory cell power supply voltages of respective memory cells in units of columns. Bit line pairs BL0 and /BL0, . . . , and BLn and /BLn are arranged corresponding to the columns of the memory cells, respectively. Further, word lines WL0-WLm are arranged corresponding to rows of memory cells MC, respectively.

In memory cell array 1, there are further arranged cell power supply lines PVL0-PVLn of which voltage levels are set in units of memory cell columns.

Cell power supply control unit 2 includes write assist circuits PCK0-PCKn arranged corresponding to bit line pairs BL0 and /BL0, . . . , and BLn and /BLn, respectively. These write assist circuits PCK0-PCKn shut off the supply of the cell power supply voltages to the corresponding cell power supply lines PVL, or sets them to a floating state or to another voltage level according to the voltage levels of corresponding bit line pairs BL0 and /BL0, . . . , and BLn and /BLn, respectively. The cell power supply line transmits one of a high-side power supply voltage VDD, a low-side power supply voltage VSS and a back gate voltage. The memory cell is formed of MOS transistors (insulated gate field effect transistors), and the back gate voltage is a voltage applied to a substrate region thereof.

The semiconductor memory device further includes a row select drive circuit 3 that drives the word line corresponding to an addressed row according to an internal row address signal RA, a column select circuit 4 that selects the bit line pair corresponding to the selected column according to an internal column address signal CA, a write circuit 5 that transmits write data (data to be written) to the bit line pair corresponding to the column selected by column select circuit 4 in a data write operation, a read circuit 6 that produces read data by sensing and amplifying data received from the bit lines corresponding the column selected by column select circuit 4, and a main control circuit 7 that produces internal row address signal RA, internal column address signal CA and control signals required for various operations according to an externally applied address signal AD, a write instruction signal WE and a chip enable signal CE.

Row select drive circuit 3 includes a row decoder for decoding the row address signal as well as a word line drive circuit for driving the selected word line to the selected state according to the result of row decoding, and drives the word line corresponding to the selected row to the selected state according to a word line activation timing signal provided from main control circuit 7. Likewise, column select circuit 4 decodes column address signal CA according to the column select timing signal received from main control circuit 7, and selects the bit line corresponding to the selected column based on the column select signal produced from a result of decoding.

Write circuit 5 includes an input buffer and a write drive circuit, and produces internal write data according to externally supplied write data DI in the data writing. Read circuit 6 includes a sense amplifier circuit and an output buffer, and produces external read data DO by buffering the data that are sensed and amplified by a sense amplifier by an output buffer in a data read mode. Write circuit 5 and read circuit 6 may write or read data of multiple bits, or memory cell array 1 shown in FIG. 1 may be arranged corresponding to one bit of input/output data.

Although in memory cell array 1, there is further provided bit line load circuits that precharge bit line BL0 and /BL0, . . . , and BLn and /BLn to a predetermined voltage, and supply a read current (column current) thereto in data reading, FIG. 1 does not show the bit line load circuits.

Figure 2:
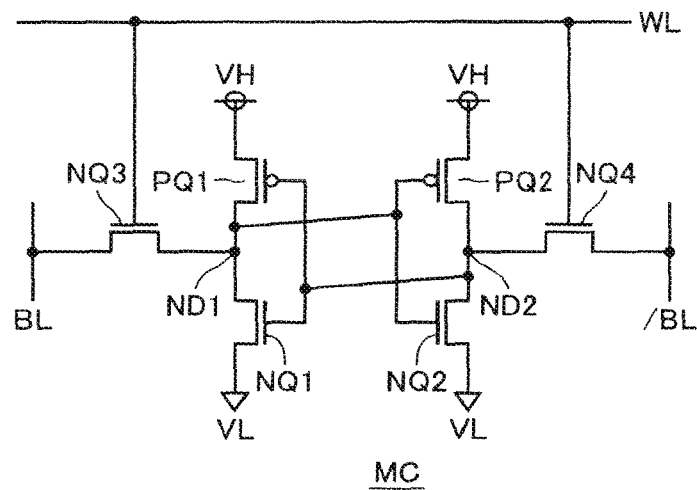
FIG. 2 shows a construction of a memory cell shown in FIG. 1.

FIG. 2 shows an example of a construction of memory cell MC shown in FIG. 1. FIG. 2 shows a construction in which memory cell MC is formed of a full CMOS single-port SRAM cell. In FIG. 2, memory cell MC includes a P-channel MOS transistor (insulated gate field effect transistor) PQ1 connected between a high-side power supply node VH and a storage node ND1 and having a gate connected to a storage node ND2, an N-channel MOS transistor NQ1 connected between storage node ND1 and a low-side power supply node VL, and having a gate connected to storage node ND2, a P-channel MOS transistor PQ2 connected between high-side power supply node VH and storage node ND2 and having a gate connected to storage node ND1, an N-channel MOS transistor NQ2 connected between storage node ND2 and low-side power supply node VL and having a gate connected to storage node ND1, and N-channel MOS transistors NQ3 and NQ4 coupling storage nodes ND1 and ND2 to bit lines BL and /BL according to the voltage on word line WL, respectively.

In the construction of memory cell MC shown in FIG. 2, MOS transistor PQ1 and NQ1 form a CMOS inverter, MOS transistors PQ2 and NQ2 form another CMOS inverter, and these inverters have inputs and outputs cross-coupled to form an inverter latch. Therefore, storage nodes ND1 and ND2 hold data complementary to each other.

Figure 3:
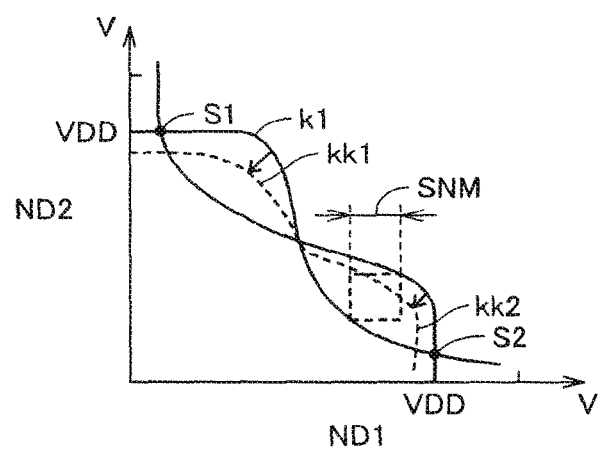
FIG. 3 depicts transmission characteristics of the memory cell shown in FIG. 1.

FIG. 3 shows transmission characteristics of the inverter latch formed of transistors PQ1, PQ2, NQ1 and NQ2 of memory cell MC shown in FIG. 2. In FIG. 3, the abscissa axis measures a voltage level of storage node ND1, and the ordinate axis measures the voltage level of storage node ND2. A curve k1 represents inverter characteristics of MOS transistors PQ1, NQ1 and NQ3, and a curve k2 represents inverter characteristics of MOS transistors PQ2, NQ2 and NQ4. These curves k1 and k2 are symmetrical to each other with respect to a line having a gradient of 45 degrees. These curves k1 and k2 form regions that are so-called "eye of cell". An inscribed square in the "eye of cell" is represented by broken line in the figure, and a length of one side of this square is referred to as a static noise margin SNM during the data holding and reading, and exhibits stability of the held data. This static noise margin SNM may be defined by a diameter of an inscribed circle of the curves. Intersection points S1 and S2 at the opposite sides of curves k1 and k2 represent stable points. Point S1 represents data "0", and point S2 represents data "1".

In the input/output transmission characteristics, when high-side power supply voltage VDD or the voltage level lowers, curve k1 moves to a position of a curve kk1, and curve k2 moves to a position of a curve kk2 so that the static noise margin lowers to impair the stability of data. When low-side power supply voltage VSS rises, curves k2 and k1 change in directions opposite to those in the case where high-side power supply voltage VDD change, and the static noise margin deteriorates.

In the data write operation, internal storage nodes ND1 and ND2 are coupled to bit lines BL and /BL through access transistors NQ3 and NQ4, respectively. In the input/output transmission characteristics of the memory cell in this state, it is required that point S2 or S1 shown in FIG. 3 is not present, curves k1 and k2 are open at this point-absent position to have a single stable point. In the data writing, when a latching ability of the memory cell is large, the held data is not inverted, and data cannot be written. For stably writing the data, therefore, it is necessary to reduce the latching capability of the memory cell to increase the write margin.

The embodiments of the invention utilizes the above, and specifically utilizes the fact that the bit line potentials are driven to an H level (logically high level) and an L level (logically low level) in the data writing, for changing the voltage levels of cell power supply voltage VDD or VSS on the selected column, to lower the stability of the data retention of the cell to increase the write margin.

Cell power supply lines PVL0-PVLn shown in FIG. 1 may carry any one of high-side power supply voltage VDD, low-side power supply voltage VSS and the back gate voltage. The following description will first be given of a construction for adjusting the voltage level of high-side power supply voltage VDD.

In the construction as described above, the write assist circuit is arranged at one end of bit line pair BL and /BL. However, the write assist circuits may be arranged at the opposite ends of the bit line pair, respectively, or the write assist circuit may be arranged one only in a central position of the bit line pair. Thus, the number of the write assist circuit(s) required per bit line pair is at least one, and is appropriately determined in view of the load of the VDD source line, the current driving capability of the memory cell, the current driving power of the write driver and others.

First Embodiment

Figure 4:
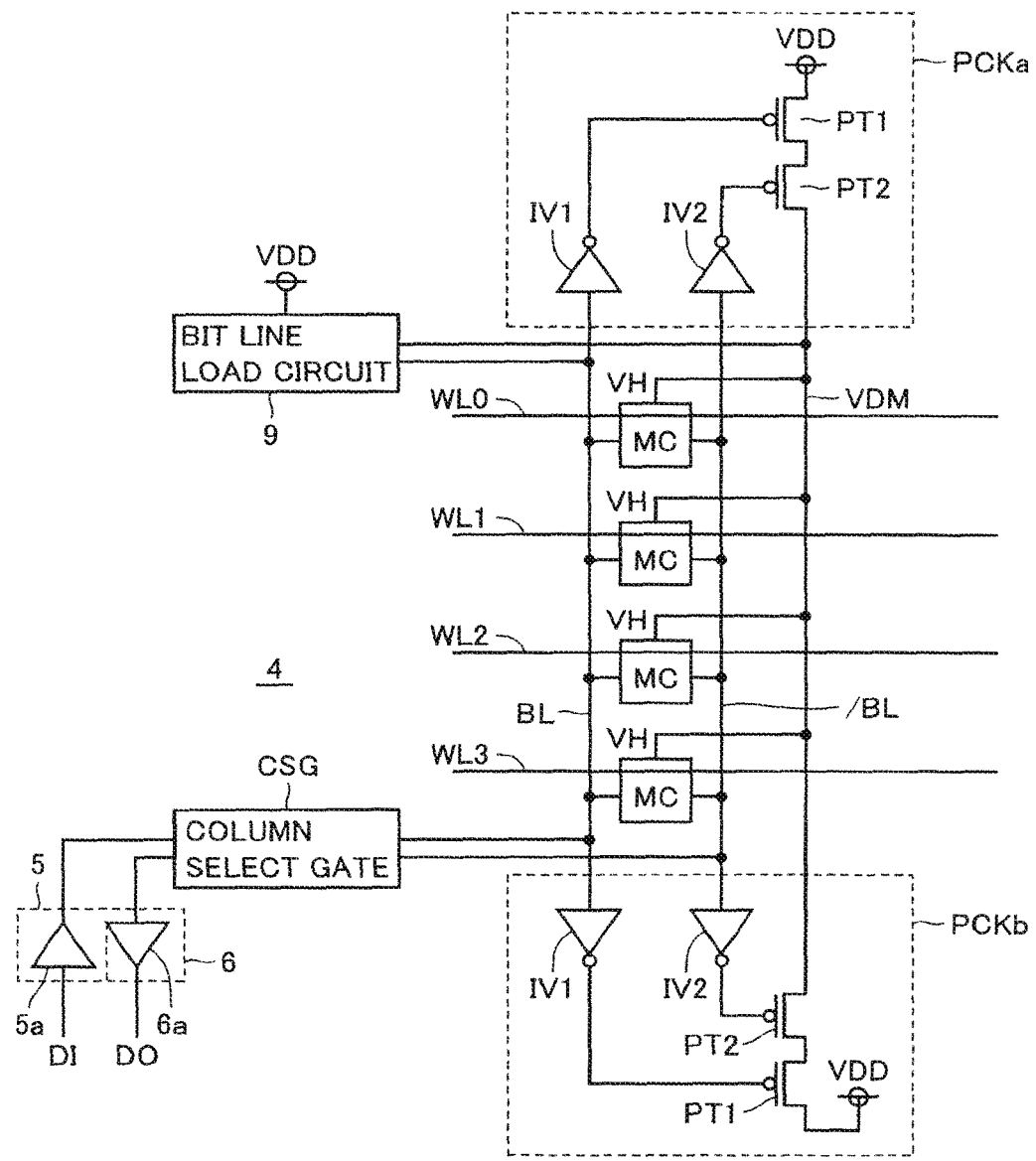
FIG. 4 schematically shows a construction of a main portion of a semiconductor memory device according to a first embodiment of the invention.

FIG. 4 shows a construction of the write assist circuit according to the first embodiment of the invention. FIG. 4 shows a construction of the write assist circuit provided for one bit line pair BL and /BL. In FIG. 4, memory cells MC in one column are connected to a common bit line pair BL and /BL. A high-side power supply line (which will be referred to as a "VDD source line" hereinafter) VDM transmitting high-side power supply voltage VDD is arranged as the cell power supply line for bit line pair BL and /BL. VDD source line VDM is connected to high-side power supply nodes VH of memory cells MC on the corresponding column.

The write assist circuits include write assist circuits PCKa and PCKb arranged at opposite ends of VDD source line VDM, respectively. Write assist circuits PCKa and PCKb have the same circuit construction, and corresponding portions are allotted with the same reference numerals.

Write assist circuit PCKa includes an inverter IV1 receiving a voltage on bit line BL, an inverter IV2 receiving a voltage on complementary bit line /BL, and P-channel MOS transistors PT1 and PT2 which are connected in series between the high-side power supply node and VDD source line VDM, and receive output signals of inverters IV1 and IV2 on their respective gates. By arranging write assist circuits PCKa and PCKb at the opposite ends of VDD source line VDM, respectively, the interconnection resistance of the VDD source line VDM can be equivalently reduced, and accordingly, high-side power supply voltage VDD can be stably supplied to the corresponding memory cells without causing voltage drop. Also, VDD source line VDM can rapidly return to the original level of high-side power supply voltage VDD after completion of the writing.

Bit lines BL and /BL are coupled to a write driver circuit 5a and a sense amplifier circuit 6a via a column select gate CSG included in column select circuit 4 shown in FIG. 1. Write driver 5a is included in write circuit 5 shown in FIG. 1, and sense amplifier circuit 6a is included in read circuit 6 shown in FIG. 1.

Figure 5:
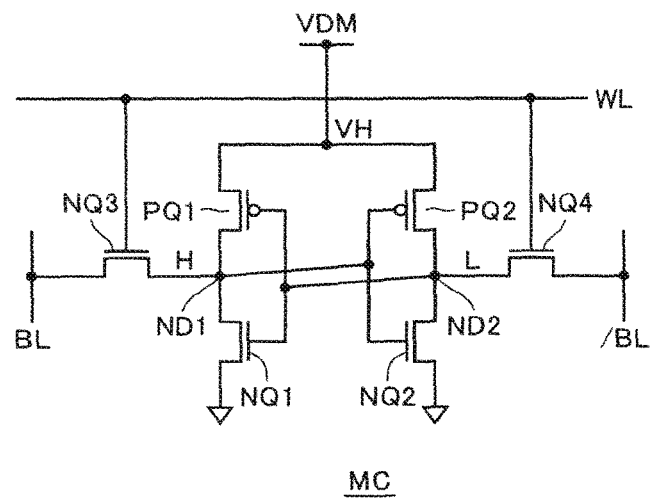
FIG. 5 shows internal connections of a memory cell shown in FIG. 4.

FIG. 5 shows connections of transistors in memory cell MC shown in FIG. 4. As shown in FIG. 5, the high-side power supply nodes (source nodes) of P-channel MOS transistors PQ1 and PQ2 of memory cell MC are coupled to the common VDD source line VDM. Storage nodes ND1 and ND2 hold complementary data at H and L levels or L and H levels corresponding to the storage data, respectively.

A bit line load circuit 9 supplying a column current in the data reading is provided for bit lines BL and /BL. Bit line load circuit 9 precharges bit lines BL and/BL to the level of high-side power supply voltage VDD. Normally, bit line load circuit 9 is kept inactive in the data writing so that the voltages on the bit lines are fully swung, or driven to the levels of VDD and VSS rapidly and reliably according to the write data.

Figure 6:
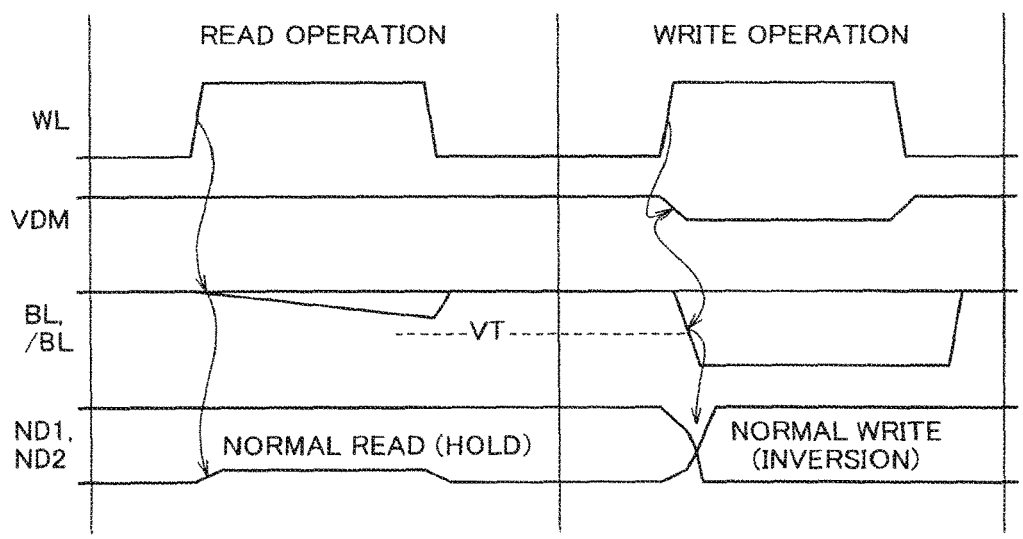
FIG. 6 is a signal waveform diagram schematically representing an operation of a memory cell circuit shown in FIG. 4.

FIG. 6 is a signal waveform diagram briefly representing operations of the circuits shown in FIG. 4 in a mode of reading and writing data. Referring to FIG. 6, the operation principle of the memory circuit shown in FIG. 4 will now be described briefly.

First, in the data reading, row select drive circuit 3 shown in FIG. 1 drives word line WL corresponding to a selected row to the H level (level of voltage VDD) according to the row address signal (row address signal RA in FIG. 1). When word line WL is driven to the selected state, access transistors NQ3 and NQ4 shown in FIG. 5 are turned on to connect bit lines BL and /BL to storage nodes ND1 and ND2, respectively. Bit line load circuit 9 supplies a column current to bit lines BL and /BL and the potentials of bit lines BI, and /BL are changed.

It is now assumed that storage nodes ND1 and ND2 store H and L data, respectively. In this case, the column current is discharged from bit line BL to the low-side power supply node through storage node ND2 and MOS transistor NQ2 so that the potential of complementary bit line /BL lowers. The voltage level of storage node ND2 rises to a voltage level which is determined by the current driving abilities of access transistor NQ4 and driver transistors NQ2 as well as the bit line load resistance.

Storage node ND1 is at the Ht level that is substantially the same as the potential of bit line BL, and MOS transistor NQ1 is in an off state so that the voltage level of node ND1 substantially does not change.

Complementary bit line /BL is discharged through the selected memory cell, and the voltage level thereof lowers. Bit lines BL and /BL are coupled to internal data lines via column select gate CSG, and are further coupled to the sense amplifier for reading the data. In the data reading, the voltage amplitude of the bit line is small, and the potential of complementary bit line /BL is at the voltage level higher than an input logical threshold VT of inverter IV2. Therefore, the output signal of inverter IV2 maintains the L level, and MOS transistors PT1 and PT2 in each of write assist circuits PCKa and PCKb are conductive, so that VDD source line VDM is connected to the high-side power supply node, and VDD source line VDM maintains the level of high-side power supply voltage VDD.

In the data reading, therefore, the voltage level of storage node ND2 rises according to a β-ratio (conductance ratio) between MOS transistors NQ2 and NQ4, but the static noise margin is sufficiently large so that the data can be stably read without causing destruction of the data.

The memory cells on the selected column and the unselected rows are stably supplied with the cell power supply voltage, and the access transistors thereof are in an off state, so that the unselected memory cells have no current flowing path, and stably hold the data.

When the data read period ends, word line WL attains the unselected state, and MOS transistors NQ3 and NQ4 are turned off so that storage nodes ND1 and ND2 return to the original H and L levels, respectively. Likewise, bit line load circuit 9 restores bit lines BL and /BL to the original precharge voltage (VDD level).

In the data writing, word line WI, is likewise driven to the selected state. Then, write driver 5a transmits the write data to the bit line in the selected column via column select gate CSG, and bit lines BL and /BL are driven to the H and L levels according to the write data, respectively. It is now assumed that storage node ND1 is kept at the H level, and bit lines BL and /BL are driven to the L and H levels, respectively. In this case, the data at the logical level opposite to that of the data held on storage nodes ND and ND2 is written into the memory cell. In this case, the bit line at the L level (i.e., bit line BL) out of bit lines BL and /BL is at the level of low-side power supply voltage VSS. In the write assist circuits PCKa and PCKb, therefore, the output signal of inverter IV1 attains the H level, and MOS transistor PT1 is turned off to isolate the high-side power supply node (VDD supply node) from VDD source line VDM so that VDD source line VDM enters the floating state.

When word line WL is driven to the selected state, storage nodes ND1 and ND2 are coupled to bit lines BL and /BL via access transistors NQ3 and NQ4 to change the voltage levels thereof according to the write data, respectively.

When the data in memory cell MC is to be inverted in the data write operation, the current flows through both MOS transistors PQ1 and PQ2 (i.e., a through current in the cell and discharging current to the L level bit line), and accumulated charges on VDD source line VDM in the floating state are discharged so that the voltage level of high-side power supply node VH of selected memory cell MC lowers. Thereby, the data holding characteristics of memory cell MC lower to improve the write characteristics, and storage nodes ND1 and ND2 can be accurately and rapidly driven to the L and H levels according to the write data, respectively.

Figure 7:
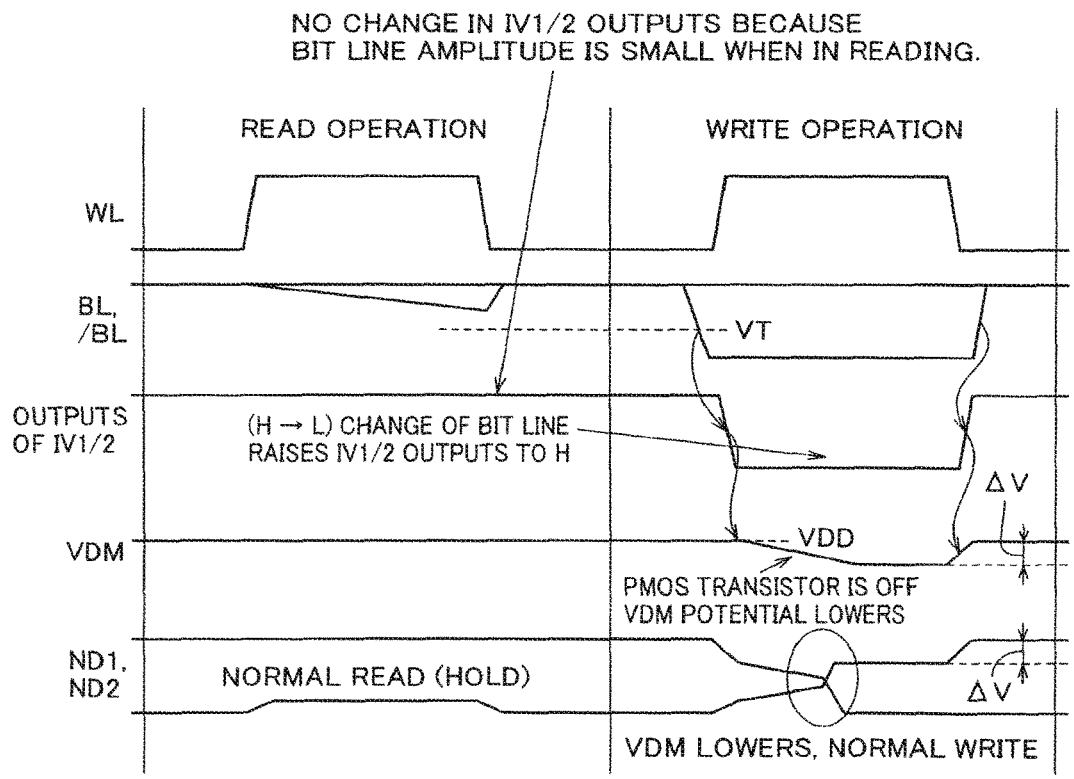
FIG. 7 is a signal waveform diagram representing more specifically the operation of the memory cell circuit shown in FIG. 4.

FIG. 7 represents specific operation waveforms of the memory cell circuit shown in FIG. 4. When word line WL is driven to the selected state in the data read operation, MOS transistors NQ3 and NQ4 shown in FIG. 5 are turned on to couple bit lines BL and /BL to storage nodes ND1 and ND2, respectively. In this case, the potentials of bit lines BL and /BL change according to the storage data as described above, but the changed levels are higher than the voltage level of input logical thresholds VT of inverters IV1 and IV2. Therefore, the output signals of inverters IV1 and IV2 maintain the H level, and both P-channel MOS transistors PT1 and PT2 are conductive, so that VDD source line VDM maintains the level of power supply voltage VDD even when it is discharged via the selected memory cell.

Accordingly, even when the potential of the storage node storing the L level data (i.e., storage node ND2) between storage nodes ND1 and ND2 is raised by the column current flowing from the bit line in the data reading, the sufficiently large static noise margin is maintained so that the data can be stably held, the data can be accurately read and the data destruction does not occur.

In the data write operation, the write data is first transmitted from write driver circuit 5a shown in FIG. 4 onto bit lines BL and /BL corresponding to the selected column via column select gate CSG (see FIG. 4), and these bit lines BL and /BL are set to the H and L levels, respectively. According to the potential changes of bit lines BL and /BL, one of the output signals of inverters IV1 and IV2 attains the H level in each of write assist circuits PCKa and PCKb, and corresponding P-channel MOS transistor PT1 or PT2 is turned off so that VDD source line VDM enters the floating state.

In this state, word line WL is driven to the selected state, and storage nodes ND1 and ND2 are coupled to bit lines BL and /BL, respectively. In this operation, the write data at the logical level opposite to that of the data held in memory cell MC is transmitted so that the through currents flow via MOS transistors PQ1, PQ2, NQ1 and NQ2. Also, the current flows to the bit line at the L level from cell high-side power supply node VH, and the potential of VDD source line VDM in the floating state lowers.

Concurrently with the potential drop of VDD source line VDM, the potentials of storage nodes ND1 and ND2 change according to the potentials of bit lines BL and /BL. FIG. 7 represents signal waveforms in such a case that storage nodes ND1 and ND2 previously storing the H and L levels data turn to store the L and H level data, respectively. According to the data retention characteristics of the cell, the voltage levels of storage nodes ND1 and ND2 slowly change depending on the bit line voltages. When storage nodes ND1 and ND2 attain the same voltage level, the latching state of the cell is inverted, and the voltage levels of storage nodes ND1 and ND2 will rapidly change to the H and L levels depending on the bit line voltages, respectively. Therefore, when the stability of the holding characteristics reduced and the write margin increases according to the lowering of the voltage level of the VDD source line, the potential levels of storage nodes ND1 and ND2 change from a stable point to an unstable point without difficulty, and the potentials of these storage nodes ND1 and ND2 change to hold the potential levels depending on the write data. When nodes ND1 and ND2 are driven to the levels of voltages (VDD−ΔV) and VSS according to the write data, the path of the through current is cut off in memory cell MC so that the potential drop of VDD source line VDM stops (i.e., it attains the same voltage level as the high-side storage node when channel resistances of load transistors PQ1 and PQ2 are neglected).

At this stage, the voltage on the high-side storage node is at the level of the voltage on VDD source line VDM, and MOS transistors PT1 and PT2 in each of write assist circuits PCKa and PCKb are in an off state. Even when corresponding bit line BL or /BL is at the voltage level of VDD, the threshold voltages of the access transistors (NQ3 and NQ4) affect merely to drive the storage node to the voltage level of up to the voltage of (VDD−Vth) by the write driver if the word line is at the voltage VDD. Therefore, the voltage level of the storage node is lower than voltage VDD.

When the data writing is completed, word line WE is driven to the unselected state, and the memory cell stably maintains the data. Then, column select gate CSG isolates bit lines BL and /BL from write driver circuit 5a, and bit line load circuit 9 (see FIG. 4) restores bit lines BL and /BL to the original voltage level.

As the voltages on bit lines BL and /BL are restored, both the output signals of inverters IV1 and IV2 attain the H level to turn on MOS transistors PT1 and PT2, and the voltage level of VDD source line VDM returns to the level of high-side power supply voltage VDD. In response to this return of the voltage level of VDD source line VDM, the voltage on the high side storage node rises to the level of voltage VDD.

In the data write operation, the write data is not transmitted to the memory cells on the selected row and unselected columns, and potential changes similar to those in the data read operation occur on bit lines BL and /BL. Similarly to the read operation mode, therefore, VDD source line VDM of the memory cells on the unselected column and selected row are kept at the level of high-side power supply voltage VDD, and the data holding characteristics of the selected row and unselected columns do not deteriorate so that the possibility of read destruction of the data is extremely low, and the data can be stably held.

In the memory cells on the unselected rows and selected column, the voltage level of cell high-side power supply node VH lowers, but the access transistors are kept off, so that a path of current flow is not present within each cell, and the storage data is stably held.

According to the first embodiment of the invention, as described above, the VDD source line supplying the high-side power supply voltage is selectively maintained in the floating state or the power supplying state according to the bit line potential. In only the data writing operation, therefore, the power supply voltage level of the memory cells in the selected column can be changed, and the write margin can be increased to achieve fast data reading.

In the read operation, the potential amplitude of the bit line in the selected column is small, the VDD source line is kept at the level of high-side power supply voltage VDD and the memory cell stably holds the data.

Since write assist circuits PCKa and PCKb are arranged on the opposite sides of VDD source line VDM, respectively, it is possible to prevent potential lowering that may be caused by the interconnection resistance of VDD source line VDM (the interconnection length of VDD source line can be equivalently reduced to half times), and thereby it is possible to prevent reduction of the static noise margin of the memory cell in the read operation.

The potential of VDD source line is controlled merely based on the bit line potential, and it is not necessary to utilize the column address signal, so that interconnections for using the column address signals for the voltage control are not required.

The bit line voltage is utilized for setting the state of the VDD source line, the state of the memory cell power supply line is set when a word line is selected, and it is not particularly required to employ a circuit for adjusting timing between setting of the state of the power supply line and the selection of the word line so that the construction for the power supply control can be made simple.

The write characteristics can be improved, and the memory operation can be stable even when high-side power supply voltage VDD is low. Although there is a lower limit of the voltage level ensuring the data retention characteristics, the power consumption can be reduced by lowering the cell power supply voltage.

The MOS transistors employed in each of write assist circuits PCKa and PCKb for controlling the connection between the VDD source line and the high-side power supply node can be arranged in an optimum position inside the memory cell array, and these may be arranged in a central position of the VDD source line, not only at the opposite sides. Flexibility in layout is improved, and the voltage drop due to the interconnection resistance of the VDD source line can be suppressed so that the operation margin with a low power supply voltage can be maintained.

Second Embodiment

Figure 8:
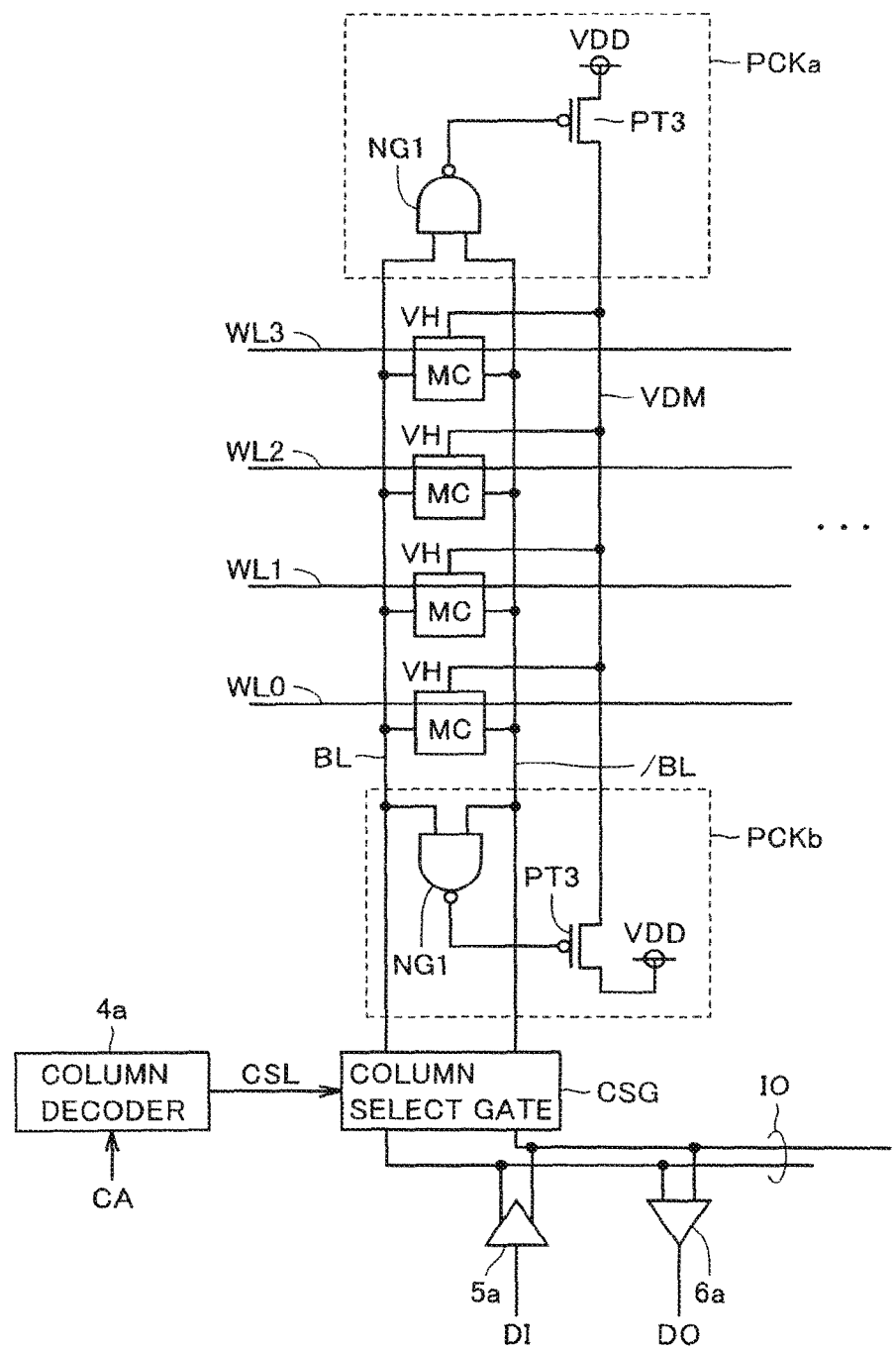
FIG. 8 schematically shows a construction of a main portion of a semiconductor memory device according to a second embodiment of the invention.

FIG. 8 schematically shows a construction of a portion (memory cell circuit) related to memory cells MC in one row of a semiconductor memory device according to a second embodiment of the invention. In the construction shown in FIG. 8, write assist circuits PCKa and PCKb are arranged on the opposite sides of VDD source line VDM. VDD source line VDM is individually arranged for each column, and is commonly coupled to high-side power supply nodes VH of memory cells MC arranged in alignment in the corresponding column. In FIG. 8, memory cells MC arranged in four rows are shown as a representative example. Word lines WL0-WL3 are arranged corresponding to the respective memory cell rows.

Bit lines BL and /BL are arranged corresponding to the memory cell column, and bit lines BL and /BL are coupled to an internal data bus IO via column select gate CSG. Column select gate CSG is selectively made conductive to couple corresponding bit lines BL and /BL to internal data bus IO according to a column select signal CSL received from a column decoder 4a. Column decoder 4a is included in the column select circuit shown in FIG. 1, and decodes column address signal CA received from main control circuit 7 to produce column select signal CSL.

Similarly to the construction shown in FIG. 4, a bit line load circuit is arranged for bit lines BL and /BL, but is not shown in FIG. 8 for the sake of simplicity. In the standby state, bit lines BL and /BL are precharged to the H level of power supply voltage VDD. This bit line load circuit is kept inactive in the data write operation.

Write assist circuits PCKa and PCKb have the same construction, and corresponding portions are allotted with the same reference numerals. Each of write assist circuits PCKa and PCKb includes a 2-input NAND gate NG1 receiving the voltages on bit lines BL and /BL, and a P-channel MOS transistor PT3 for coupling the VDD power supply node to VDD source line VDM according to an output signal of NAND gate NG1.

Thus, the constructions of write assist circuits PCKa and PCKb shown in FIG. 8 differ from those of the first embodiment already described in that 2-input NAND gate NG1 is employed in place of the inverters arranged for respective bit lines BL and /BL.

Internal connections of memory cell MC are the same as those of memory cell MC shown in FIG. 5, and high-side power supply nodes VH of load transistors (PQ1 and PQ2) are commonly coupled to VDD source line VDM.

Figure 9:
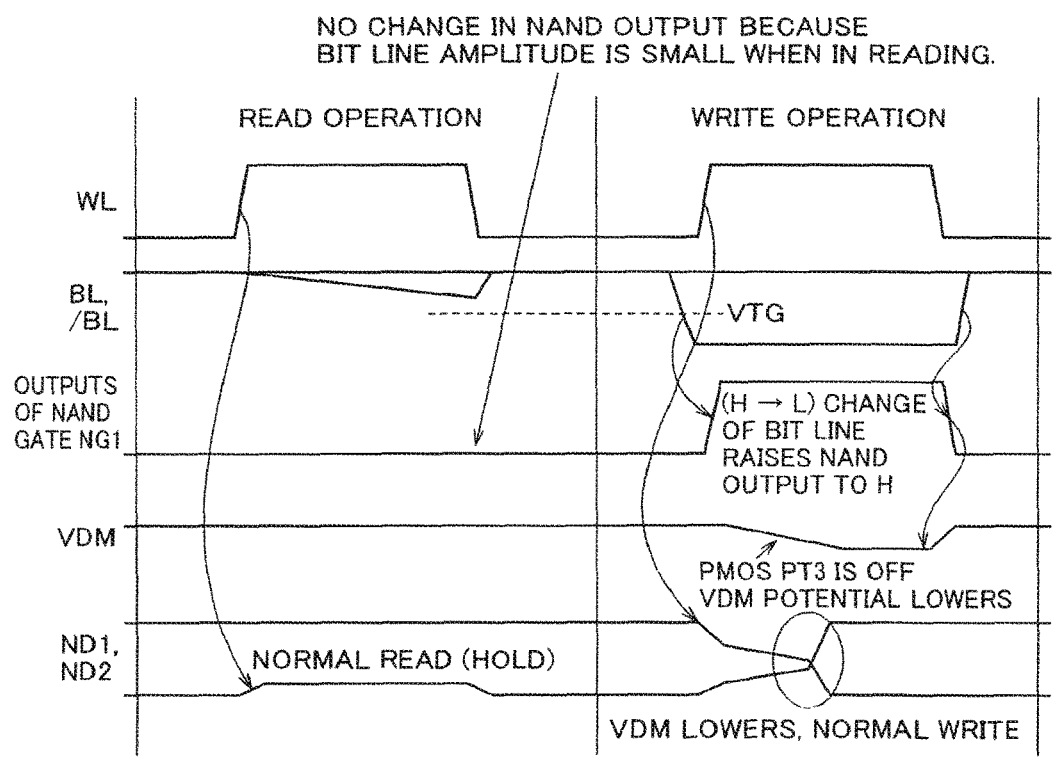
FIG. 9 is a signal waveform diagram representing an operation of a memory cell circuit shown in FIG. 8.

FIG. 9 is a signal waveform diagram representing an operation of the memory cell circuit shown in FIG. 8. Referring to FIG. 9, brief description will now be given of the operations of the memory cell circuit shown in FIG. 8. In the data reading, the potential of word line WL corresponding to an addressed row rises to the H level (VDD level). Thereby, the access transistors (NQ3 and NQ4) are turned on to couple storage nodes ND1 and ND2 to bit lines BL and /BL in memory cell MC, respectively. Responsively, the potential of the storage node (e.g., ND2) storing L level data rises according to the column current flowing through, e.g., bit line /BL (to attain the voltage level corresponding to the β-ratio between the transistor (NQ3, NQ4) and driver transistor (NQ1, NQ2) as well as the resistance value of the bit line load circuit).

The potentials of bit lines BL and /BL change according to the storage data of memory cell MC on the selected row. Bit lines BL and /BL are coupled to internal data bus IO via column select gate CSG, and the potential level thereof continuously changes. In the data read operation, however, the potential amplitudes of bit lines BL and /BL are higher than the voltage level of input logical threshold VTG of NAND gate NG1, and NAND gate NG1 determines that both the voltage levels of bit lines BL and/BL are at the H level, and maintains its output signal at the L level.

Therefore, MOS transistor PT3 maintains the on state, and maintains VDD source line VDM at the level of high-side power supply voltage VDD. Thereby, the data can be read while stably holding the data of memory cell MC, similarly to the first embodiment.

In the data write operation, the voltage levels of bit lines BL and /BL are driven to the H and L levels (VDD and VSS levels), respectively, according to the write data supplied from column select gate CSG via write driver circuit 5a. As the voltage level of one of bit lines BL and /BL lowers, one of the inputs of NAND gate NG1 attains the L level, and the output signal thereof attains the H level so that P-channel MOS transistor PT3 is turned off, and VDD source line VDM enters the floating state.

When word line WL is driven to the selected state according to the output signal of the row select circuit (not shown), storage nodes ND1 and ND2 of the memory cell in the selected row are coupled to bit lines BL, and /BL, respectively. In the operation of writing the data at the logical level opposite to that of the storage data of the memory cell, the voltage levels of storage nodes ND1 and ND2 in the selected memory cell change. When this potential changes occurs on the storage nodes, the through current flows via the load transistor and driver transistor in the memory cell, and the charges on VDD source line VDM in the floating state are consumed to lower its voltage level so that the potential difference between storage nodes ND1 and ND2 further decreases, the data holding characteristics decrease due to potential lowering of VDD source line VDM (i.e., the write margin increases) and the respective storage data of storage nodes ND1 and ND2 are inverted and set to the voltage levels corresponding to the write data transmitted onto bit lines BL and /BL.

After the data writing ends, word line WL is driven to the unselected state, and bit lines BL and /BL return to the original precharge voltage levels so that NAND gate NG1 outputs the signal at the L level, and the voltage level of VDD source line VDM returns to the level of high-side power supply voltage VDD.

Even when word line WL is in the selected state, the write data is not transmitted onto bit lines BL and /BL during the nonconductive state of column select gate CSG, and the potential changes from the precharge voltage level similarly to that in the data read operation. In this case, however, the potential amplitude thereof is small, the output signal of NAND gate NG1 is at the L level, VDD source line VDM is supplied with high-side power supply voltage VDD through P-channel MOS transistor PT3, and has the voltage level kept at high-side power supply voltage VDD level. Therefore, the memory cells on the selected row and unselected columns stably hold the storage data.

In the memory cells on the unselected rows and selected column, a path of current flow is not present, and the storage data are stably held similarly to the first embodiment.

As described above, with the construction of the write assist circuit according to the second embodiment shown in FIG. 8, the effect similar to that of the first embodiment can be achieved.

NAND gate NG1 receives the voltages on bit lines BL and /BL to detect the change thereof, and only one P-channel MOS transistor PT3 is connected between the supply node of high-side power supply voltage VDD and VDD source line VDM. Therefore, the resistance component (channel resistance) between the high-side power supply voltage supplying node and the VDD source line decreases so that the voltage on the VDD source line can rapidly return to high-side power supply voltage VDD. Also, the interconnection resistance of VDD source line VDL is small, and the voltage drop thereof is small so that the cell power supply voltage at the predetermined voltage level (VDD level) can be stably supplied to the high-side power supply node of the memory cell in the corresponding column.

Third Embodiment

Figure 10:
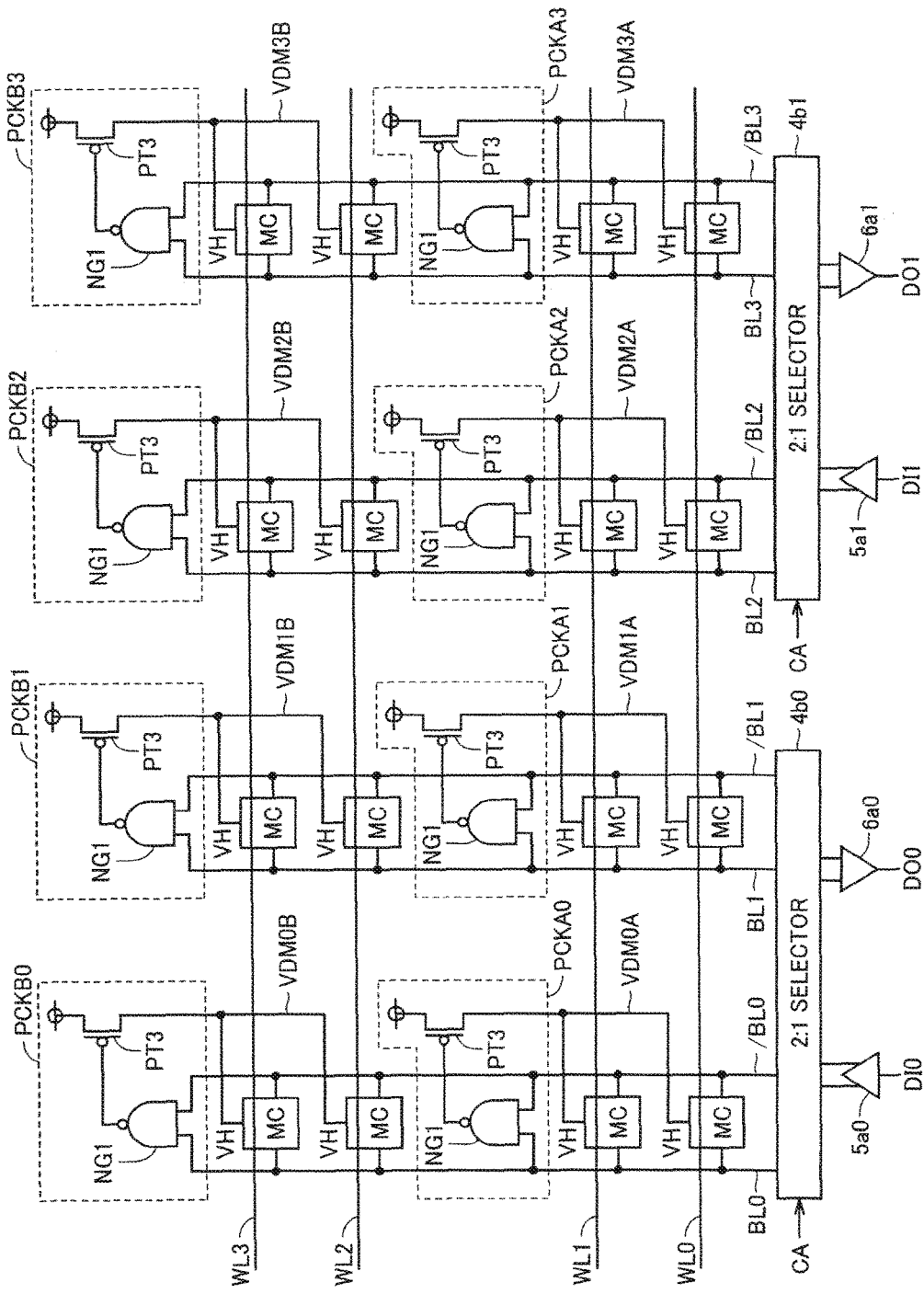
FIG. 10 schematically shows a construction of a main portion of a semiconductor memory device according to a third embodiment of the invention.

FIG. 10 schematically shows a construction of a memory cell array of the semiconductor memory device according to a third embodiment of the invention. FIG. 10 schematically shows a circuit construction for memory cells MC arranged in four rows and four columns. Bit line pairs BL0 and /BL0, BL1 and /BL1, BL2 and /BL2, and BL3 and /BL3 are arranged corresponding to the memory cell columns, respectively.

Bit lines BL0 and /BL0, and BL1 and /BL1 are coupled to a two-to-one selector 4b0, and bit lines BL2 and /BL2, and BL3 and /BL3 are likewise coupled to a two-to-one selector 4b1. These two-to-one selectors 4b0 and 4b1 perform two-to-one selection according to column address signal CA, and each selects one bit line pair from the corresponding two bit line pairs.

A write driver 5a0 and a sense amplifier circuit 6a0 are arranged for two-to-one selector 4b0, and a write driver 5a1 and a sense amplifier circuit 6a1 are arranged for two-to-one selector 4b1.

These two-to-one selectors 4b0 and 4b 1 are included in column select circuit 4 shown in FIG. 1, and perform column selecting operations in parallel according to column address signal CA. Write driver 5a0 and sense amplifier circuit 6a0 perform input/output of data DI0 and DO0, and write driver 5a1 and sense amplifier circuit 6a1 perform input/output of data DI1 and DO1. Therefore, the construction shown in FIG. 10 performs write/read of 2-bit data.

Word lines WL0-WL3 are arranged corresponding to the memory cell row, respectively. In the construction for the memory cell power supply control shown in FIG. 10, the memory cells on each bit line pair are divided into a plurality of groups, and a divided VDD source line is arranged for each memory cell group. More specifically, divided VDD source lines VDM0A and VIDM0B are arranged parallel in the column direction for bit lines BL0 and /BL0, and divided VDD source lines VDM1A and VDM1B are arranged for bit lines BL1 and /BL1. Divided VDD source lines VDM2A and VDM2B are arranged for bit lines BL2 and /BL2, and divided VDD source lines VDM3A and VDM3B are arranged for bit lines BL3 and /BL3.

Write assist circuits PCKa0-PCKa3 are arranged corresponding to divided VDD source lines VDM0A-VDM3A, respectively, and write assist circuits PCKb0-PCKb3 are arranged corresponding to divided VDD source lines VDM0B-VDM3B, respectively. These write assist circuits PCKa0-PCKa3 and PCKb0-PCKb3 have substantially the same constructions as write assist circuits PCKa and PCKb shown in FIG. 8, and corresponding portions are allotted with the same reference numerals. Each of write assist circuits PCKa0-PCKa3 and PCKb0-PCKb3 has an NAND gate NG1 receiving voltages on the corresponding paired bit lines, and a P-channel MOS transistor PT3 selectively coupling the supply node of high-side power supply voltage VDD (referred to as a "VDD supply node" hereinafter) to the corresponding divided VDD source line according to the output signal of corresponding NAND gate NG1.

In the construction of the memory cell power supplying control shown in FIG. 10, the operation in data reading is the same as in the construction employing the write assist circuits of the second embodiment. Thus, a potential difference appears on each bit line pair in accordance with the word line selection, but the potential difference is small. NAND gate NG1 determines that the potentials of the corresponding bit lines are at the H level. Each of divided VDD source lines VDM0A-VDM3A and VDM0B-VDM3B is kept at the level of high-side power supply voltage VDD, and the data reading is performed stably. According to column address signal CA, each of two-to-one selectors 4b0 and 4b1 performs two-to-one selection to select one bit line pair from the two bit line pairs, and 2-bit data DO0 and DO1 are read out.

In the data read operation, two-to-one selectors 4b0 and 4b1 perform two-to-one selection according to column address signal CA, and write driver circuits 5a0 and 5a1 drive in parallel the bit lines in the selected columns according to write data bits DI0 and DI1, respectively.

In this case, discharging is performed in the memory cells connected to the selected word line (e.g., word line WL3). Among the potentials on divided VDD source lines VDM0B-VDM3B, the potential of the divided VDD source lines corresponding to the selected columns lowers (in the data write operation, all MOS transistors PT3 in the write assist circuits of the selected columns are already in an off state). It is determined that the bit line potentials of the divided VDD source lines on the unselected columns are at the H level, and associated MOS transistors PT3 are conductive to hold the corresponding VDD source line at the level of high-side power supply voltage VDD, so that the storage data is stably held.

All the memory cells corresponding to divided VDD source lines VDM0A-VDM3A provided for the unselected word lines are unselected, and divided VDD source lines VDM0A-VDM3A are in the floating state. However, a path of current flow from the high-side power supply node to the low-side power supply node is not present in these memory cells, and divided VDD source lines VDM0A-VDM3A maintain the level of power supply voltage VDD.

More specifically, when word line WL is selected and, for example, bit lines BL0 and /BL0 are selected, the voltage level of divided VDD source line VDM0B lowers, the write margin of corresponding memory cell MC increases, and the data is written fast into the memory cell according to the write data on bit lines BL0 and /BL0. In this operation, bit lines BL1 and /BL1 are unselected, and the bit line load circuit (not shown) causes current to flow through the corresponding memory cell MC to lower the voltage level of one of bit lines BL1 and /BL1 from the precharged voltage level. However, the amount of this potential drop is similar to that in the data read operation. In write assist circuit PCKb1, the output signal of NAND gate NG1 is at the L level, and MOS transistor PT3 is conductive, so that high-side power supply voltage VDD is stably supplied to the memory cells to hold stably the data.

Operations similar to the above are performed for bit line pairs BL2 and /BL2, and BL3 and /BL3.

In the construction shown in FIG. 10, the VDD source line provided corresponding to each memory cell column is divided, and the voltage level of each divided VDD source line is controlled according to the potential of the corresponding bit line so that the interconnection capacitance of the VDD source line is reduced, and the potential of the divided VDD source line lowers rapidly in the data write operation. Therefore, fast writing can be performed. After the end of the writing, the potential of the divided VDD source line in the selected column can be rapidly restored to the level of power supply voltage VDD, and the write time can be reduced. The influence of the interconnection resistance of the divided VDD source line is similar to that in the case where one continuous VDD source line is arranged for each column, and write assist circuits are arranged on the opposite ends thereof, as in the first embodiment.

In the construction shown in FIG. 10, the memory cell array has the VDD source lines each divided into two, and write assist circuits PCKa0-PCKa3 are arranged in boundary regions of the divided VDD source lines. However, such a construction may be employed that write assist circuits PCKa0-PCKa3 are arranged on the other ends (near the two-to-one selector) of divided VDD source lines VDM0A-VDM3A, and write assist circuits PCKa0-PCKa3 and PCKb0-PCKb3 are arranged opposingly on the opposite ends of the memory cell array.

Although the VDD source line in each column is divided into two, it may be divided into more than two lines. By increasing the number of division of VDD source line, the interconnection length thereof can be short, and accordingly, the interconnection capacitance can be reduced so that the voltage change can be performed fast, and the write operation can be performed fast.

Although the memory cells in two columns are arranged for each data bit, the number of memory cell columns arranged per data bit is not restricted to two, and can be appropriately determined. The data to be input/output concurrently may have a larger bit width than the above, and may have a width, e.g., of 8 or 16 bits.

Fourth Embodiment

Figure 11:
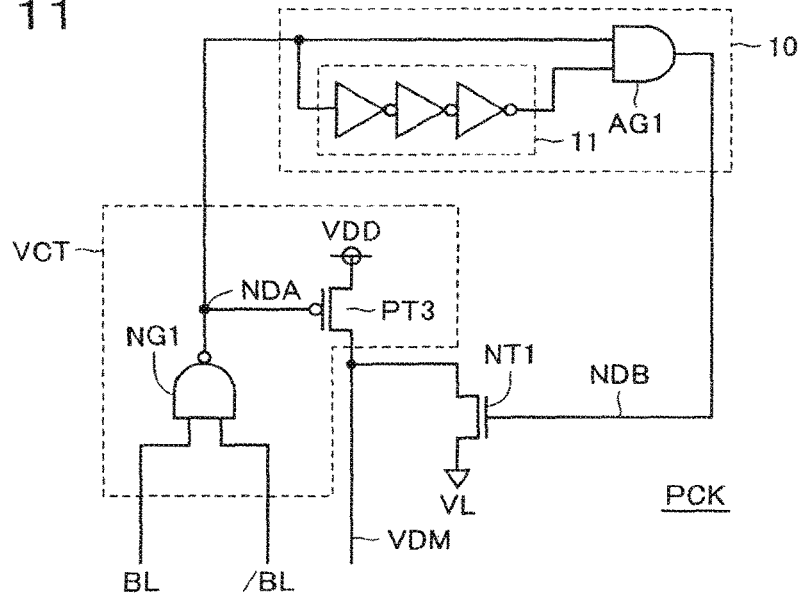
FIG. 11 shows a construction of a write assist circuit of a semiconductor memory device according to a fourth embodiment of the invention.

FIG. 11 shows a construction of a write assist circuit according to a fourth embodiment of the invention. FIG. 11 representatively shows a construction of a write assist circuit PCK provided for one bit line pair BL and /BL. Arrangements in the memory cell array can be any of the constructions in the first to third embodiments already described.

Write assist circuit PCK includes a power supply control section VCT for controlling the impedance of VDD source line VDM according to the voltage levels of bit lines BL and /BL, a one-shot pulse producing circuit 10 for producing a pulse signal of one shot according to a bit line voltage detection signal applied from power supply control section VCT, and an N-channel MOS transistor NT1 for driving VDD source line VDM to the low-side power supply voltage (VSS: second power supply voltage) level according to the output signal of one-shot pulse producing circuit 10.

Power supply control section VCT includes NAND gate NG1 receiving voltages on bit lines BR, and /BL, and P-channel MOS transistor PT3 coupling the VDD supply node to VDD source line VDM according to the output signal of NAND gate NG1. Therefore, power supply control section VCT corresponds to the construction of the write assist circuits of the foregoing second and third embodiments, and has a similar construction.

One-shot pulse producing circuit 10 includes an inversion delay circuit 11 that inverts and delays by a predetermined time the output signal of NAND gate NG1, and an AND gate AG1 receiving the output signal of inversion delay circuit 11 and the output signal of NAND gate NG1. One-shot pulse producing circuit 10 produces a one-shot pulse signal having a predetermined time width in response to rising of the output signal of NAND gate NG1. The H level time period of the one-shot pulse signal is determined by the delay time of inversion delay circuit 11.

Figure 12:
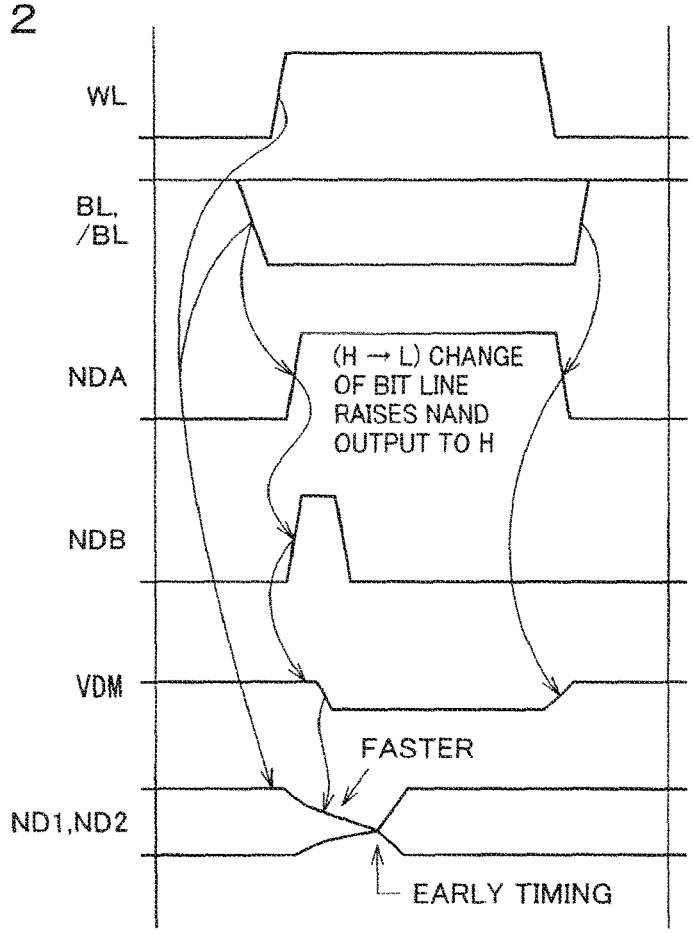
FIG. 12 is a signal waveform diagram representing an operation of the write assist circuit shown in FIG. 11.

FIG. 12 is a signal waveform diagram representing an operation for data writing of write assist circuit PCK shown in FIG. 11. Referring to FIG. 12, description will now be given of an operation of write assist circuit PCK shown in FIG. 1.

In the data write operation, when the potentials of bit lines BL and /BL change from the H level to the L level according to the write data, the voltage level of an output node NDA of NAND gate NG1 changes from the L level to the H level. Thereby, one-shot pulse producing circuit 10 produces a pulse signal of one shot that is kept at H level for a predetermined period of time. When the output signal of NAND gate NG1 attains the H level, MOS transistor PT3 is turned off to isolate VDD source line VDM from the VDD supply node. At this time, the one-shot pulse signal (signal on a node NDB) produced from one-shot pulse producing circuit 10 attains the H level, and responsively, MOS transistor NT1 is turned on. VDD source line VDM isolated from the VDD supply node is coupled to the low-side power supply node to lower the voltage level thereof.

In the selected memory cell, the data holding characteristics of the storage nodes (ND1 and ND2: not shown) rapidly lower according to the potential drop of VDD source line VDM, and potential levels thereof rapidly change according to the potential levels of bit lines BL and /BL. Thereby, the time required for the data writing (the time required for setting storage nodes ND1 and ND2 to the potential levels corresponding to the write data) can be reduced, and fast writing is achieved.

When the data writing is completed, word line WL is driven to the unselected state, and the column select circuit isolates bit lines BL and /BL from the internal data lines. The bit line load circuit (not shown) restores the voltage levels of bit lines BL and /BL to the original level of the precharge voltage. In this operation, the one-shot pulse signal produced from one-shot pulse producing circuit 10 is already at the L level, and MOS transistor NT1 is in an off state. As bit lines BR, and /BL, return to the precharge potential, the output signal of NAND gate NG1 in power supply control section VCT attains the L level so that MOS transistor PT3 returns VDD source line VDM to the original voltage level (VDD level).

As shown in FIG. 11, the voltage level of the VDD source line is driven toward the level of low-side power supply voltage VSS in response to the change in bit line potential for a predetermined period time, and the voltage level thereof is forcedly lowered. This can increase the write margin of the memory cell, and can achieve the fast writing.

The unselected memory cells can stably hold the data even in the data write mode, similarly to the first to third embodiments.

Fifth Embodiment

Figure 13:
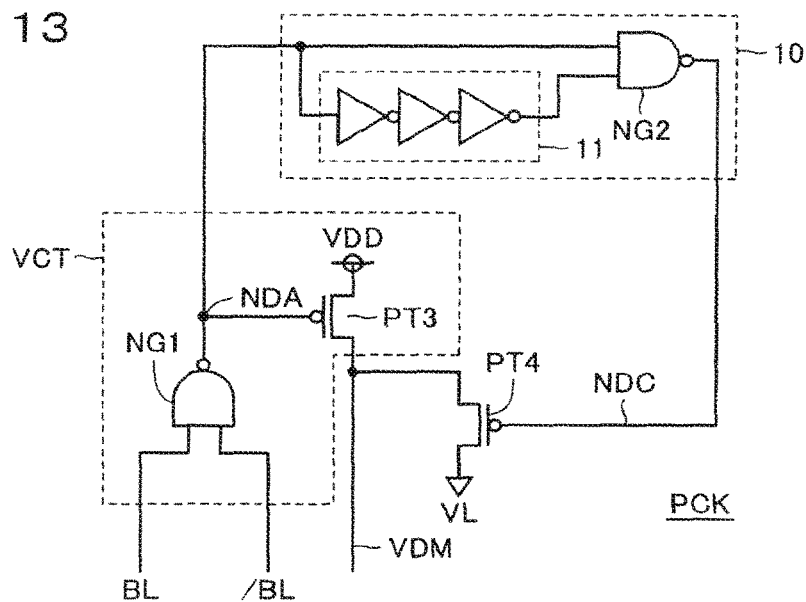
FIG. 13 shows a configuration of a write assist circuit according to a fifth embodiment of the invention.

FIG. 13 shows a construction of write assist circuit PCK according to a fifth embodiment of the invention. Voltage control circuit PCK shown in FIG. 13 includes a P-channel MOS transistor PT4 for driving VDD source line VDM to the second power supply voltage (low-side power supply voltage VSS) level when the potentials of bit lines BL and /BL change. One-shot pulse producing circuit 10 controls the on/off state of MOS transistor PT4. One-shot pulse producing circuit 10 produces a pulse signal of one shot that is kept at L level for a predetermined time period in response to the rising of the output signal of NAND gate NG1 included in power supply control section VCT, and provides the pulse signal to the gate of P-channel MOS transistor PT4. Power supply control section VCT has the same construction as power supply control section VCT shown in FIG. 11. Corresponding portions are allotted with the same reference numerals, and description thereof is not repeated.

One-shot pulse producing circuit 10 includes inversion delay circuit 11, and an NAND gate NG2 receiving the output signal of inversion delay circuit 11 and the output signal of NAND gate NG1 of power supply control section VCT. The L level time period of the one-shot pulse signal produced by one-shot pulse producing circuit 10 is determined by the delay time of inversion delay circuit 11.

Figure 14:
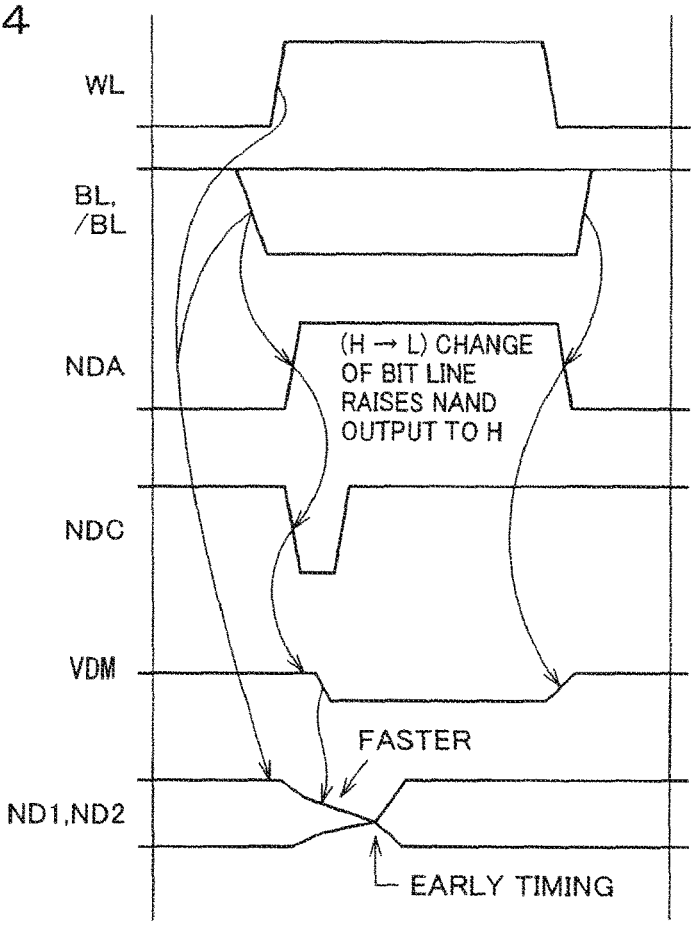
FIG. 14 is a signal waveform diagram representing an operation of the write assist circuit shown in FIG. 13.

FIG. 14 is a signal waveform diagram representing an operation for data writing of write assist circuit PCK shown in FIG. 13. Referring to FIG. 14, description will now be given of the operation of write assist circuit PCK shown in FIG. 13.

In the data writing, the voltage levels of bit lines BL and /BL corresponding to the selected column are driven to the H and L levels according to the write data, respectively. According to the potential change of bit lines BL and /BL, the signal applied from power supply control section VCT to node NDA rises to the H level, and responsively, the one-shot pulse signal applied from one-shot pulse producing circuit 10 to a node NDC is kept at the L level for a predetermined time period. In response to the signal at the L level on node NDC, MOS transistor PT4 is turned on to drive VDD source line VDM toward the low-side power supply voltage. In this operation, MOS transistor PT3 is kept off by the output signal of NAND gate NG1, and VDD source line VDM isolated from the VDD supply node has the voltage level rapidly lowered. Therefore, the write margin increases similarly to the construction of the write assist circuit of the fourth embodiment shown in FIG. 11, and the potential levels of the storage nodes (ND1 and ND2) of the selected memory cell can be rapidly changed according to the write data.

When bit lines BL and /BL are in the unselected column, or are in the data read mode, the potentials of bit lines BL and /BL are at the H level, the output signal of NAND gate NG1 is at the L level and MOS transistor PT3 is in an on state. Since the output signal of NAND gate NG1 is fixed at the L level, output node NDC of one-shot pulse producing circuit 10 maintains the H level, and MOS transistor PT4 maintains the off state. Therefore, the bit lines on the unselected columns and the bit lines in the data read operation are in such a state that VDD source line DM is reliably supplied with high-side power supply voltage VDD, the static noise margin is ensured and the data is stably held.

Figure 15:
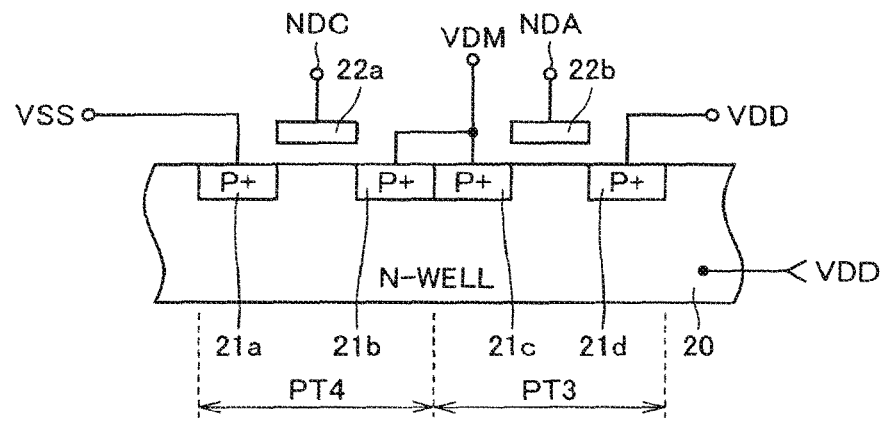
FIG. 15 schematically shows a cross sectional construction of a power supply control transistor shown in FIG. 13.

FIG. 15 schematically shows sectional structures of MOS transistors PT3 and PT4 shown in FIG. 13. MOS transistors PT3 and PT4 are formed in an N-well 20. P-channel MOS transistor PT3 includes P-type impurity regions 21c and 21d formed at the surface of N-well 20 with a space between them, and a gate electrode 22b formed on a well region surface between impurity regions 21c and 21d with a gate insulating film (not shown) interposed in between.

P-channel MOS transistor PT4 includes P-type impurity regions 21a and 21b formed separately and distantly at the surface of N-well 20, and a gate electrode 22a formed on a well region surface between impurity regions 21a and 21b with a gate insulating film interposed in between.

Impurity region 21a is coupled to receive low-side power supply voltage VSS, and impurity region 21d is coupled to receive high-side power supply voltage VDD. Gate electrodes 22a and 22b are coupled to nodes NDC and NDA shown in FIG. 13, respectively. Impurity regions 21b and 21c are coupled to VDD source line VDM. N-well 20 is biased to the level of high-side power supply voltage VDD.

Impurity regions 21b and 21c may be formed continuously to each other, or an element isolating region may be formed in between.

When node NDA is at the H level of voltage VDD, MOS transistor PT3 is in an off state and isolates the VDD supply node from VDD source line VDM. When node NDC is at the L level, a channel is formed between impurity regions 21a and 21c, and VDD source line VDM is coupled to low-side power supply voltage VSS.

When the voltage level of VDD source line VDM lowers, a PN junction between impurity region 21b and N-well 20 attains a deep bias state, and an absolute value of the gate to source voltage of MOS transistor PT4 relatively decreases so that the current driving power lowers, and the excessive lowering of the voltage level of VDD source line VDM can be prevented (owing to the back gate bias effect).

Accordingly, such a situation can be prevented that the voltage level of VDD source line VDM excessively lowers to deteriorate the data retention characteristics of the unselected memory cells, and to destroy the data held in the memory cells on the selected column and unselected row.

According to the fifth embodiment of the invention, as described above, the P-channel MOS transistor is used for the VDD source line to lower forcedly the potential level of the VDD source line in the floating state when the bit line potential changes. Accordingly, the voltage level of the VDD source line in the selected column lowers fast, the excessive lowering of the voltage level can be prevented, and it is possible to prevent destruction of the data held in the memory cells on the selected column and unselected rows. Also, excessive lowering of the VDD source line voltage can be prevented so that the VDD source line can rapidly return to the original voltage level after the completion of the write operation.

Sixth Embodiment

Figure 16:
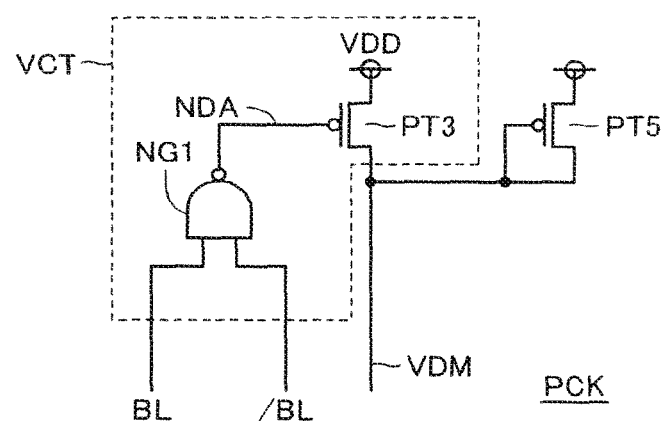
FIG. 16 shows a configuration of a write assist circuit according to a sixth embodiment of the invention.

FIG. 16 shows a construction of write assist circuit PCK according to a sixth embodiment of the invention. In write assist circuit PCK shown in FIG. 16, a diode-connected P-channel MOS transistor PT5 is connected to VDD source line VDM. Diode-connected P-channel MOS transistor PT5 has a gate and a drain connected to VDD source line VDM, and has a source coupled to a VDD supply node.

Power supply control section VCT has the same construction as the write assist circuits of the first to fifth embodiments, and includes NAND gate NG1 receiving the voltages on bit lines BL and /BL as well as P-channel MOS transistor PT3 selectively isolating VDD source line VDM from the VDD supply node according to the output signal of NAND gate NG1.

Figure 17:
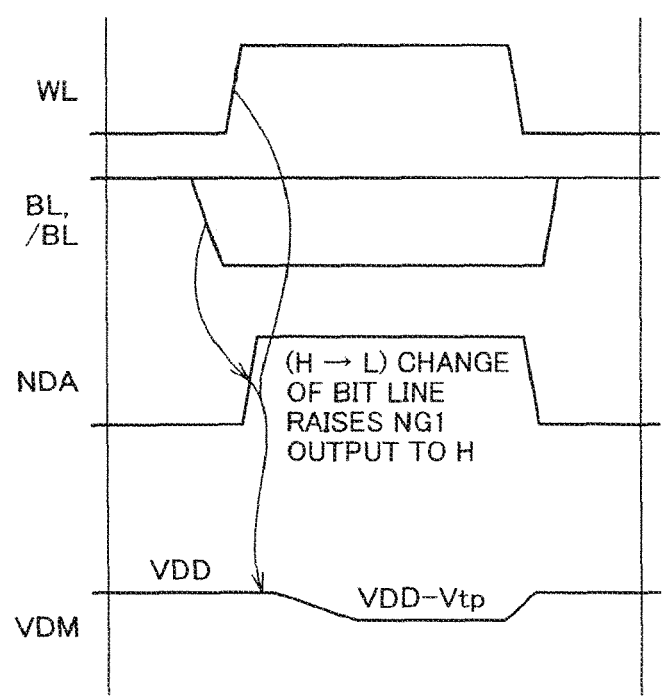
FIG. 17 is a signal waveform diagram representing an operation of the write assist circuit shown in FIG. 16.

FIG. 17 is a signal waveform diagram representing an operation for data writing of write assist circuit PCK shown in FIG. 16. Referring to FIG. 17, description will now be given of operations of write assist circuit PCK shown in FIG. 16.

In the data write operation, the voltage levels of bit lines BL and /BL in the selected column change to H and L levels according to the write data. According to the potential drop of one of bit lines BL and /BL, the output signal of NAND gate NG1 attains the H level to turn off MOS transistor PT3. When word line WL is driven to the selected state, a current flows through the selected memory cell, and the voltage level of VDD source line VDM lowers. MOS transistor PT5 is turned off when VDD source line VDM is at the level of voltage equal to or higher than (VDD−Vtp), where Vtp is an absolute value of the threshold voltage of MOS transistor PT5.

When VDD source line VDM is at the level of voltage lower than (VDD−Vtp), MOS transistor PT5 is turned on to couple VDD source line VDM to the VDD supply node, and prevents the potential lowering of VDD source line VDM. Therefore, the voltage level of VDD source line VDM is clamped at the level of (VDD−Vtp).

The operation of power supply control section VCT is the same as those of the constructions of the first to sixth embodiments. However, clamp transistor PT5 can prevent excessive drop of the voltage level of VDD source line VDM in the selected column, and can suppress deterioration of the data holding characteristics of the memory cells on the selected column and unselected rows, so that the destruction of the held data can be prevented.

The voltage level clamping element for VDD source line VDM may be formed of another element such as a PN-diode.

According to the sixth embodiment of the invention, as described above, voltage clamp means is employed for suppressing the lowering of the voltage level of the VDD source line, and it is possible to prevent destruction of the data held in the memory cells on the selected column and unselected row (because excessive lowering of the high-side power supply voltage can be prevented and accordingly, the lowering of the data holding characteristics can be suppressed).

Seventh Embodiment

Figure 18:
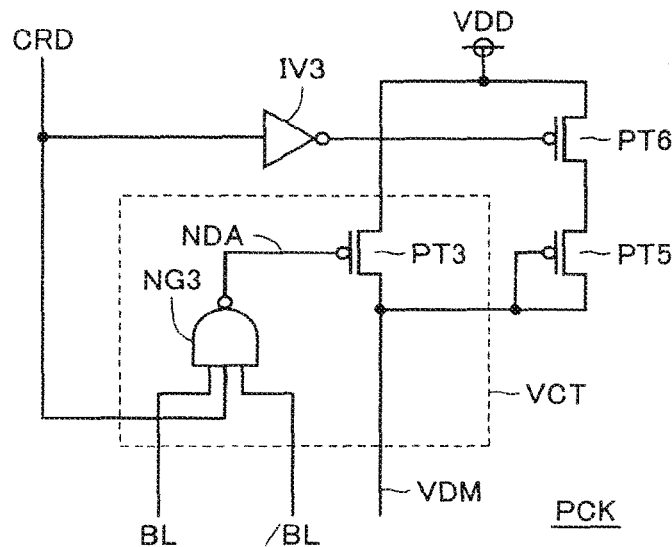
FIG. 18 shows a configuration of a write assist circuit according to a seventh embodiment of the invention.

FIG. 18 shows a construction of write assist circuit PCK according to a seventh embodiment of the invention. Write assist circuit PCK shown in FIG. 18 differs in the following constructions from the write assist circuit shown in FIG. 16. Power supply control section VCT includes an NAND gate NG3 receiving a redundant signal CRD and the voltages on bit lines BL and /BL in place of NAND gate NG1 receiving the voltages on bit lines BL and /BL. MOS transistor PT3 selectively couples the VDD supply node to VDD source line VDM according to the output signal of this NAND gate NG3.

Redundant signal CRD designates a defective column in the memory cell array. The bit lines in the faulty or defective column are normally kept in the unselected state, and the address of the defective column is replaced by a spare bit line pair. By replacing the bit lines on the faulty column with the spare bit line pair, it becomes possible to use the address of the faulty column to repair the faulty column.

In power supply control circuit PCK shown in FIG. 18, a P-channel MOS transistor PT6 that is selectively turned on in accordance with the output signal of inverter IV3 is connected between diode-connected P-channel MOS transistor PT5 and the VDD supply node. Inverter IV3 receives redundant signal CRD.

In the construction of write assist circuit PCK shown in FIG. 18, VDD source lines VDM are arranged corresponding to the memory cell columns for controlling the voltage levels of the columns, respectively, and further the power supplying is controlled for the faulty column in the faulty column repairing. Specifically, redundant signal CRD for the faulty column is set to the L level, and the output signal of NAND gate NG3 is fixed at the H level so that MOS transistor PT3 is normally set in the off state. Also, the output signal of inverter IV3 is at the H level, and the MOS transistor PT6 is normally in an off state so that the current path between the VDD supply node and MOS transistor PT5 is cut off. For the faulty column, therefore, VDD source line VDM is completely isolated from the VDD supply node, and a path of a leakage current due to the faulty memory cell on the faulty column is cut off so that the power consumption is made small.

For the normal column not containing such faulty memory cell, redundant signal CRD is set to the H level. In this case, the logical level of output signal of NAND gate NG3 depends on the potentials of bit lines BL and /BL, the output signal of inverter IV3 is fixed at the L level, and MOS transistor PT6 is turned on. In this case, therefore, operations similar to those of write assist circuit PCK shown in FIG. 16 is implemented.

Figure 19:
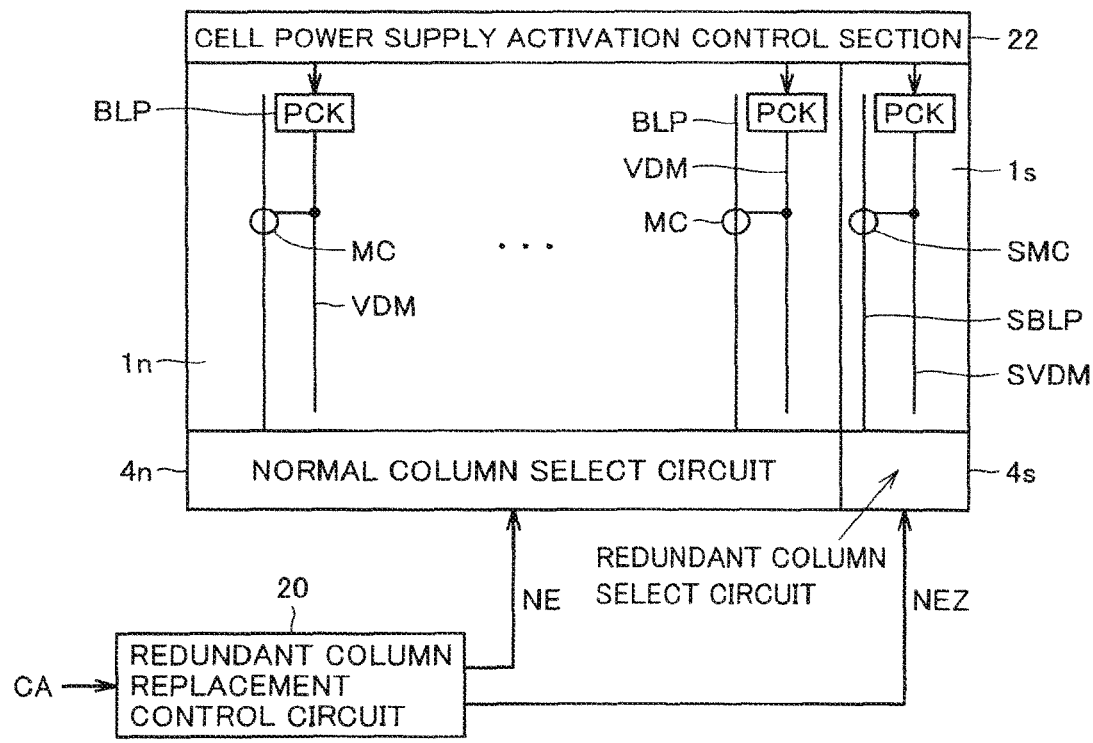
FIG. 19 schematically shows a construction of a main portion of a semiconductor memory device according to a seventh embodiment of the invention.

FIG. 19 schematically shows a construction of a main portion of a semiconductor memory device according to a seventh embodiment of the invention. In FIG. 19, a memory cell array includes a normal memory cell array 1n having normal memory cells MC arranged in rows and columns, and a spare memory cell array 1s having spare memory cells SMC for repairing a faulty column.

In the redundancy replacement repairing, the faulty column may be repaired in a so-called shift redundancy manner, in which the correspondence between the bit lines and the column decoder outputs is shifted except the faulty column. However, for representing the repairing of the faulty column, FIG. 19 shows a construction of repairing the faulty column by merely replacing the faulty column in normal memory cell array with the spare bit line pair.

For normal memory cell array 1n, there is provided bit line pairs BLP, VDD source lines VDM corresponding to respective bit line pairs BLP and write assist circuits PCK corresponding to respective VDD source lines VDM. In spare memory cell array 1s, a spare bit line pair SBLP is arranged corresponding to spare memory cell column SMC, and a spare VDD source line SVDM is arranged corresponding to spare bit line pair SBLP. The number of spare bit line pairs SBLP in spare memory cell array 1s is determined depending on the number of faulty columns to be repaired.

The column select circuit includes a regular column select circuit 4n arranged for regular memory cell array 1n, and a redundant column select circuit 4s arranged corresponding to memory cell array 1s.

A redundant column replacement control circuit 20 is arranged for controlling the operations of normal and redundant column select circuits 4n and 4s. Redundant column replacement control circuit 20 includes a program circuit storing a faulty column address specifying a faulty column, and produces a normal column select enable signal NE and a spare column select enable signal NEZ according to coincidence/non-coincidence between column address signal CA and the programmed faulty column address.

When the selected column in the designated address is non-defective, redundant column replacement control circuit 20 activates normal selection enable signal NE, and normal column select circuit 4n selects bit line pair BLP corresponding to the column in the designated address. Redundant column select circuit 4s is inactive, and the spare column is kept in the unselected state. When column address signal CA designates the faulty column, redundant column replacement control circuit 20 activates faulty spare column replacement enable signal NEZ, and redundant column select circuit 4s selects corresponding spare bit line pair SBLP employed for the redundancy replacement. In this case, normal column select circuit 4n stops the column select operation (signal NE is inactive).

For write assist circuits PCK, there is arranged a cell power supply control unit 22 for controlling enabling/disabling of each of write assist circuits PCK on a column-by-column basis. Cell power supply control unit 22 operates according to faulty column information to produce redundant signal CRD for corresponding write assist circuit PCK.

Figure 20:
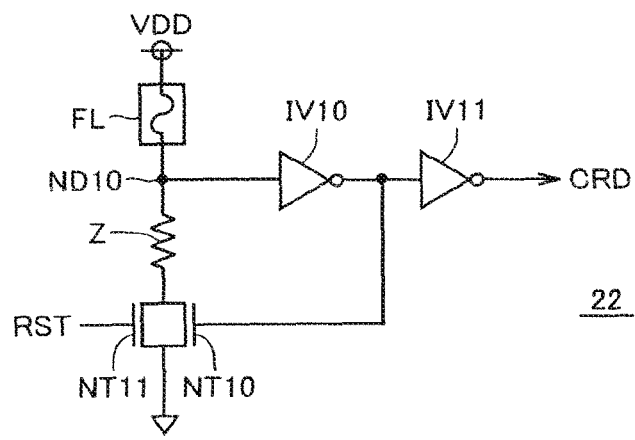
FIG. 20 shows, by way of example, a construction of a portion generating a redundant signal shown in FIG. 18.

FIG. 20 shows an example of a construction of a circuit producing the redundant signal for the VDD source line in one column included in power supply control unit 22 shown in FIG. 19. In FIG. 20, the redundant signal producing unit includes a link element FL which is connected between the high-side power supply node and an internal node ND10, and can be blown, a highly resistive resistance element Z having an end connected to internal node ND10, an inverter IV10 inverting a voltage signal on internal node ND10, an inverter IV11 inverting the output signal of inverter IV10 to produce redundant signal CRD, an N-channel MOS transistor NT10 which is connected between highly resistive resistance element Z and the low-side power supply node, and has a gate receiving the output signal of inverter IV10, and an N-channel MOS transistor NT11 which is connected between highly resistive resistance element Z and the low-side power supply node, and has a gate receiving a reset signal RST.

Upon system resetting or system power up, reset signal RST attains H level and is kept at H level for a predetermined time period. Link element FL for the faulty column is blown off.

When link element FL is blown, node ND is isolated from the high-side power supply node (VDD). When MOS transistor NT11 is turned on according to reset signal RST, internal node ND10 is driven to the voltage level of the low-side power supply node through highly resistive resistance element Z. Thereby, the output signal of inverter IV10 attains the H level to turn on MOS transistor NT10. Even when reset signal RST attains the L level to turn off MOS transistor NT11, node ND10 is maintained at the level of the voltage on the low-side power supply node by highly resistive resistance element Z and MOS transistor NT10. In this state, inverter IV11 fixes redundant signal CRD at the L level to stop the control of power supplying of the VDD source line to the faulty column, and the corresponding VDD source line is normally kept in the floating state.

When link element FL is not blown, internal node ND10 is coupled to the high-side power supply node (VDD). Even when MOS transistor NT11 is turned on according to reset signal RST, node ND10 maintains the II level of voltage VDD owing to the resistance value of highly resistive resistance element Z. Therefore, the output signal of inverter IV10 is at the L level, and MOS transistor NT10 is off. Therefore, internal node ND10 is maintained at the level of voltage VDD after reset signal RST attains the L level, and accordingly, redundant signal CRD) is maintained at the H level. MOS transistor NT10 is kept off by the output signal of inverter IV10, and the path of the through current is cut off in the redundant signal producing section.

As the construction of cell power supply unit 22, the power supply control unit is shown as replacing a faulty column with the spare column. However, the faulty column may be repaired according to the shift redundancy scheme. For repairing the faulty column in the shift redundancy scheme, a propagation path to the column select gate of the column select signal applied from the column decoder is switched. Cell power supply control unit 22 may produce redundant signal CRD by using a signal for instructing such path switching. Specifically, where there are two propagation paths for a column select gate of each column select signal, and one of the signal propagation paths is to be used, the paths are switched such that the column select signal is not propagated to the column select gate for the faulty column. Consequently, the propagation path of the column select signal is switched in the faulty column, the signal setting the column select signal propagation path for the adjacent column differs in logical level from the signal setting the propagation path of the column select signal for the faulty column. Therefore, the redundant signal can be produced for each column by utilizing, in each column, a gate circuit for determining whether the signals of setting the propagation paths of the column select signals in a pair of adjacent columns are the same in logic level.

As described above, according to the seventh embodiment of the invention, the power supply control is stopped on the VDD source line for the faulty column, and the corresponding VDD source line is forced into the floating state. Thus, the leakage current due to a memory cell in the faulty column can be prevented from flowing, and therefore the current consumption can be reduced.

Eighth Embodiment

Figure 21:
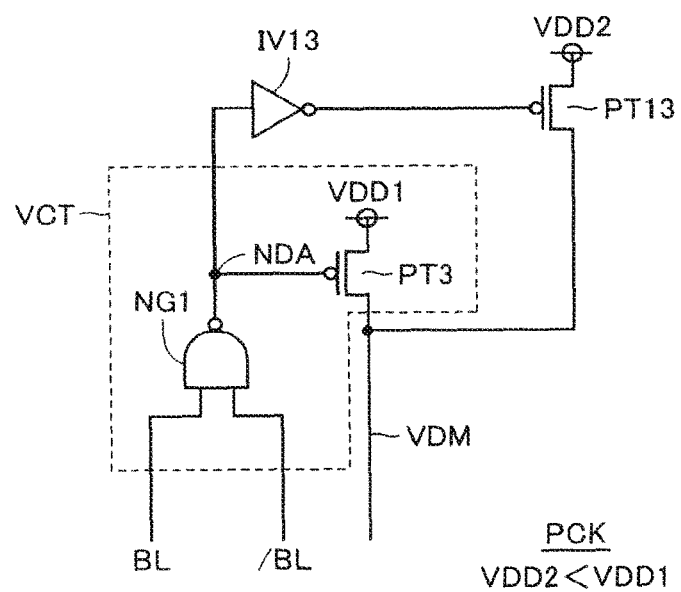
FIG. 21 shows a construction of a write assist circuit according to an eighth embodiment of the invention.

FIG. 21 shows a construction of write assist circuit PCK according to an eighth embodiment of the invention. Write assist circuit PCK shown in FIG. 21 includes an inverter IV13 receiving the output signal of NAND gate NG1 of power supply control section VCT, and a P-channel MOS transistor PT13 coupling VDD source line VDM to an intermediate voltage supply node according to an output signal of inverter IV13. Power supply control section VCT includes NAND gate NG1 and P-channel MOS transistor PT3, similarly to the first to seventh embodiments already described. MOS transistor PT3 is coupled to the node (VDD supply node) receiving an ordinary power supply voltage VDD1. MOS transistor PT13 is coupled to an intermediate voltage node receiving a voltage VDD2 lower than this ordinary power supply voltage VDD1.

Figure 22:
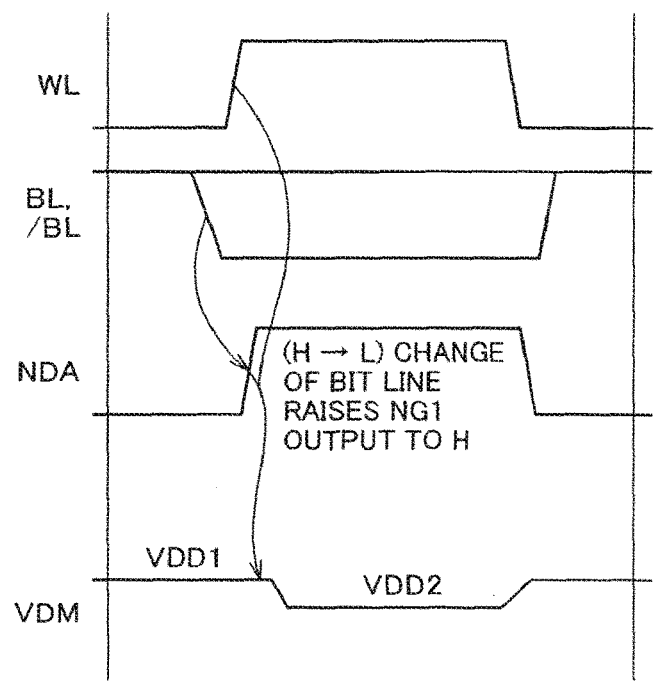
FIG. 22 is a signal waveform diagram representing an operation of the write assist circuit shown in FIG. 21.

FIG. 22 is a signal waveform diagram representing an operation for writing of write assist circuit PCK shown in FIG. 21. Referring to FIG. 22, description will now be given of the operations for data writing of write assist circuit PCK shown in FIG. 21.

In the data writing, bit lines BL and /BL are supplied with the voltages corresponding to the write data, and the voltages on these bit lines are driven to the H and L levels. Thereby, in power supply control section VCT, the output signal of NAND gate NG1 attains the H level, and MOS transistor PT3 is turned off to isolate VDD source line VDM from the node supplying voltage VDD1. Meanwhile, the output signal of inverter IV13 attains the L level to turn on MOS transistor PT13, and VDD source line VDM receives intermediate voltage VDD2. This voltage VDD2 is lower than the voltage VDD1 at the ordinary power supply voltage level. In the data write operation, the voltage level of VDD source line VDM is reliably lowered, the write margin of the memory cell can be reliably increased and the data can be written fast.

In this case, the voltage VDD2 is generated from the circuit for producing intermediate voltage VDD2, and VDD source line VDM can be set to a desired voltage level without receiving an influence of variations in threshold voltage caused due to transistor parameters, as in the construction of using a diode-connected MOS transistor. Thus, it is possible to set reliably the large static noise margin for the memory cells on the unselected columns and the selected row, and the held data can be reliably prevented from destruction.

Figure 23:
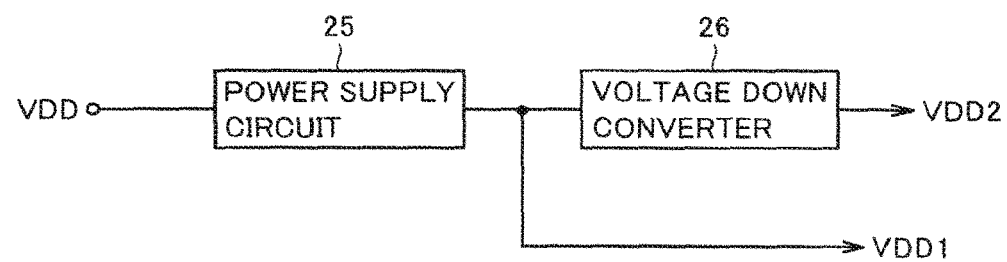
FIG. 23 shows, by way of example, a construction of a portion generating a power supply voltage shown in FIG. 21.

FIG. 23 schematically shows a construction of a power supply voltage generating section for generating two voltages VDD1 and VDD2 shown in FIG. 21. In FIG. 23, the power supply voltage generating section includes a power supply circuit 25 that receives externally supplied power supply voltage VDD, and effects stabilization processing such as noise removal on it to produce cell power supply voltage VDD1, and a voltage down converter 26 for down-converting an output voltage VDD1 of power supply circuit 25 to produce intermediate voltage VDD2.

Power supply circuit 25 simply performs the filtering processing such as noise removal, to produce cell power supply voltage VDD1 at the same voltage level as the externally supplied power supply voltage VDD. As for voltage down converter 26, intermediate voltage VDD2 may be produced with a circuit construction for converting an output current of a reference current generating circuit to a voltage. Alternatively, a feedback controlled internal voltage down converter (VDC) generally employed in a DRAM (Dynamic Random Access Memory) may be used, in which a voltage corresponding to intermediate voltage VDD2 is compared with the reference voltage, and a current is supplied from the power supply node to VDD2 power supply line according to the result of comparison.

By utilizing the power supply voltage generating circuit shown in FIG. 23, cell power supply voltage VDD1 and intermediate voltage VDD2 stably at desired voltage levels can be produced from externally supplied power supply voltage VDD.

According to the eighth embodiment of the invention, the VDD source line voltage is switched, according to the bit line voltage, between ordinary power supply voltage VDD1 and the lower intermediate voltage VDD2, and the VDD source line voltage for a selected column can be reliably set at a desired voltage level in the data writing, so that the data can be written stably and fast.

Through the use of the intermediate voltage, the VDD source line voltage in the selected column can be set to a desired voltage level, and it is possible to prevent deterioration of the data holding characteristics of unselected memory cells and to prevent destruction of the data held in the unselected memory cells.

Ninth Embodiment

Figure 24:
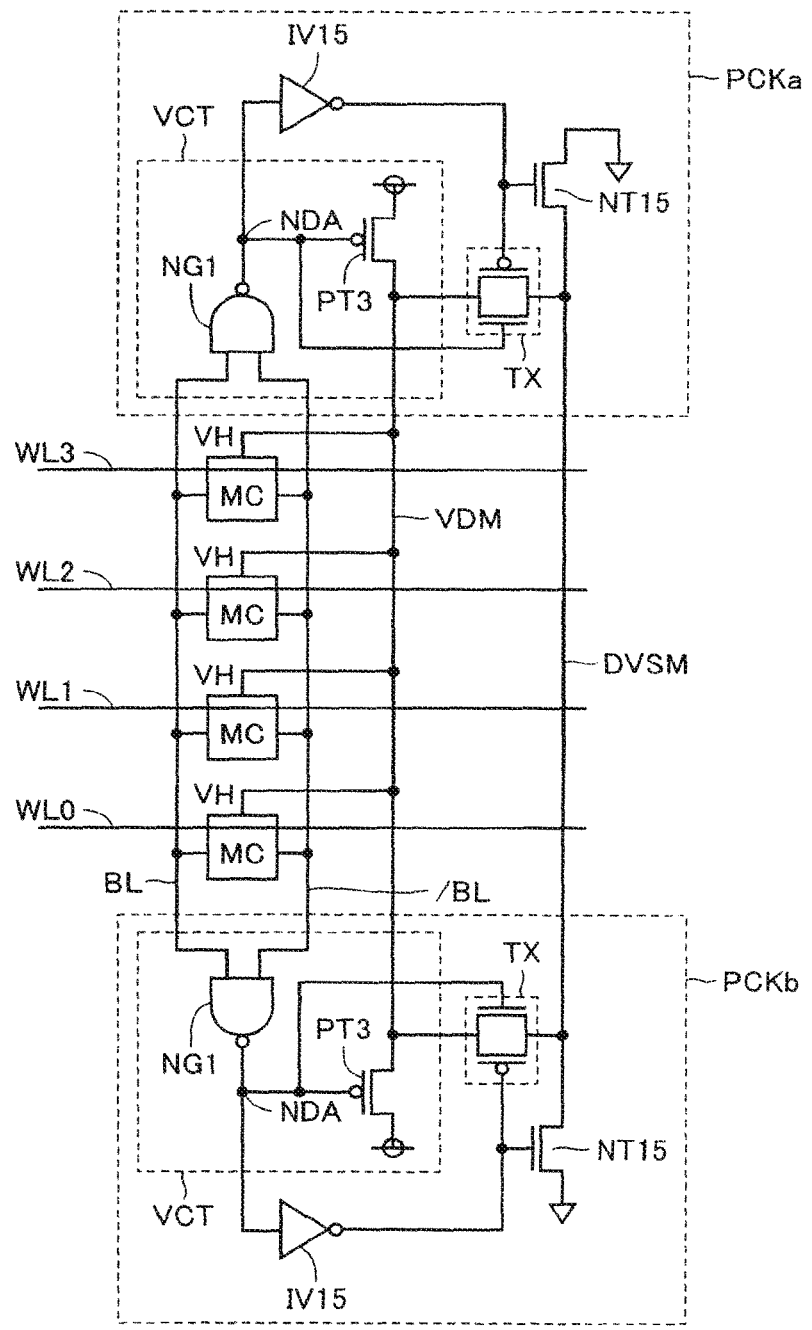
FIG. 24 shows a construction of a main portion of a semiconductor memory device according to a ninth embodiment of the invention.

FIG. 24 shows a construction of a main portion of a semiconductor memory device according to a ninth embodiment of the invention. FIG. 24 shows a construction of a write assist circuit for memory cells MC aligned in one column. Memory cells MC are arranged in four rows and one column, and word lines WL0-WL3 are arranged corresponding to the respective rows. Bit lines BL and /BL are arranged corresponding to the memory cell column. For each memory cell column, VDD source line VDM is arranged, similarly to the first to eighth embodiments. Further, a dummy VSS source line DVSM is arranged extending in parallel to VDD source line VDM and corresponding to each memory cell column. A VSS source line supplying low-side power supply voltage VSS to the memory cells are also arranged separately from the dummy source lines, although not shown in the figure.

Write assist circuits PCKa and PCKb are arranged opposingly at the opposite ends of VDD source line VDM and dummy VSS source line DVSM, precharge dummy VSS source line DVSM and adjust the voltage level of VDD source line by coupling selectively VDD source line VDM and dummy VSS source line DVSM to utilize accumulated charges on the dummy VSS source line.

Write assist circuits PCKa and PCKb have the same construction, and corresponding portions are allotted with the same reference numerals. Each of write assist circuits PCKa and PCKb includes power supply control section VCT for isolating VDD source line VDM from the VDD supply node according to the change in voltage levels of bit lines BL and /BL, an inverter IV15 for inverting the output signal of NAND gate NG1 included in power supply control section VCT, a transmission gate TX for selectively connecting VDD source line VDM to dummy VSS source line DVSM according to the output signals of NAND gate NG1 and inverter IV15, and an N-channel MOS transistor NT15 for coupling dummy VSS source line DVSM to the low-side power supply node (VSS supply node) according to an output signal of inverter IV15.

Transmission gate TX is configured of a CMOS transmission gate formed of a parallel connection of P- and N-channel MOS transistors, and transmits a voltage signal without causing a loss of threshold voltage.

Figure 25:
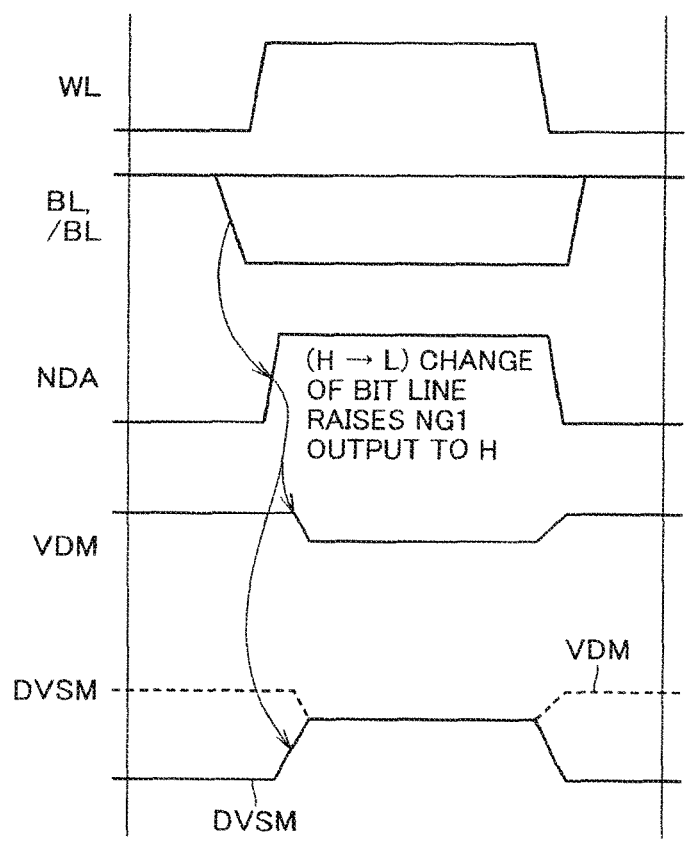
FIG. 25 is a signal waveform diagram representing an operation of circuits shown in FIG. 24.

FIG. 25 is a signal waveform diagram representing an operation in data writing of the write assist circuit shown in FIG. 24. Referring to FIG. 25, description will now be given of operations of write assist circuits PCKa and PCKb shown in FIG. 24.

In the standby state and data reading, the voltage levels of bit lines BL and /BL are logical high level, and the output signal of NAND gate NG1 (potential at node NDA) is L level. Thus, MOS transistors PT3 and NT15 are in an on state, and transmission gate TX is nonconductive. Therefore, VDD source line VDM is maintained at the level of high-side power supply voltage VDD, and dummy VSS source line DVSM is maintained at the level of the low-side power supply voltage (VSS).

When the data writing starts and the write data is transmitted to bit lines BL and /BL on the selected column, the voltage levels on bit lines BL and /BL change according to the write data. According to the potential changes of bit lines BL and /BL, the output signal of NAND gate NG1 (voltage on node NDA) attains the Ht level in power supply control section VCT. Responsively, MOS transistors PT3 and NT15 are turned off. In contrast, transmission gate TX is turned on to electrically couple VDD source line VDM to dummy VSS source line DVSM. These VDD source line VDM and dummy VSS source line DVSM are in the floating state, and accumulated charges move between dummy VSS source line DVSM and VDD source line VDM. Assuming that VDD source line VDM has a capacitance of Cd, and dummy VSS source line DVSM has a capacitance of Cs, the potentials V of source lines VDM and DVSM attained after the turn-on of transmission gate TX is at the level determined by a capacitance ratio of Cs/Dc, as expressed by the following equation:

$$V = Cd \cdot VDD/(Cd+Cs),$$

where it is assumed that low-side power supply voltage VSS is the ground voltage (0 V). For example, when it is designed that the capacitance ratio (Cd:Cs) is 10:1, the potential of VDD source line is at the level increased by 10/11 times through equalizing by transmission gate TX, and thus lowers by about 10%. Thereby, the voltage level of high-side power supply node lowers to increase the write margin for a selected memory cell MC, so that the storage data of the memory cell can be readily inverted, the write time can be reduced and the writing can be reliably performed.

In an unselected memory cell, the voltage level of the storage node changes to the extent, at most, similar to that in the read operation, and the storage data can be stably held.

In the operation of re-distributing the charges, the voltage level of VDD source line VDM lowers more rapidly than the case where the voltage level of the VDD source line lowers through discharging by writing into the memory cell, and the faster write can be achieved.

When the bit line load circuit (not shown) returns bit lines BL and /BL to the original H level of voltage VDD after the completion of writing, the output signal of NAND gate NG1 attains the L level, and responsively, transmission gate TX turns non-conductive, so that MOS transistors PT3 and NT15 are turned on. Accordingly, VDD source line VDM and dummy VSS source line DVSM return to the levels of high-side power supply voltage VDD and low-side power supply voltage VSS, respectively.

This dummy VSS source line DVSM is laid at the same or different interconnection layer that is the same as or different from VDD source line VDM, using an interconnection line extending over memory cells MC. Thus, VDD source line VDM and dummy VSS source line DVSM can be arranged in each column. Also, VDD source line VDM ad dummy VSS source line DVSM can have the same interconnection length even when the rows of memory cells increase in number. Thereby, the capacitance ratio of Cusecs can be kept constant. Accordingly, even when the rows and/or columns in the memory cell array change in number, it is merely required to extend VDD source line VDM and dummy VSS source line DVSM linearly in the column direction, and it is not necessary to redesign the interconnection layout. In addition, it is not necessary to change the layout of the memory cell array. The write assist circuits of the same layout can be utilized, and it is possible to suppress increase in area of the cell power supply control unit when the memory cell array configuration changes (only the number of the write assist circuits is changed according to the number of columns, and it is not necessary to change the configuration of the write assist circuit even when the number of the memory cells in the column direction changes).

As for the interconnection capacitance ratio between VDD source line VDM and dummy VSS source line DVSM, high-side power supply node VH of memory cell MC is connected to VDD source line VDM, and a parasitic capacitance thereof is present. The capacitance ratio between VDD source line VDM and dummy VSS source line DVSM is determined taking the parasitic capacitance of high-side power supply node VH into account. Thereby, even when the lengths of VDD source line VDM and dummy VSS source line DVSM increase in the column direction, the interconnection capacitance ratio with the parasitic capacitance taken into account is likewise unchanged.

According to the ninth embodiment of the invention, as described above, the dummy VSS source line and VSS source line are set to the floating state according to the bit line voltage and are electrically short-circuited in the data write operation, so that it is possible to lower rapidly the voltage level of VDD source line and to increase the write margin of the selected memory cell, and accordingly, the data can be written fast.

Tenth Embodiment

Figure 26:
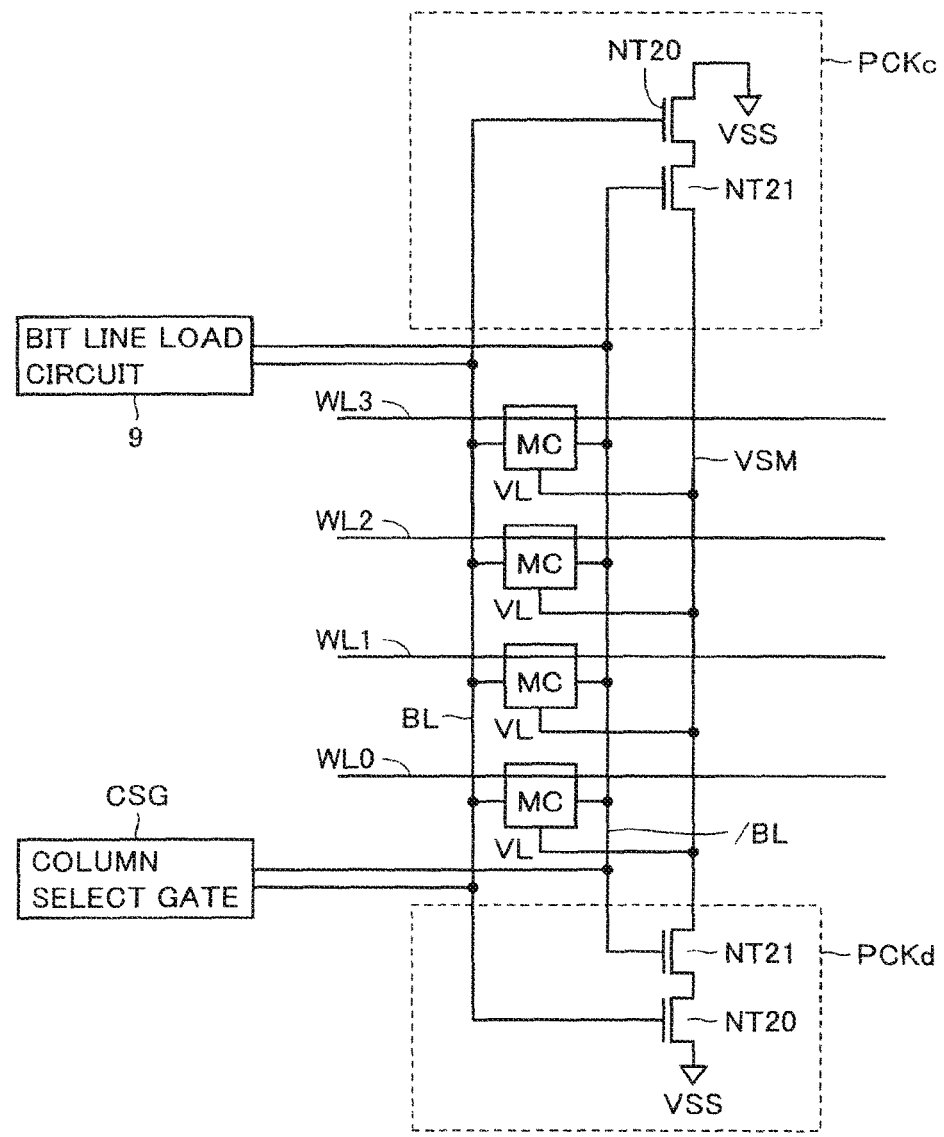
FIG. 26 shows a construction of a main portion of a semiconductor memory device according to a tenth embodiment of the invention.

FIG. 26 shows a construction of a memory cell circuit according to a tenth embodiment of the invention. FIG. 26 shows a construction of the write assist circuit for the memory cells arranged in one column. In FIG. 26, memory cells MC are arranged in four rows and one column, and word lines WL0-WL3 are arranged corresponding to the respective rows. Bit lines BL and /BL are arranged corresponding to each memory cell column, and are coupled to column select gate CSG and bit line load circuit 9. The construction described above is the same as those of the first to ninth embodiments already described, and is substantially the same in arrangement as the conventional memory cell array.

A VSS source line VSM transmitting low-side power supply voltage VSS is arranged corresponding to the memory cell column. In this tenth embodiment, VSS source lines VSM are used as cell power supply lines PVL0-PVLn. The voltage level (impedance) of VSS source line VSM is controlled according to the voltage levels of bit lines BL and /BL in the corresponding column.

Write assist circuits PCKc and PCKd are arranged on the opposite ends of VSS source line VSM. Write assist circuits PCKc and PCKd have the same construction, and each include N-channel MOS transistors NT20 and NT21 connected in series between the low-side power supply node and VSS source line VSM. Gates of MOS transistors NT20 and NT21 are connected to bit lines BL and /BL on the corresponding column, respectively.

VSS source line VSM is arranged in an isolated manner for each column.

Figure 27:
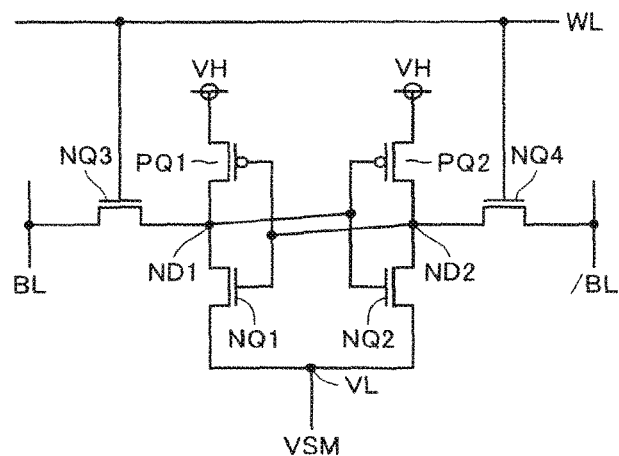
FIG. 27 shows internal connections of a memory cell shown in FIG. 26.

FIG. 27 schematically shows internal connections of memory cell MC shown in FIG. 26. As shown in FIG. 27, the source-side nodes of driver transistors NQ1 and NQ2, or low-side power supply nodes VL are commonly coupled to VSS source line VSM. The source nodes of load transistors PQ1 and PQ2, or high-side power supply nodes VH are normally supplied with power supply voltage VDD. Storage nodes ND1 and ND2 are coupled to bit lines BL and /BL via access transistors NQ3 and NQ4, respectively.

Figure 28:
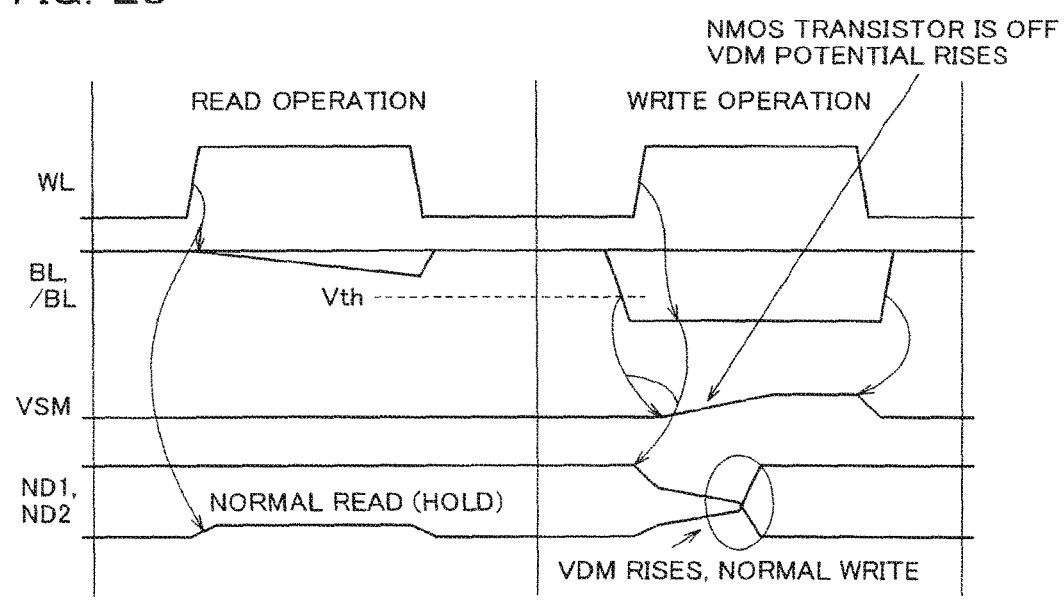
FIG. 28 is a signal waveform diagram representing an operation of a circuit shown in FIG. 26.

FIG. 28 is a signal waveform diagram representing an operation of the memory cell circuit shown in FIG. 26. Referring to FIG. 28, description will now be given of the operation of the memory cell circuit shown in FIGS. 26 and 27.

In the data reading, word line WL is driven to the selected state, and access transistors NQ3 and NQ4 in memory cell MC are turned on. Accordingly, storage nodes ND1 and ND2 are coupled to bit lines BL and /BL, respectively, and the potential levels of bit lines BL and /BL change according to the data held at storage nodes ND1 and ND2. In this operation, however, the potential changes of bit lines BL and /BL are small owing to the column current supplied from bit line load circuit 9, and the voltage levels of bit lines BL and /BL are sufficiently higher than threshold voltage Vth of MOS transistors NT20 and NT21. Therefore, both MOS transistors NT20 and NT21 are conductive, and VSS source line VSM is coupled to the low-side power supply node, and is stably maintained at the level of low-side power supply voltage VSS. Therefore, even when the voltage levels of storage nodes ND1 and ND2 rise according to the column current, the noise margin is sufficiently large, and memory cell MC stably holds the data.

In this data read operation, for each of the selected memory cells and unselected memory cells, low-side power supply voltage VSM is stably maintained at the level of low-side power supply voltage VSS, and high-side power supply node VH is coupled to high-side power supply voltage VDD so that the static noise margin is sufficiently ensured, and the storage data is stably held.

In the data write operation, the voltage levels of bit lines BL and /BL change according to the write data. In this operation, when the bit line driven to the L level lowers to a voltage level lower than threshold voltage Vth of MOS transistor NT20 or NT21, MOS transistor NT20 or NT21 is turned off, so that VSS source line VSM is isolated from the low-side power supply node and enters the floating state. It is now assumed that the data at the logical level opposite to that of the storage data is written in the data writing operation. When word line WL is driven to the selected state, and responsively, access transistors NQ3 and NQ4 are turned on, currents flow between bit lines BL and /BL and storage nodes ND1 and ND2, respectively, and the voltage levels of storage nodes ND1 and ND2 change. Then, the voltage levels of the storage nodes change according to the β-ratio between access transistors NQ3 and NQ4 and driver transistors NQ1 and NQ2 (according to latching capability of the inverter latch). When the voltages change as described above, by the through current flowing from high-side power supply node VH to low-side power supply node VL in memory cell MC and the write current flowing from the bit line, the current flows into low-side power supply node VL in memory cell MC, and the voltage level of VSS source line VSM rises.

When the voltage level of VSS source line VSM rises, the write margin of memory cell MC increases, and the voltage levels of storage nodes ND1 and ND2 rapidly changes according to the write data on bit lines BL and /BL so that the data can be written correctly.

When the voltage levels of storage nodes ND1 and ND2 are driven to the levels of high- and low-side power supply voltages VDD and VSS, respectively, the flowing path of the through current is cut off in memory cell MC, and the rising of the voltage level of VSS source line VSM stops.

When the writing of the data into the memory cell is completed, column select gate CSG isolates bit lines BL and /BL from the internal data line, and bit line load circuit 9 drives them to the level of high-side power supply voltage VDD. According to the potential rising of bit lines BL and /BL, MOS transistor NT20 or NT21 changes from the off state to the on state, and couples VSS source line VSM to the low-side power supply node, and the voltage level thereof returns to the level of low-side power supply voltage VSS.

In memory cell MC on a selected row and a selected column, the corresponding word line is in the selected state and accordingly, bit lines BL and BL are coupled to storage nodes ND1 and ND2, respectively. However, the write data is not transmitted to the associated bit lines, and bit lines BL and /BL are held at the voltage level precharged by bit line load circuit 9 so that only a minute potential change similar to that in the data reading occurs on the corresponding bit lines, and each memory cell on the unselected column and the selected row stably holds the storage data (because the low-side power supply voltage of VSS source line VSM is maintained at the VSS level).

According to the tenth embodiment of the invention, as described above, the data holding characteristics of the selected memory cell in the write operation can be lowered to perform fast writing even in such a construction that the VSS source line is used as memory cell power supply line PVL, and low-side cell power supply voltage VSS is controlled according to the bit line voltage during the data write operation.

Eleventh Embodiment

Figure 29:
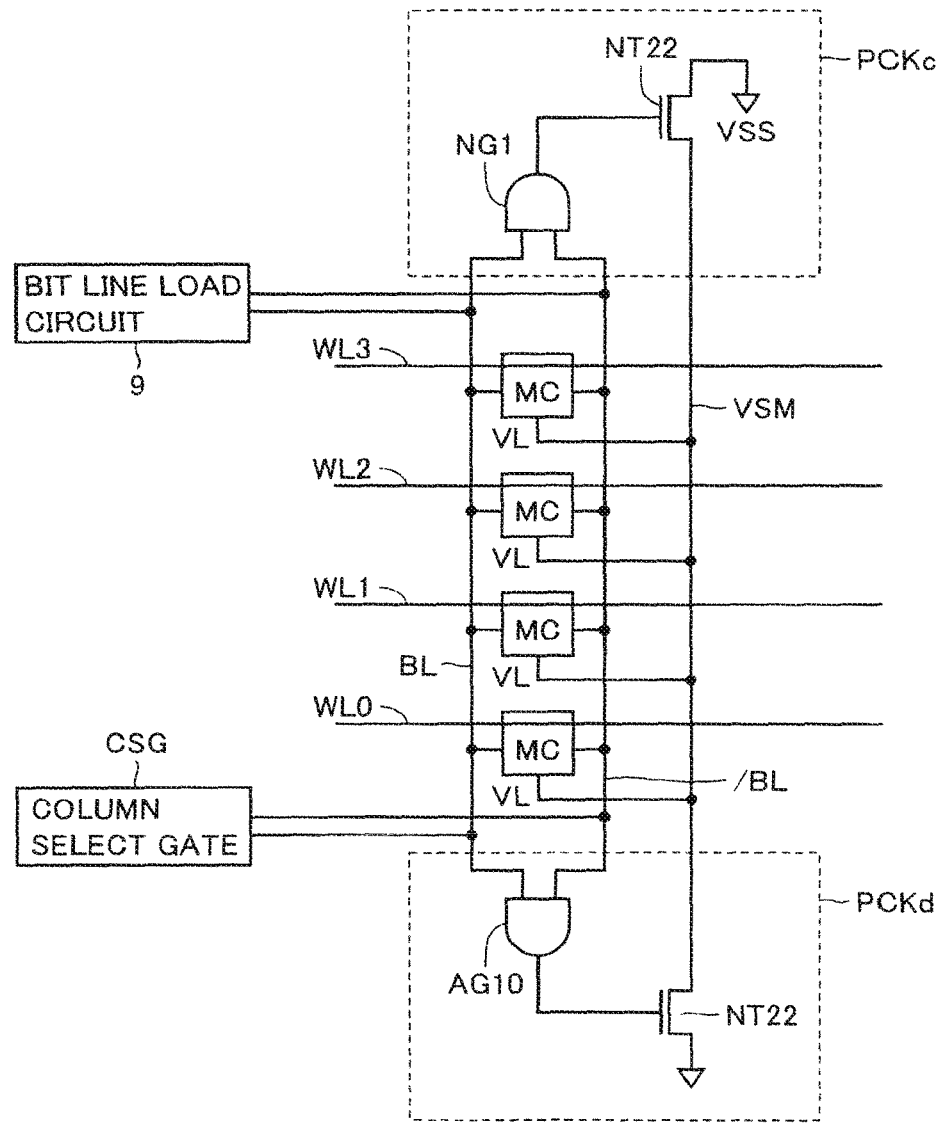
FIG. 29 shows a construction of a main portion of a semiconductor memory device according to an eleventh embodiment of the invention.

FIG. 29 shows a construction of a memory cell circuit according to an eleventh embodiment of the invention. The memory cell circuit shown in FIG. 29 differs from the memory cell circuit shown in FIG. 26 in the following constructions. In each of write assist circuits PCKc and PCKd, there is provided an AND gate AG10 receiving the voltages on bit lines BL and /BL, and an N-channel MOS transistor NT22 receiving the output signal of AND gate AG10. MOS transistor NT22 is coupled between the low-side power supply node and VSS source line VSM, and is made conductive to couple the low-side power supply node to VSS source line VSM.

Other constructions of the memory cell circuit shown in FIG. 29 are the same as those of the memory cell circuit shown in FIG. 26. Corresponding portions are allotted with the same reference numerals, and description thereof is not repeated.

The memory cell construction shown in FIG. 29 operates substantially in the same manner as the memory cell circuit of the tenth embodiment. In the data write operation, however, when one of bit lines BL and /BL lowers below the input logical threshold of AND gate AG10, the output signal of AND gate AG10 attains the L level, and thereby MOS transistor NT22 is turned off. Responsively, VSS source line VSM enters the floating state, and the voltage level thereof rises due to the write current and through current in the selected memory cell, so that the write margin of the selected memory cell increases, and fast writing is achieved.

In each memory cell on the selected row and an unselected column, storage nodes (ND1 and ND2) are connected to the corresponding bit lines, but bit lines BL and /BL have the voltage levels lower only slightly than the level of voltage that is precharged by bit line load circuit 9, and higher than the input logical threshold of AND gate AG10, so that the memory cell stably holds the storage data.

In each memory cell on an unselected row and the selected column, the storage nodes (ND1 and ND2) are isolated from the corresponding bit lines BL and /BL, and a path of current flow does not exist, so that the voltage levels of the storage nodes are stably maintained.

Accordingly, the construction shown in FIG. 29 achieve fast data writing without destroying the storage data of unselected memory cells, and can stably hold the held data in reading the held data, as is done in the preceding embodiments already described.

In each of write assist circuits PCKc and PCKd shown in FIG. 29, only one MOS transistor is arranged between the low-side power supply node and VSS source line VSM, and therefore the interconnection resistance of VSS source line VSM can be further reduced so that the column current in the memory cell data reading operation can be rapidly discharged to low-side power supply node VSS via the memory cell, and the fast reading can be achieved.

In the construction shown in FIG. 29, VSS source line VSM may likewise be divided into portions each corresponding to a predetermined number of rows of memory cells in the memory cell column, and the write assist circuit may be arranged for each divided line.

According to the eleventh embodiment of the invention, as described above, the AND gate receives the bit line voltage, and the corresponding VSS source line is selectively coupled to the low-side power supply node according to the output signal of that AND gate. Therefore, the stable reading and fast writing of the data of memory cell can be achieved. In addition, the interconnection resistance of the VSS source line is equivalently reduced so that the fast reading can be performed.

For the construction of controlling the voltage level of the VSS source line, the constructions can be utilized, such as the foregoing construction of controlling the voltage level of the VDD source line, the construction of clamping or maintaining it at a specific power supply voltage, the construction of coupling it to another voltage supply. For example, a clamping element formed of diode-connected MOS transistor may be arranged between the VSS source line and the ground node, and thereby it is possible to suppress the rising of the voltage level of VSS source line VSM to the level equal to or higher than the threshold voltage of the diode-connected MOS transistor. Also, a dummy VDD source line may be used and coupled selectively to the VSS source line in the data write operation, whereby the voltage level of the VSS source line can be raised. Further, the VSS source line may be coupled to the power supply node that supplies a predetermined intermediate voltage to the selected column in the data write operation, whereby the VSS source line can be stably set to the desired voltage level in the selected column, and fast writing can be stably performed.

Twelfth Embodiment

Figure 30:
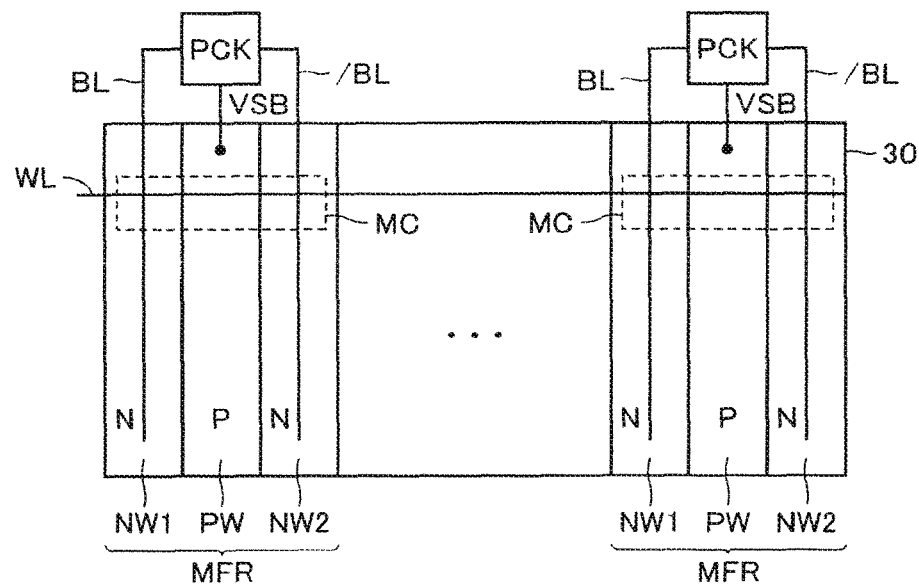
FIG. 30 schematically shows a construction of a main portion of a semiconductor memory device according to a twelfth embodiment of the invention.

FIG. 30 schematically shows a construction of a main portion of a semiconductor memory device according to a twelfth embodiment of the invention. In a semiconductor memory device shown in FIG. 30, P- and N-wells are arranged in a substrate region 30 of the memory cell array such that each P-well is sandwiched between the N-wells. P-well PW as well as N-wells NW1 and NW2 on the opposite sides of P-well PW provide a memory cell column formation region MFR in which memory cells MC aligned in one column are arranged.

In memory cell column formation region MFR, N-channel MOS transistors of the memory cells are formed in P-well PW, and P-channel MOS transistors forming the load transistors are formed in the N-wells.

Bit lines BL and /BL are arranged corresponding to memory cell column formation region MFR. Also, write assist circuit PCK is arranged corresponding to memory cell column formation region MFR. This write assist circuit PCK adjusts the potential of corresponding P-well PW in accordance with the potentials of corresponding bit lines BL and /BL. Thus, write assist circuit PCK in the twelfth embodiment adjusts the back gate potential of the N-channel MOS transistors in a memory cell according to the voltages on bit lines BL and /BL. Therefore, each P-well PW is supplied with a back gate voltage VSB individually from write assist circuit PCK.

Figure 31:
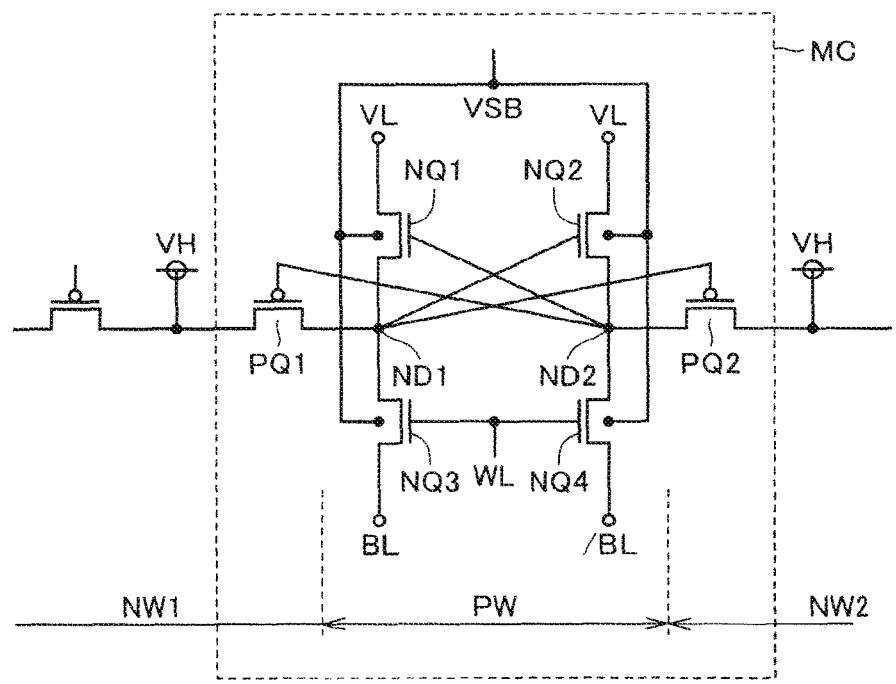
FIG. 31 schematically shows internal connections of a memory cell shown in FIG. 30.

FIG. 31 schematically shows an arrangement of memory cell MC shown in FIG. 30. P-well PW is arranged in a central portion of memory cell MC, and N-wells NW1 and NW2 are arranged on the opposite sides of P-well PW, respectively. In memory cell MC, N-channel MOS transistor NQ1 is arranged between low-side power supply node VL and storage node ND1, and N-channel MOS transistor NQ3 is arranged between storage node ND1 and bit line BL. N-channel MOS transistor NQ2 is arranged between low-side power supply node VL and storage node ND2, and N-channel MOS transistor NQ4 is arranged between storage node ND2 and bit line /BL. The gates of MOS transistors NQ1 and NQ2 are coupled to storage nodes ND2 and ND1, respectively, and word line WL is connected to the gates of MOS transistors NQ3 and NQ4.

These MOS transistors NQ1-NQ4 are formed within P-well PW, and are commonly supplied at their back gates with a substrate voltage VSB from the corresponding write assist circuit.

In memory cell MC, P-channel MOS transistors PQ1 and PQ2 are arranged at N-wells NW1 and NW2, respectively. MOS transistor PQ1 is connected between high-side power supply node VH and storage node ND1, and has a gate connected to storage node ND2. MOS transistor PQ2 is connected between high-side power supply node VH and storage node ND2, and has a gate coupled to storage node ND1. Although not specifically shown, the bias voltages of corresponding N-wells NW1 and NW2 bias the back gates of MOS transistors PQ1 and PQ2, respectively. N-wells NW1 and NW2 are shared between the regions forming the load transistors of the memory cells in the adjacent columns.

FIG. 31 merely shows, by way of example, the arrangement of the memory cells, and such arrangement may be employed that for each memory cell column, an in a central portion, an N-well is arranged at a central portion for forming a load transistor, and on the opposite sides of the N-well, P-wells are formed for forming access and driver transistors for bit lines BL and /BL. In this arrangement, for isolating the well regions of the memory cells in the adjacent columns from each other, an appropriate isolating structure such as junction isolation is employed for isolating P-well in each column from that on the other column.

Figure 32:
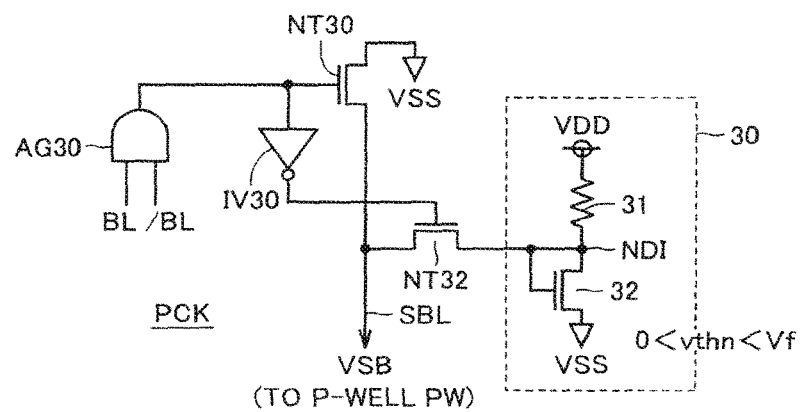
FIG. 32 shows, by way of example, a construction of a write assist circuit shown in FIG. 30.

FIG. 32 shows by way of example a construction of write assist circuit PCK shown in FIG. 30 and a construction of a circuit for generating a well bias voltage VSB. In FIG. 32, write assist circuit PCK includes an AND gate AG30 that receives voltages on bit lines BL and /BL, an N-channel MOS transistor NT30 that is connected between the low-side power supply node and a well bias voltage transmission line SBL and is selectively made conductive in response to the output signal of AND gate AG30, an inverter IV30 that receives the output signal of AND gate AG30, and an N-channel MOS transistor N32 that is selectively made conductive according to the output signal of inverter IV30, to transmit the bias voltage of bias voltage generating circuit 30.

Bias voltage generating circuit 30 includes a highly resistive resistance element 31 connected between the high-side power supply node and node ND1, and an N-channel MOS transistor 32 connected between node ND1 and the low-side power supply node and having a gate connected to node ND1. MOS transistor 32 operates in a diode mode to produce the voltage of threshold voltage Vthn on node ND1. Threshold voltage Vthn of MOS transistor 32 is at a level higher level than low-side power supply voltage VSS, and is lower than a forward voltage drop Vf of a PN junction between P-well PW and the N-type impurity region of N-channel MOS transistor.

Figure 33:
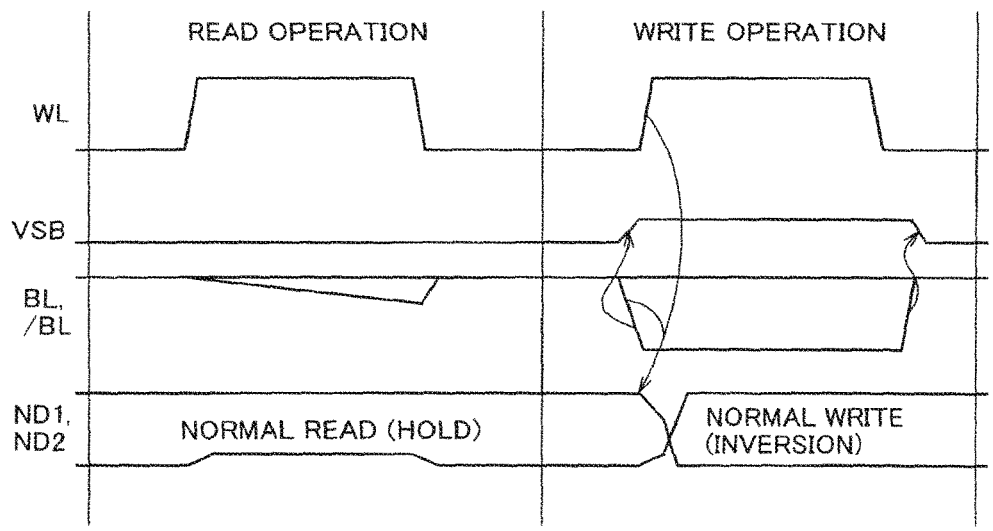
FIG. 33 is a signal waveform diagram representing an operation of circuits shown in FIGS. 30-32.

FIG. 33 is a signal waveform diagram representing an operation of the write assist circuit shown in FIGS. 30-32. Referring to FIG. 33, description will now be given of the operation of the circuit shown in FIGS. 30-32.

Bit lines BI and /BL is already precharged to the H level by a bit line load circuit (not shown). In the data read operation, the potential amplitudes of bit lines BL and /BL in the selected column are small, the voltage levels thereof are higher than the input logical threshold of AND gate AG30, and AND gate AG30 outputs a signal at the H level. Accordingly, an MOS transistor NT30 is conductive, and an MOS transistor NT32 is in an off state, so that bias voltage VSB on P-wells PW (PW1 and PW2) is maintained at the level of low-side power supply voltage VSS, and the data is read stably.

In the data write operation, when the voltage levels of bit lines BL and /BL change according to the write data, the output signal of AND gate AG30 falls from the H level to the L level according to the potential drop of one of bit lines BL and /BL. Responsively, MOS transistor NT30 is turned off, and MOS transistor NT32 is turned on, and the bias voltage generated by bias voltage generating circuit 30 is transmitted as well bias voltage VSB to well bias voltage transmission line SBL. The voltage (Vthn) generated by bias voltage generating circuit 30 is higher than low-side power supply voltage VSS. Therefore, the source to back gate of each of MOS transistors NQ1-NQ4 is forward-biased, and the threshold voltages thereof lower so that a drain current Ids driven by MOS transistors NQ1-NQ4 increases. Accordingly, the voltage levels of storage nodes ND1 and ND2 change according to the write data written onto bit lines BL and /BL, and storage nodes ND1 and ND2 are rapidly driven to the H and L levels according to the write data on bit lines BL and /BL, respectively. In the unselected column, the P-well potential is at the level of low-side power supply voltage VSS, and the storage data is stably held. In each memory cell on the unselected row and the selected column, the voltage level of voltage VSB on P-well PW is driven to the voltage level higher than low-side power supply voltage VSS, but the back gate bias effect is commonly exerted on MOS transistors NQ1-NQ4 to cause the same threshold voltage shift in them. Therefore, the β-ratio between the access transistor and the driver transistor does not change, and the static noise margin does not deteriorate. Further, the storage node is isolated from the corresponding bit line, and an internal current flowing path does not present so that the storage data is stably held.

According to the twelfth embodiment of the invention, as described above, the bias voltage on the well region forming the access and driver transistors is controlled according to the bit line voltage in each memory cell column individually and independently of the other memory cell columns. In the write operation, the substrate bias effect of the N-channel MOS transistor is reduced, and the gate to source voltage is equivalently increased to increase the drive current amount, so that the data can be written fast and stably.

Thirteenth Embodiment

Figure 34:
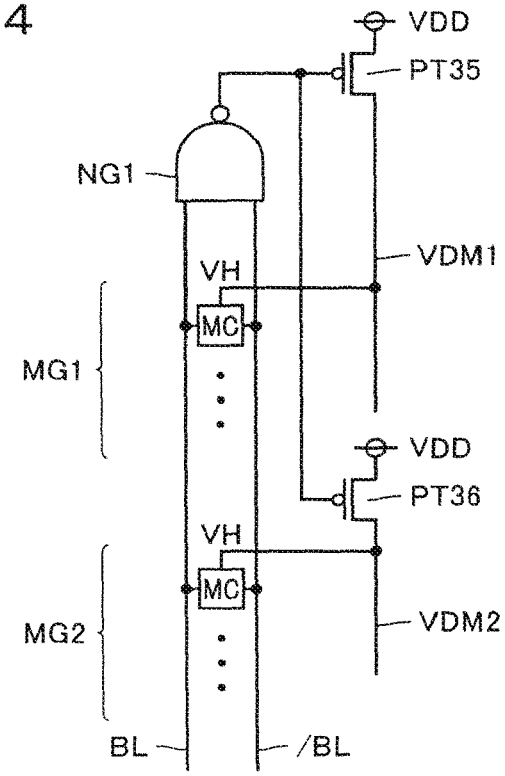
FIG. 34 shows a construction of a main portion of a semiconductor memory device according to a thirteenth embodiment of the invention.

FIG. 34 schematically shows a construction of a main portion of a semiconductor memory device according to a thirteenth embodiment of the invention. FIG. 34 shows a construction of a portion related to the memory cells in one column. Memory cells MC connected to bit lines BL and /BL are divided into two memory cell groups MG1 and MG2. Corresponding to this division, VDD source line VDM is divided into divided VDD source lines VDM1 and VDM2 corresponding to memory cell groups MG1 and MG2, respectively. P-channel MOS transistors PT35 and PT36 are coupled to divided VDD source lines VDM1 and VDM2, respectively. MOS transistors PT35 and PT36 are selectively turned on according to the output signal of NAND gate NG1 receiving the voltages of bit lines BL and /BL, and supply high-side power supply voltage VDD to corresponding divided VDD source line VDM1 and VDM2, respectively, when made conductive.

The construction of the write assist circuit shown in FIG. 34 is the same as that of the divided VDD source line of the third embodiment shown in FIG. 10 except for that NAND gate NG1 is provided commonly to memory cell groups MG1 and MG2. Therefore, the operations for data writing and reading are the same as those of the construction of the third embodiment shown in FIG. 11, and the voltage and impedance of VDD source line VDM corresponding to each bit line pair are controlled individually and independently of the other bit line pairs.

In the case of the construction shown in FIG. 34, NAND gate NG1 is arranged on one end of the bit line pair BL and /BL for commonly controlling MOS transistors PT35 and PT36, so that an occupation area of the write assist circuit can be reduced.

[Modification]

Figure 35:
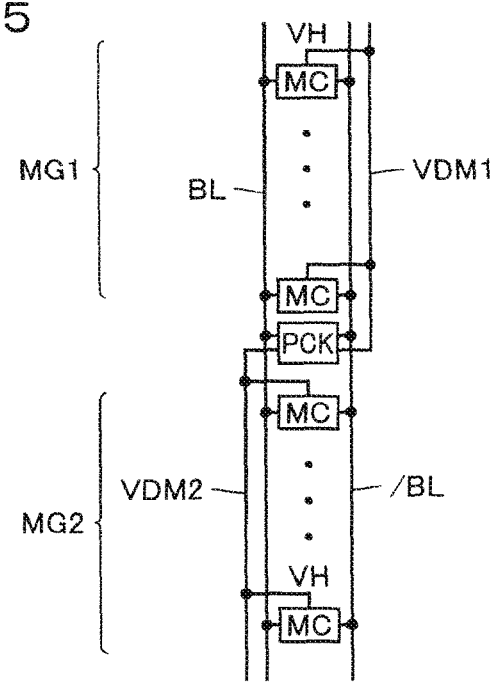
FIG. 35 shows a construction of a modification of the semiconductor memory device according to the thirteenth embodiment of the invention.

FIG. 35 schematically shows a construction of a modification of the thirteenth embodiment of the invention. In the construction shown in FIG. 35, write assist circuit PCK is arranged at a central portion of bit lines BL and /BL. Write assist circuit PCK controls divided VDD source lines VDM1 and VDM2 provided for the respective memory cell groups MG1 and MG2 according to the voltage levels of corresponding bit lines BL and /BL.

Write assist circuit PCK includes NAND gate NG1 shown in FIG. 34 as well as P-channel MOS transistors PT35 and PT36. Divided VDD source lines VDM1 and VDM2 are coupled to high-side power supply nodes VH of memory cells MC in the respective memory cell groups MG1 and MG2.

In the construction shown in FIG. 35, write assist circuit PCK is arranged at the central portion of the memory cell array. NAND gate NG1 and P-channel MOS transistors PT35 and PT36 forming write assist circuit PCK can be implemented through the use of the P- and N-channel MOS transistors forming memory cell MC, and the increase in array layout area can be suppressed.

Figure 36:
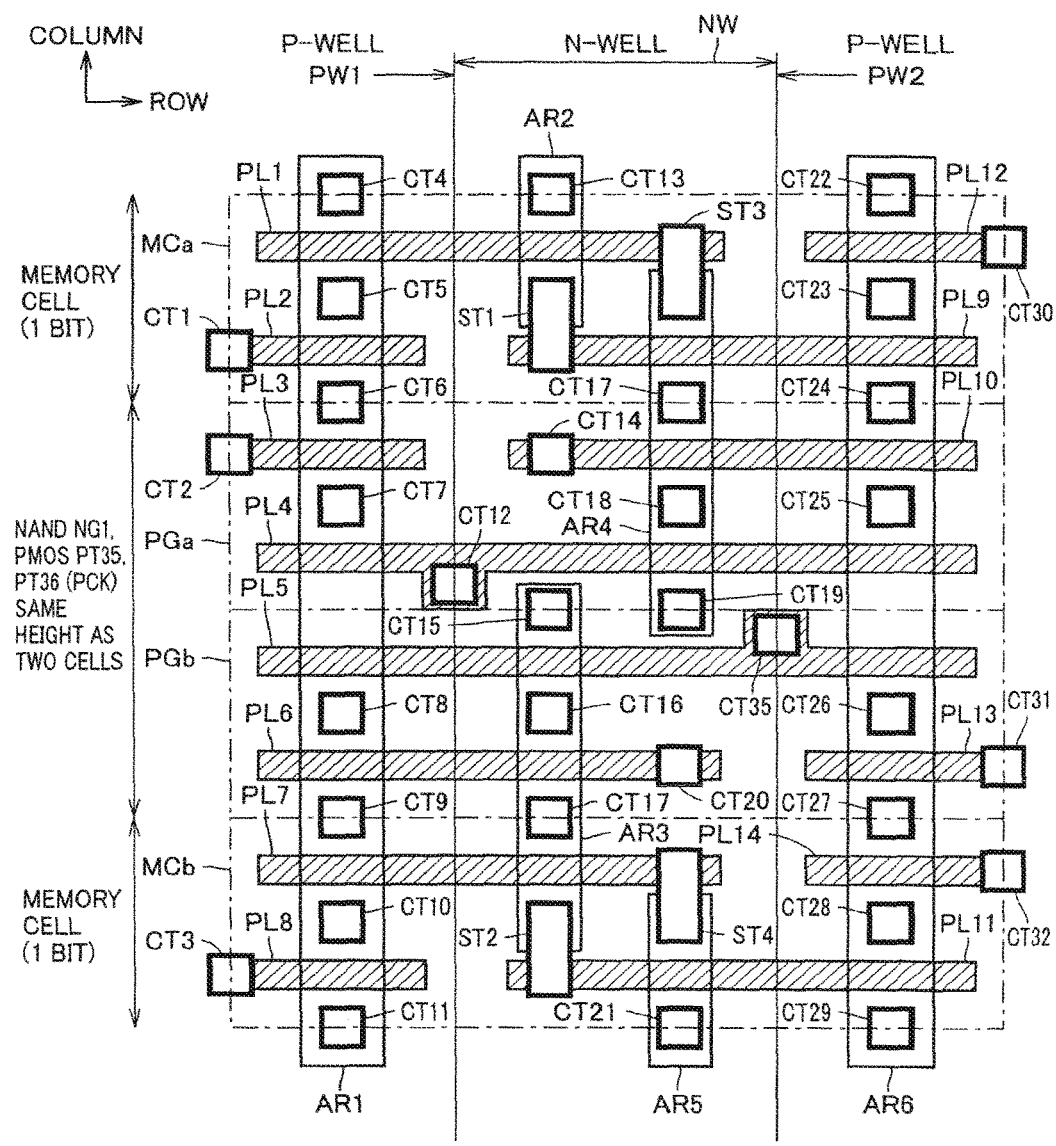
FIG. 36 shows a planar layout of memory cells of a write assist circuit shown in FIG. 35.

FIG. 36 shows a planar layout of write assist circuit PCK and memory cells MC shown in FIG. 35. FIG. 36 shows an interconnection layout achieved after forming contacts from forming active regions.

In FIG. 36, an N-well NW extending linearly in the column direction is arranged in the central portion of the memory cell column arrangement region. P-wells PW1 and PW2 each extending in the column direction are arranged on the opposite sides of N-well NW, respectively. In N-well NW and P-wells PW1 and PW2, memory cell regions MCa and MCb each for one bit of memory cell extend in the row direction. Regions PGa and PGb for forming write assist circuits PCK are arranged between memory cell regions MCa and MCb. Write assist circuit formation regions PGa and PGb have the same lengths in the column direction as memory cell regions MCa and MCb.

N- and P-wells NW and PW are N- and P-type regions formed at the same semiconductor substrate surface, and have P- and N-channel MOS transistors (or active regions for forming P- and N-type transistor elements) formed thereon, respectively. These wells NW and PW serve as the substrate regions (back gates) of the MOS transistors. Thus, N-well NW is a P-channel MOS transistor formation region, and P-well PW is an N-channel MOS transistor formation region.

Active regions AR1 and AR6 each extending continuously in the column direction are formed in P-wells PW1 and PW2, respectively. In N-well NW, an active region AR2 is arranged in memory cell region MCa, and an active region AR3 extends in the column direction over regions PGb and MCb. An active region AR4 extends in the column direction over regions MCa and PGa, and active region AR5 extending in the column direction is formed in memory cell region MCb.

In the region of memory cell MCa, polycrystalline silicon interconnection lines PL1 and PL2 are formed extending in the row direction. Polycrystalline silicon interconnection line PL1 extends over P- and N-wells PW1 and NW, and polycrystalline silicon region PL2 extends only in P-well region PW1.

In P-well PW1, polycrystalline silicon interconnection lines PL3, PL4, PL5, PL6, PL7 and PL8 are formed extending, in the row direction, to cross active region AR1. Polycrystalline silicon interconnections PL3 and PL8 extend in the row direction within the region of P-well PW1. Polycrystalline silicon interconnection lines PL4 and PL5 extend linearly in the row direction over P-well PW1, N-well NW and P-well PW2.

Polycrystalline silicon interconnection lines PL6 and PL7 are disposed extending in the row direction over P- and N-wells PW1 and NW1, to cross active regions AR1 and AR3.

A polycrystalline silicon interconnection line PL11 is disposed extending in the row direction across active regions AR5 and AR6 in N-well NW and P-well PW2.

Polycrystalline silicon interconnection lines PL12, PL13 and PL114 are arranged extending in the row direction, only within the region of P-well PW2, to cross active region AR6.

Polycrystalline silicon interconnection lines PL2, PL3 and PL8 are provided on one-side ends thereof with contacts CT1, CT2 and CT3, respectively. In active region AR1, each of contacts CT4-CT11 is arranged between the adjacent polycrystalline silicon interconnection lines except between polycrystalline silicon interconnection lines PL4 and PL5.

A contact CT12 is arranged for polycrystalline silicon interconnection line PL4, and is located in a boundary region between P- and N-wells.

In active region AR2, a contact CT13 is arranged in a region on one side of polycrystalline silicon interconnection PL1, and a shared contact ST1 is arranged in a region on the other side. Shared contact ST1 directly connects the corresponding impurity region in active region AR2 to a polycrystalline silicon interconnection line PL9. Therefore, shared contact ST1 extends over an insulating film for element isolation onto a position above polycrystalline silicon interconnection PL9. By utilizing the shared contact, it is possible to avoid use of a metal interconnection line in the interconnection layer for connecting active region AR2 to polycrystalline silicon interconnection line PL9.

In active region AR3, contacts CT15, CT16 and CT17 are arranged corresponding to polycrystalline silicon interconnections PL5, PL6 and PL7, respectively, and a shared contact ST2 is arranged on the other end region thereof. Shared contact ST2 connects the impurity region at the lower side of active region AR3 to polycrystalline silicon interconnection line PL11.

In active region AR4, a shared contact ST3 is arranged for polycrystalline silicon interconnection line PL1, and contacts CT17, CT18 and CT19 are arranged corresponding to polycrystalline silicon interconnection lines PL9, P10 and PL4, respectively.

Active region AR5 is likewise connected to polycrystalline silicon interconnection line PL1 via shared contact ST3, and is provided, at the other side, with a contact CT21.

In active region AR6, contacts CT22-CT29 for the corresponding impurity regions are arranged corresponding to the polycrystalline silicon interconnection lines, respectively. In active region AR6, a contact is not arranged between polycrystalline silicon interconnection lines PL4 and PL5, similarly to active region AR1.

Contacts CT30, CT31 and CT32 are arranged on the respective other ends of polycrystalline silicon interconnection lines PL12, PL13 and PL14.

As can be seen from the interconnection layout of FIG. 36, gate interconnection lines of transistors of memory cell regions MCa and MCb extend in the same direction as the gate interconnection lines in write assist circuit formation regions PGa and PGb, and the layout of interconnections is point-symmetrical with respect to a center of the boundary region between regions PGa and PGb. Therefore, the interconnection layout can be simple, and the regularity of the interconnection pattern of the memory cells can be maintained.

Further, the active regions linearly extend in the column direction, and the transistors can be arranged with improved area efficiency. In P-wells PW1 and PW2, active regions AR1 and AR6 are each arranged continuously in a linear form, and patterning is made easy to readily accommodate for cell miniaturization.

Figure 37:
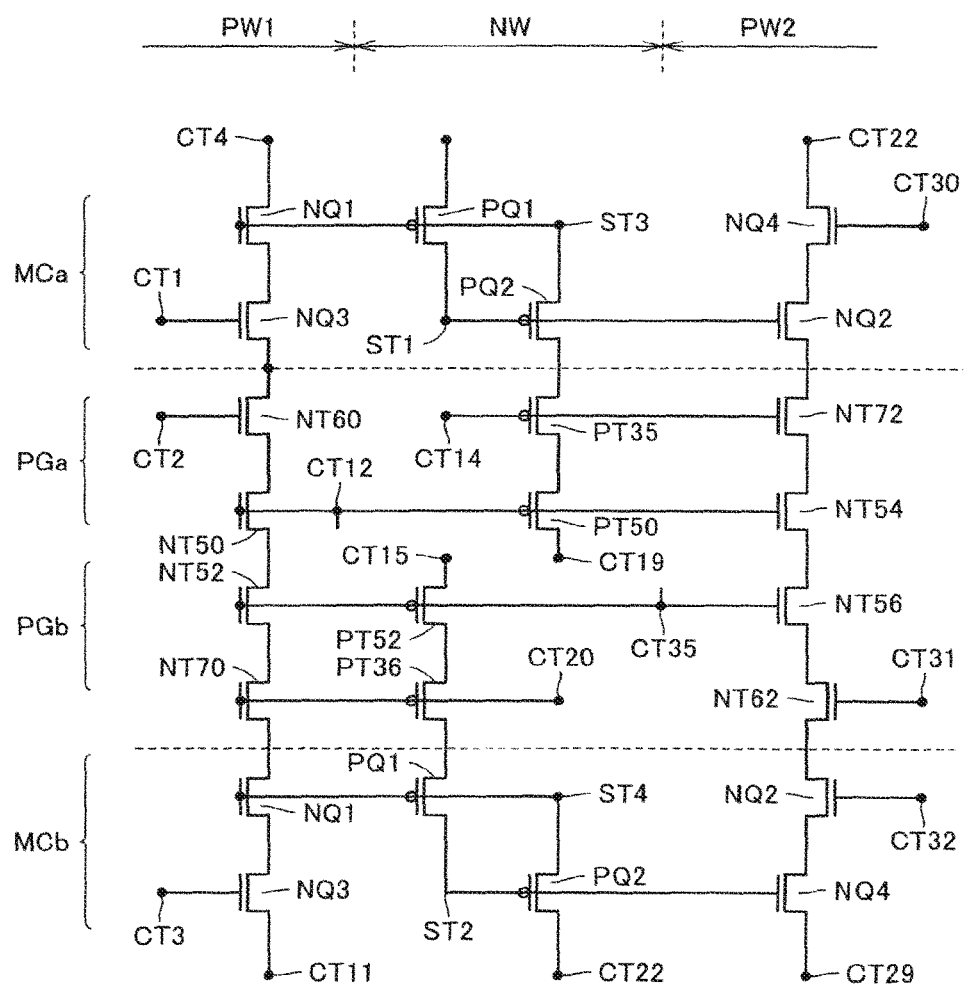
FIG. 37 shows an electrically equivalent circuit of an interconnection layout shown in FIG. 36.

FIG. 37 shows an electrically equivalent circuit of the interconnection layout shown in FIG. 36. In FIG. 37, for memory cell region MCa, in P-well PW1, N-channel MOS transistors NQ1 and NQ3 are arranged in series, at P-well PW2, N-channel MOS transistors NQ4 and NQ2 are arranged in series. These MOS transistors NQ1-NQ4 correspond to the driver transistors and access transistors of memory cells MC shown in FIG. 31 and others, and corresponding portions are allotted with the same reference numerals.

For memory cell region MCa, at N-well NW, P-channel MOS transistors PQ1 and PQ2 are arranged being displaced from each other in the row and column directions. These MOS transistors PQ1 and PQ2 correspond to the load transistors in the construction of memory cell MC shown in FIG. 31. Corresponding portions are allotted with the same reference numerals.

One conduction node of MOS transistor NQ1 is connected to contact CT4, and the gate of MOS transistor NQ3 is connected to contact CT1. Gates of MOS transistors NQ1 and PQ1 are connected to one conduction node (drain node)

of MOS transistor PQ2 via shared contact ST3. One conduction node (drain node) of MOS transistor PQ1 is connected to gates of MOS transistors PQ2 and NQ2 via shared contact ST1. MOS transistor NQ4 has one conduction node connected to contact CT22, and a gate connected to contact CT30.

For the write assist circuit formation region, at P-well PW1, MOS transistors NT60 and NT50 are formed in region PGa, and MOS transistors NT52 and NT72 are formed in region PGb, and conduction nodes (sources/drains) of these MOS transistors NT60, NT50, NT52 and NT72 are connected in series (formed in active region AR1). Likewise, MOS transistors NT72, NT54, NT56 and NT62 are arranged to be connected in series in P-well PW2.

For region PGa, at N-well NW, P-channel MOS transistors PT35 and PT50 are formed. For region PGb, at N-well NW, P-channel MOS transistors PT52 and PT36 are arranged in series. MOS transistors PT35 and PT36 are transistors controlling the impedance of the memory cell power supply, and correspond to MOS transistors PT35 and PT36 shown in FIG. 34.

A gate of MOS transistor NT60 is connected to contact CT2, and gates of MOS transistors NT50, PT50 and NT54 are coupled to contact CT12 via a common interconnection line (polycrystalline silicon interconnection line PL4). Gates of MOS transistors NT52, PT52 and NT56 are coupled together by polycrystalline silicon interconnection line PL5, and are further coupled to contact CT35. One conduction node of MOS transistor PT52 is coupled to contact CT15, and one conduction node of MOS transistor PT50 is connected to contact CT19.

Gates of MOS transistors NT70 and PT36 are commonly coupled to contact CT20 via polycrystalline silicon interconnection line PL6, and gates of MOS transistors NT72 and PT36 are commonly coupled to contact CT14 via polycrystalline silicon interconnection line PL10.

The gate of MOS transistor NT62 is connected to contact CT31. In memory cell formation region MCb also, N-channel MOS transistors NQ1-NQ4 and P-channel MOS transistors PQ1 and PQ2 are arranged in the same layout as that in memory cell region MCa. The gate of MOS transistor NQ3 is connected to contact CT3, and one conduction node of MOS transistor NQ3 is connected to contact CT11. The gates of MOS transistors PQ2 and NQ4 are connected to one conduction node of MOS transistor PQ1 via shared contact ST2, and gates of MOS transistors NQ1 and PQ1 are connected to one conduction node of MOS transistor PQ2 via shared contact ST4. One conduction node of each of MOS transistors PQ2 and NQ4 is connected to corresponding contact CT22 or CT21, and a gate of MOS transistor NQ2 is connected to contact CT32.

By utilizing the two memory cell formation regions for forming the write assist circuit, it is possible to maintain the regularity of the layout of memory cells in memory cell regions MCa and MCb on the opposite sides (the memory cells have the mirror-symmetrical layouts in the column direction). Even with the write assist circuit arranged in the memory array, it is not necessary to redesign the layout for the memory cells in the memory cell array.

Figure 38:
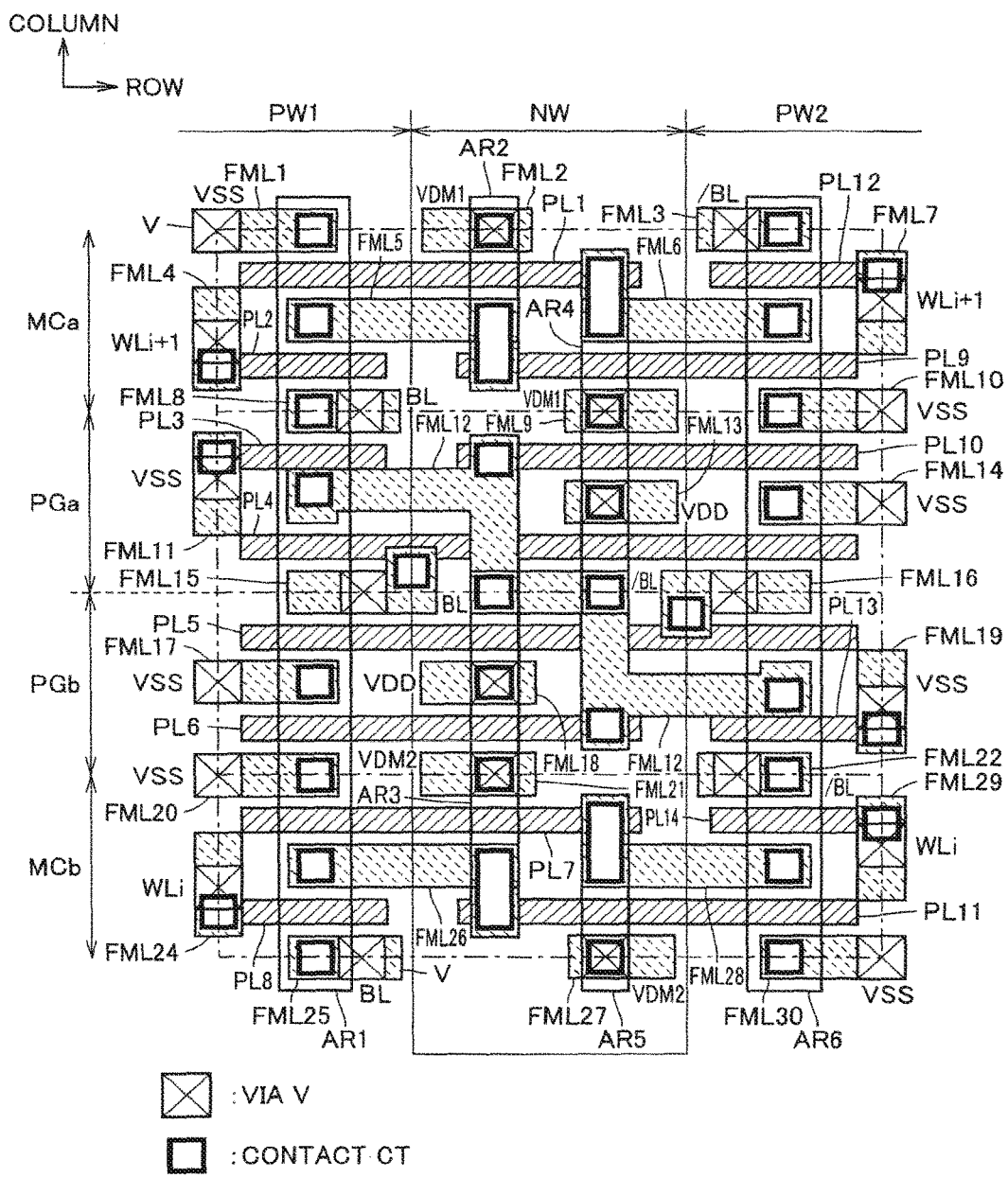
FIG. 38 shows a layout of upper interconnections of the planar layout shown in FIG. 36.

FIG. 38 shows a layout of upper interconnection lines above the interconnection layout shown in FIG. 36, and particularly shows first level metal interconnection lines as well as a layout of first vias formed at the first level metal interconnection lines. FIG. 36 also shows the active regions and polycrystalline silicon interconnection lines together with reference numerals.

In FIG. 38, in memory cell region MCa, there are arranged a first metal interconnection line FML1 connected to active region AR1 via a contact and a second metal interconnection line FML4 connected to polycrystalline silicon interconnection line PL2 via a contact. First metal interconnection line FML4 constitutes a part of word line WLi+1, and first metal interconnection line FML1 constitutes a part of a metal interconnection line for transmitting low-side power supply voltage VSS. A first metal interconnection line FML5 coupling active region AR1 to active region AR2 and to first polycrystalline silicon interconnection line PL9 is arranged between first polycrystalline silicon interconnection lines PL1 and PL2. First metal interconnection line FML5 is coupled to active region AR2 via a shared contact formed below in active region AR2, and is also coupled to first polycrystalline silicon interconnection line PL9.

In a region opposite to first metal interconnection line FML5 with respect to polycrystalline silicon interconnection PL1, there is formed a first metal interconnection line FML2 coupled to active region AR2 via a contact. First metal interconnection line FML2 is finally coupled to divided VDD source line VDM2. In memory cell region MCa, there is arranged a first metal interconnection line FML6 that is coupled to active region AR4 via a shared contact, is connected to first polycrystalline silicon interconnection line PL1 and further is coupled to active region AR6 via a contact. A first metal interconnection line FML3 is arranged in a corresponding region of active region AR6 with respect to first polycrystalline silicon interconnection line PL12. First metal interconnection line FML3 is provided with a first via (V), and is finally coupled to complementary bit line /BL.

A first metal interconnection line FML7 having a rectangular form elongated in the row direction is formed at P-well PW2 of memory cell region MCa. First metal interconnection line FML7 is coupled to first polycrystalline silicon interconnection line PL12 via a contact, and constitutes a part of word line WLi=1.

At a boundary region between memory cell region MCa and write assist circuit formation region PGa, first metal interconnection lines FML8, FML9 and FML10 are arranged corresponding to active regions AR1, AR5 and AR6, respectively, and each having a rectangular form elongated in the row direction. Each of first metal interconnection lines FML8-FML10 is coupled to the corresponding active region via a contact, and is provided at its portion with a first via. First metal interconnection line FML8 is finally coupled to bit line BL, and first metal interconnection line FML9 is finally coupled to divided VDD source line VDM1. First metal interconnection line FML10 constitutes a part of a voltage line transmitting low-side power supply voltage VSS.

In write assist circuit formation region PGa, there is arranged a first metal interconnection line FML11 connected to first polycrystalline silicon interconnection line PL3 via a contact. This first metal interconnection line FML11 has a rectangular form elongated in the row direction, and is finally coupled via a first via to a power supply line transmitting low-side power supply voltage VSS.

Between first polycrystalline silicon interconnection lines PL3 and PL4, there is arranged a first metal interconnection line FML12 that extends linearly in the row direction and has a portion extending in the column direction in N-well NW. First metal interconnection line FML12 is connected to active region AR1, and is connected to first polycrystalline silicon interconnection line PL10 via a contact. First metal interconnection line FML12 further extends, in the region of N-well NW, in the column direction beyond first polycrystalline silicon interconnection line, and extends in the row direction to e connected to active region AR4 via a contact in a boundary region between regions PGa and PGb. First metal interconnection line FML12 is formed into a stepped form with partial interconnection lines extending linearly in the row and column directions, and forms an output node of NAND gate NG1.

In region PGa, a first metal interconnection line FML13 coupled to active region AR4 via a contact is arranged between polycrystalline silicon interconnection lines PL10 and PL4. First metal interconnection line FML13 is coupled to the power supply line transmitting high-side power supply voltage VDD through a first via. In a region of P-well PW2, a first metal interconnection line FML14 is arranged between first polycrystalline silicon interconnection lines PL10 and PL4. First metal interconnection line FML14 is finally coupled to a VS source line transmitting low-side power supply voltage VSS through a first via.

In a boundary region between regions PGa and PGb, there is arranged a first metal interconnection line FML15 that is coupled to polycrystalline silicon interconnection line PL4 via a contact and extends to active region AR1, and further there is arranged a first metal interconnection line FML16 that extends to active region AR6 and is coupled to first polycrystalline silicon interconnection line PL5. These first metal interconnection lines FML15 and FML16 are not provided with a contact in active regions AR1 and AR6, and therefore, are isolated from active regions AR1 and AR6. For maintaining the regularity of the interconnection layout, first metal interconnection lines FML15 and FML16 are arranged extending to positions above active regions AR1 and AR6, respectively.

In region PGb, a first metal interconnection line FML17 connected to active region AR1 via a contact is arranged between polycrystalline silicon interconnection lines PL5 and PL6. This first metal interconnection line FML17 transmits low-side power supply voltage VSS. A first metal interconnection line FML18 connected to active region AR3 via a contact is arranged in N-well NW, and is coupled to a VDD source line transmitting high-side power supply voltage VDD.

First metal interconnection line FML12 extending from the region PGa is coupled via a contact to active region AR4. Thus, first metal interconnection line FML12 further extends continuously in the row and column directions in an L shaped form in region PGb, and is coupled to polycrystalline silicon interconnection line PL6 via a contact. First metal interconnection line FML12 is further coupled via a contact to a region between polycrystalline silicon interconnections PL5 and PL14 of active region AR6 in P-well PW2.

In region PGb, first polycrystalline silicon interconnection line PL13 is coupled via a contact to a first metal interconnection line FML19 of a rectangular form elongated in the row direction. First metal interconnection FML19 is arranged in a boundary region with the memory cells in the adjacent column, and is finally coupled to the VSS source line transmitting low-side power supply voltage VSS.

In a boundary region between regions PGb and MCb, there is arranged a first metal interconnection line FML20 connected to active region AR1 via a contact. First metal interconnection line FML20 transmits low-side power supply voltage VSS to active region AR1 between polycrystalline silicon interconnection lines PL6 and PL7. In N-well NW, there is arranged a first metal interconnection line FML21 connected to active region AR3 via a contact. In a P-well PW2, there is arranged a first metal interconnection line FML22 connected to active region AR6 via a contact. First metal interconnection lines FML20-FML22 are further provided with first vias for connection to interconnection lines in an upper layer. First metal interconnection line FML21 is finally coupled to divided VDD source line VDM2, and first metal interconnection line FML22 is coupled to complementary bit line /BL.

In memory cell region MCb, in the similar layout as memory cell region MCa, there is provided first metal interconnection line FML24 connected to first polycrystalline silicon interconnection line PL8, and a first metal interconnection FML25 connected to active region AR1 via a contact in the region of P-well PW1. Between first polycrystalline silicon interconnection lines PL7 and PL8, there is arranged a first metal interconnection line FML26 coupled to active regions AR1 and AR3. First metal interconnection line FML26 is connected to active region AR1 via a contact, and is coupled to active region AR3 via a shared contact. Therefore, first metal interconnection line FML26 is coupled to first polycrystalline silicon interconnection line PL11.

In memory cell region MCb, there is further arranged a first metal interconnection line FML28 that is coupled to active region AR5 in N-well NW via a shared contact, and is coupled to first polycrystalline silicon interconnection line PL7. First metal interconnection line FML28 extends to P-well PW2, and is coupled to a region between polycrystalline silicon interconnection lines PL14 and PL11 in active region AR6 via a contact.

At an end side of active region AR5, there are arranged a first metal interconnection line FML27 coupled to active region AR5 via a contact as well as a first metal interconnection line FML30 coupled to active region AR6 via a contact. First metal interconnection line FML30 is coupled via a first via to the VSS source line transmitting low-side power supply voltage VSS. First metal interconnection line FML27 is coupled to divided VDD source line VDM2, and first metal interconnection line FML20 is coupled to bit line BL via a first via.

In memory cell region MCb, there is further arranged a first metal interconnection line FML29 that has a rectangular form elongated in the row direction, and is coupled to polycrystalline silicon interconnection line PL14 via a contact. First metal interconnection lines FML24 and FML29 opposing to each other at the boundary regions with adjacent columns each constitute a part of a common word line WLi.

As shown in FIG. 38, the first metal interconnection lines extend, in the layout, merely linearly in the row and column directions, and interconnection lines for connecting internal nodes are laid out at the shortest length, so that the interconnection resistance can be reduced.

Figure 39:
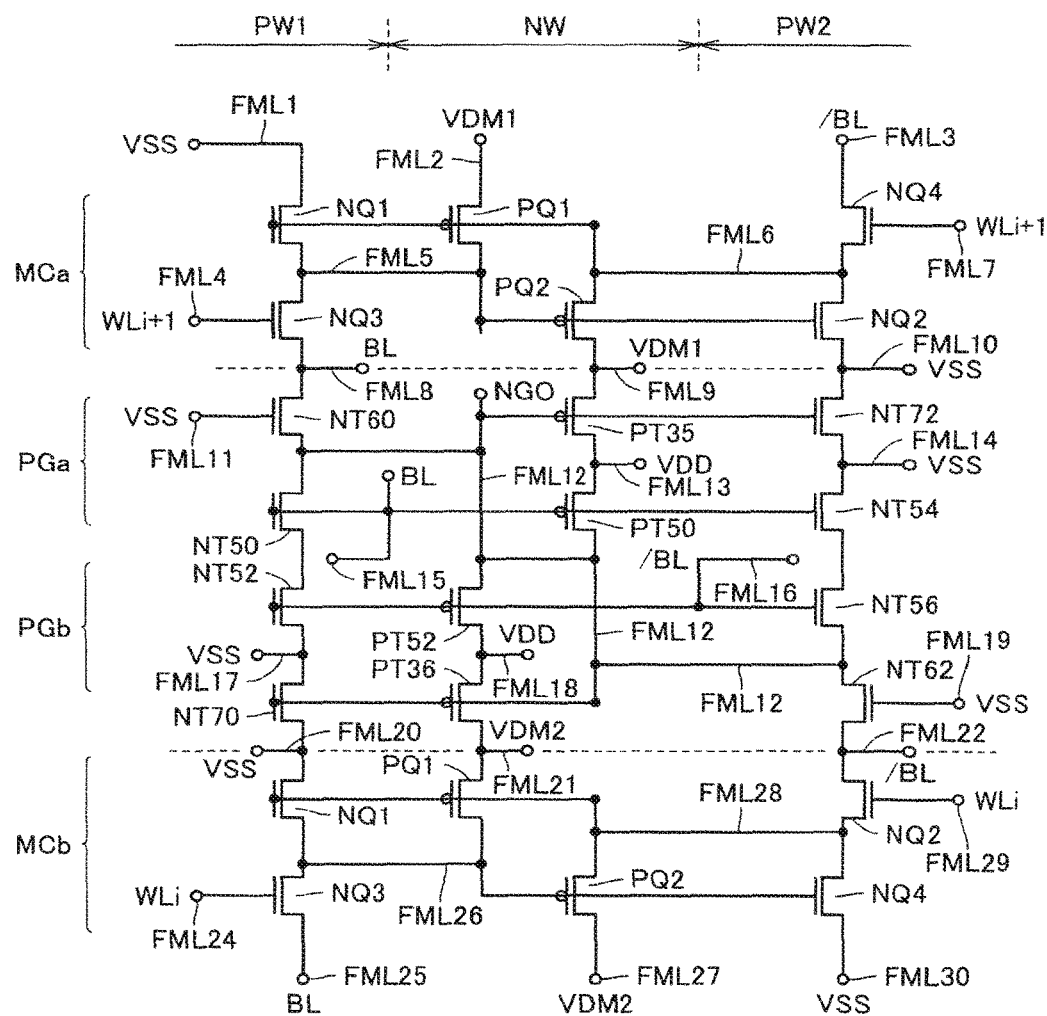
FIG. 39 shows an electrically equivalent circuit of the interconnection layout shown in FIG. 38.

FIG. 39 shows an electrically equivalent circuit of the interconnection layout shown in FIG. 38. In FIG. 39, the connection nodes between MOS transistors NQ1 and NQ3 is connected to gates of MOS transistors PQ2 and NQ2 via first metal interconnection line FML5. One conduction node (source node) of P-channel MOS transistor PQ1 is coupled to divided VDD source line VDM1 via first metal interconnection line FML12. Gates of MOS transistors PQ1 and NQ1 are coupled via first metal interconnection line FML6 to a connection node between MOS transistors NQ4 and NQ2. MOS transistor NQ4 has one conduction node coupled via first metal interconnection line FML3 to a node constituting a part of complementary bit line /BL, and a gate coupled to word line WLi+1 via first metal interconnection line FML7.

A connection node between MOS transistors NQ3 and NT60 is coupled to bit line BL via first metal interconnection line FML8. The connection node between MOS transistors PQ2 and PT35 is coupled to divided VDD source line VDM1 via first metal interconnection line FML9. A connection node of MOS transistors NQ2 and NT72 is coupled via first metal interconnection FML10 to a node supplying low-side power supply voltage VSS.

In region PGa, the gate of MOS transistor NT60 is coupled to low-side power supply voltage VSS via first metal interconnection line FML11 First metal interconnection line FML12 connects the connection node between MOS transistors NT60 and NT50 to gates of MOS transistors PT35 and NT72, and a polycrystalline silicon interconnection line connecting one conduction node of MOS transistor PT52 to gates of MOS transistors NT74 and NT54 is coupled to first metal interconnection line FML15. When the step of making the shown interconnection is completed, an end of first metal interconnection line FML15 is in the floating state. A polycrystalline silicon interconnection line connecting the gates of MOS transistors NT52, PT52 and NT51 is connected to first metal interconnection line FML16. When the current interconnection step is completed, first metal interconnection line FML16 is in the floating step, but will be finally coupled to bit line /BL.

In region PGb, a connection node between MOS transistors NT52 and NT70 is coupled via first metal interconnection line FML17 to a node supplying low-side power supply voltage VSS. A connection node between MOS transistors PT52 and PT36 is coupled via first metal interconnection line FML18 to a node supplying high-side power supply voltage VDD. MOS transistor NT62 has a gate coupled via first metal interconnection line FML19 to a node supplying low-side power supply voltage VSS.

In a boundary region between regions PGb and MCb, a connection node between MOS transistors NT70 and NQ1 is coupled via first metal interconnection FML20 to a node supplying low-side power supply voltage VSS. A connection node between MOS transistors PT36 and PQ1 is coupled to divided VDD source line VDM2 via first metal interconnection line FML21. A connection node between MOS transistors NT62 and NQ2 is coupled to a complementary bit line /BL via first metal interconnection line FML22.

In memory cell region MCb, first metal interconnection line FML28 connects a connection node between MOS transistors NQ2 and NQ4 to gates of MOS transistors PQ1 and NQ1, and first metal interconnection line FML26 connects gates of MOS transistors PQ2 and NQ4 to a connection node between MOS transistors NQ1 and NQ3. One conduction node of MOS transistor NQ3 is coupled to bit line BL via first metal interconnection line FML25. One conduction node of MOS transistor PQ2 is coupled to divided VDD source line VDM2 via first metal interconnection line FML27. One conduction node of MOS transistor NQ4 is coupled to a node supplying low-side power supply voltage VSS via first metal interconnection line FML30. These memory cell regions MCa and MCb have the same interconnection layout except for that the gates of MOS transistors NQ4 and NQ3 in memory cell region MCa are coupled to word line WLi+1, the gates of MOS transistors NQ4 and NQ3 in memory cell region MCb are coupled to word line WNLi and divided VDD source lines VDM1 and VDM2 are coupled to the cell high-side power supply nodes.

Figure 40:
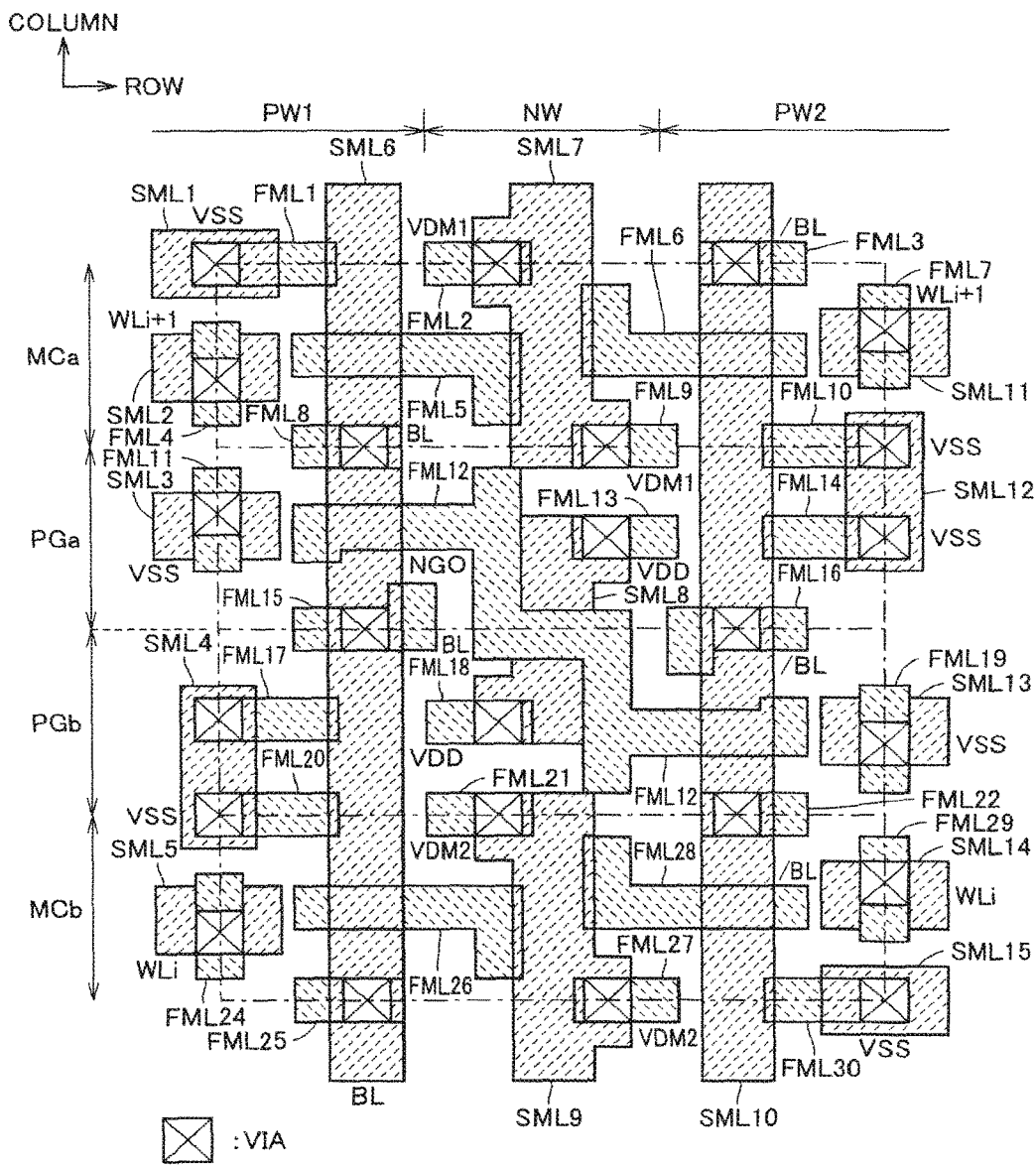
FIG. 40 shows an interconnection layout in a layer upper than the interconnection layout shown in FIG. 38.

FIG. 40 shows a layout of second metal interconnection lines in a layer above the interconnection layout shown in FIG. 38. In FIG. 40, the first metal interconnection lines in the lower layer are allotted with the same reference numerals as those in the interconnection layout shown in FIG. 38, and detailed description thereof is not repeated.

In FIG. 40, a second metal interconnection line SML1 is arranged at P-well region PW1 in memory cell region MCa for first metal interconnection line FML1 with a first via in between. Second metal interconnection line SML1 supplies low-side power supply voltage VSS. Second metal interconnection line SML2 is arranged corresponding to first metal interconnection line FML4, and is coupled to word line WLi+1. At P-well PW2 in region MCa, first metal interconnection line FML7 is coupled via a first via to a second metal interconnection line SML11 constituting a part of word line WLi+1.

At a region of P-well PW1 in region PGa, a second metal interconnection line SML3 is arranged to be coupled to first metal interconnection line FML11 via a first via. Second metal interconnection line SML3 supplies low-side power supply voltage VSS.

At a region of P-well PW2 in region PGa, first metal interconnection lines FML10 and FML14 are inter-coupled via first contacts by a second metal interconnection line SML12. Second metal interconnection line SML12 supplies low-side power supply voltage VSS.

A second metal interconnection line SML8 crosses over first metal interconnection line FML12 extending over regions PGa and PGb. Second metal interconnection line SML8 is coupled to first metal interconnection lines FML13 and FML18 via first vias to provide the nodes each supplying high-side power supply voltage VDD.

In region PGb, first metal interconnection lines FML17 and FML20 are interconnected via first vias by a second metal interconnection line SML4. First metal interconnection line FML19 is coupled to a second metal interconnection line SML13 via a first via. Second metal interconnection line SML13 provides a node supplying low-side power supply voltage VSS.

In memory cell region MCb, first metal interconnection line FML24 is coupled to a second metal interconnection line SML5 via a first via to constitute a part of word line WLi. First metal interconnection line FML30 is coupled to a second metal interconnection line SML15 via a first via to provide a node supplying low-side power supply voltage VSS. First metal interconnection line FML29 at the opposite end is coupled to a second metal interconnection line SML14 via a first via. Second metal interconnection line SML14 constitutes a part of word line WLi.

A second metal interconnection line SML6 is arranged extending continuously in the column direction at a region of P-well PW1. Second metal interconnection line SML6 is connected to each of first metal interconnection lines FML8, FML15 and FML25 via first vias, and forms bit line B.

At N-well NW, a second metal interconnection line SML7 is arranged extending in the column direction in memory cell region MCa, to be coupled to first metal interconnection lines FML12 and FML9 via first vias. In memory cell region MCb, a second metal interconnection line SML9 is arranged extending in the column direction, to be coupled to first metal interconnection lines FML21 and FML27 via first vias. Second metal interconnection line SML9 constitutes a part of divided VDD source line VDM2. Second metal interconnection line SML7 constitutes a part of divided VDD source line VDM1.

At P-well PW2, there is arranged a second metal interconnection line SML10 extending continuously and linearly in the column direction. Second metal interconnection line SML10 is coupled to each of first metal interconnection lines FML3, FML16 and FML22 via first vias to form complementary bit line /BL.

Divided VDD source line VDM1 continuously extends upward in the column direction in FIG. 40, and divided VDD source line VDM2 continuously extends downward in the column direction. Second metal interconnection lines SML6 and SML0 forming respective bit lines BL and /BL are arranged continuously and linearly extending in the column direction, and are coupled to the memory cells aligned in one column. First metal interconnection lines FML15 and FML16 are connected to only the gates of the MOS transistors, and such a layout is avoided that bit lines BL and /BL are coupled to internal nodes of the write assist circuit.

According to the layout of the second metal interconnection lines, the nodes coupled to the same word line or to the same bit line in the electrically equivalent circuit shown in FIG. 31 are mutually connected.

Figure 41:
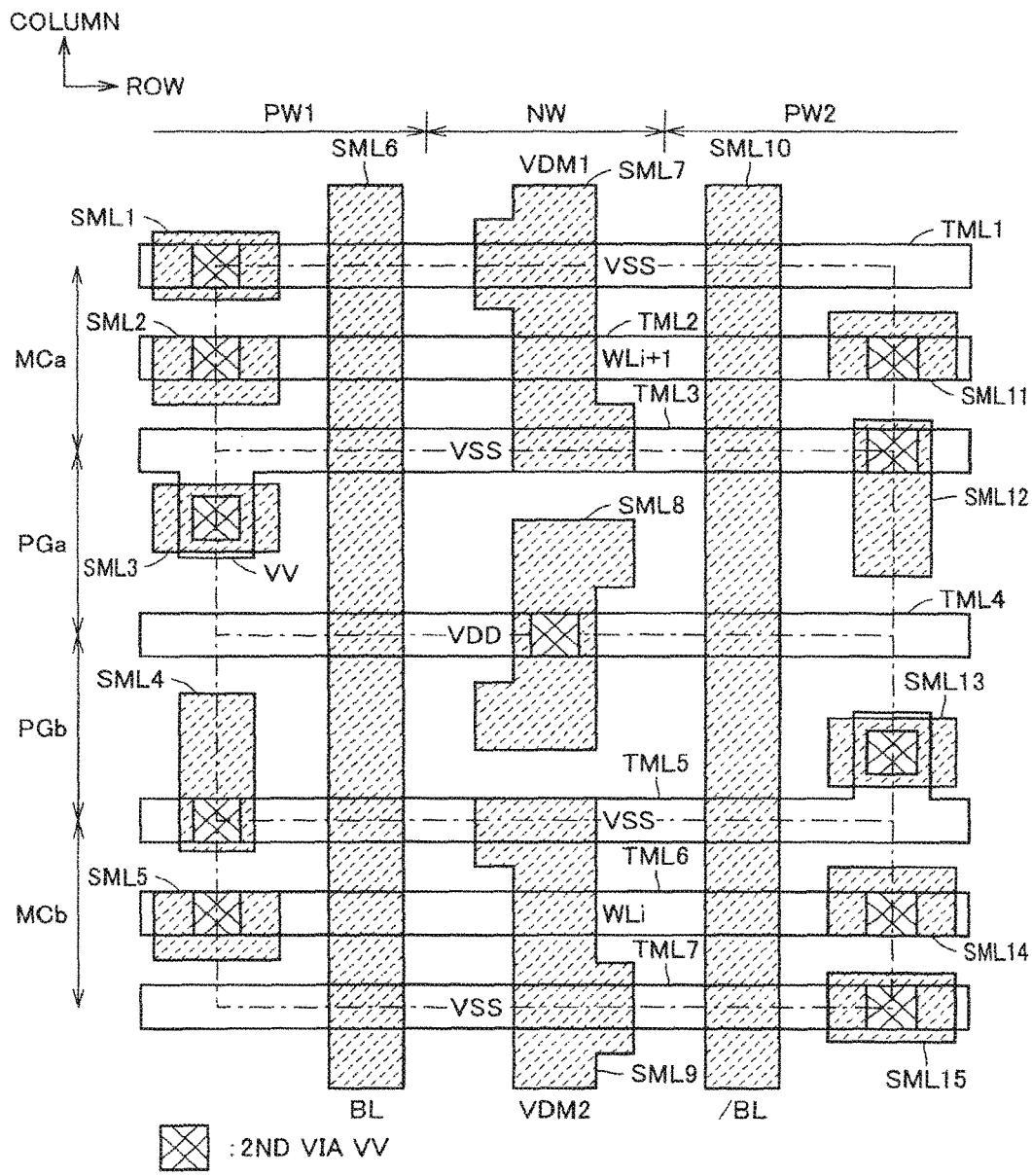
FIG. 41 shows an interconnection layout in a layer upper than the interconnection layout shown in FIG. 40.

FIG. 41 shows a interconnection layout in a layer above the interconnection layout shown in FIG. 40. FIG. 41 also shows the layout of the second metal interconnection lines in a lower layer together with corresponding reference numerals.

In FIG. 41, third metal interconnections TML1-TML7 are arranged being spaced from each other and continuously extending in the row direction. Third metal interconnection line TML1 is coupled to second metal interconnection line SML1 via a second via VV, and supplies low-side power supply voltage VSS. Third metal interconnection line TML2 is coupled to second metal interconnection lines SML2 and SML11 via second contacts, and constitutes word line WLi+1.

Third metal interconnection line TML3 is coupled to second metal interconnection lines SML3 and SML12 via second vias, and transmits low-side power supply voltage VSS.

Third metal interconnection line TML4 is coupled to second metal interconnection line SML8 via a second via, and supplies high-side power supply voltage VDD.

Third metal interconnection line TML5 is coupled to second metal interconnection lines SML13 and SML4 via second vias, and transmits low-side power supply voltage VSS.

Third metal interconnection line TML6 is arranged in memory cell region MCb, and is coupled to second metal interconnection lines SML5 and SML14 via second vias and constitutes word line WLi.

Third metal interconnection line TML7 is coupled to second metal interconnection line SML15 via a second via, and transmits low-side power supply voltage VSS.

As shown in FIG. 41, second metal interconnection lines SML7 and SML6 constituting divided VDD source lines VDM1 and VDM2 are arranged parallel to and between second metal interconnection lines SML6 and SML10 constituting bit lines BL and /BL. Thereby, the voltages of the high-side power supply nodes of the memory cells in each memory cell column can be adjusted according to the voltage levels of bit lines BL and /BL individually and independently of those of the other memory cell columns.

In the interconnection layout shown in FIG. 41, the interconnection lines transmitting low-side power supply voltage VSS are arranged continuously extending in the row direction, and the voltage levels of the VSS source line can be adjusted for the memory cells aligned in one row, i.e., for each memory cell row, individually and independently of the other rows. However, for achieving the construction in which the voltage on VSS source line is adjusted on a column-by-column basis, fourth metal interconnection lines may be used to share the VSS source line between the memory cells aligned in the column direction. Specifically, in the layout of FIG. 41, third metal interconnection lines TML1, TML3, TML5 and TML6 extending in the row direction may be arranged only within the memory cell region, and the fourth metal interconnection lines parallel to the bit lines in the column direction may be arranged as the VSS source lines. Although this construction increases the number of interconnections, it becomes possible to adjust the voltage of the VSS source line in each column individually and independently of the other columns.

Figure 42:
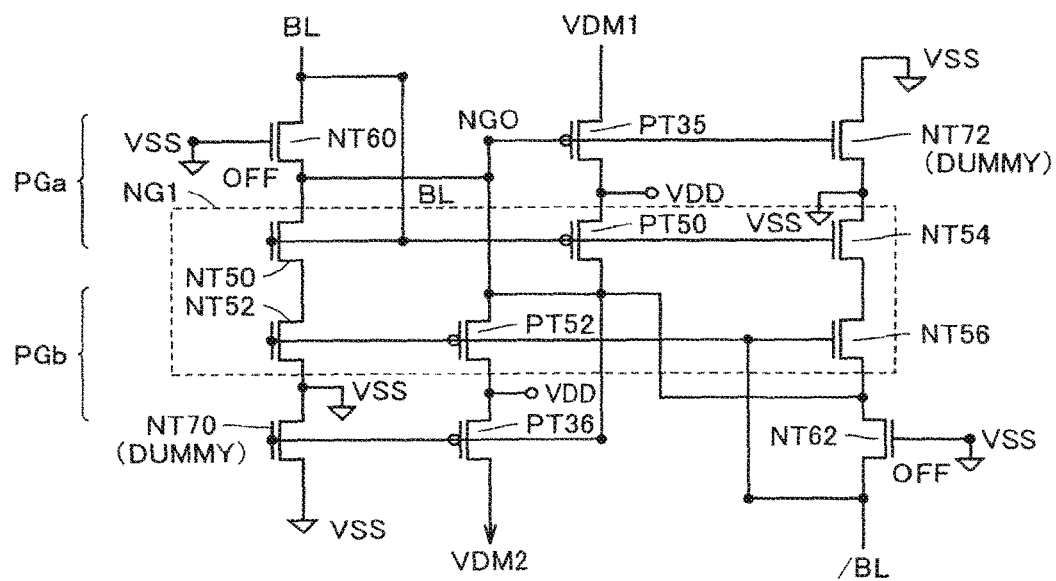
FIG. 42 shows an electrically equivalent circuit of interconnections shown in FIG. 41.

FIG. 42 is an electrically equivalent circuit diagram showing internal connections of write assist circuit PCK formed after completion of the interconnection layout shown in FIG. 41.

In FIG. 42, NAND gate NG1 is formed of MOS transistors NT50, NT52, NT54 and NT56 as well as P-channel MOS transistors PT50 and PT52. MOS transistors NT50 and NT52 are connected in series between output node NGO and the low-side power supply node (voltage VSS node), and have their gates connected to bit lines BL and /BL, respectively. MOS transistors NT54 and NT56 are connected in series between output node NGO) and the low-side power supply voltage, and have their gates connected to bit lines BL and /BL, respectively. P-channel MOS transistor PT50 is connected between the power supply node and output node NDO, and has a gate coupled to bit line BL. P-channel MOS transistor PT52 is connected between the power supply node and output node NGO, and has a gate coupled to complementary bit line /BL.

MOS transistors NT70 and NT72 have their gates connected to output node NGO of NAND gate ND1. MOS transistors NT70 and NT72 do not affect the operation of NAND gate NG1, are arranged for maintaining the repetition regularity of the interconnection pattern in the memory cell array and are utilized as figure dummy transistors.

Each of MOS transistors NT60 and NT62 has a gate coupled to low-side power supply voltage VSS, and is normally maintained in the off state to prevent output node NGO of NAND gate NG1 from being coupled to bit lines BL and /BL. By operating these MOS transistors NT60 and NT62 as isolation transistors, it becomes unnecessary to provide a region for element isolation between the write assist circuit region and the memory cell region. Thus, by arranging the isolation transistors (ND60 and NT) and the figure dummy transistors (NT70 and NT72) that are normally off, the memory cell region is reliably isolated from the write assist circuit, and no problem occurs in circuit operations even in such a construction that the active region of the driver or access transistors of the memory cells and the active regions of the transistors in write assist circuit continuously extend in a concatenate manner.

Thereby, it becomes possible to form the transistors by continuously extending the active regions in the column direction in P-wells PW1 and PW2. In the P-well, therefore, it becomes possible to extend the active region continuously in the column direction in the P-well, the layout of the active region becomes simple to facilitate the pattern formation, and it becomes easy to accommodate for the miniaturization. Thus, in the well region used for forming the memory cell, the write assist circuit can be formed with up to the same pitch as the pitch in the row direction of the memory cells without affecting the layout of the memory cells. In addition, by utilizing the two memory cell formation regions in the column direction, the write assist circuit can be arranged without affecting the mirror-symmetrical arrangement of the memory cells. The length in the column direction of the construction forming write assist circuit PCK is twice as long as the cell pitch at the maximum, and may be shorter than the cell pitch (it is merely required to allow the layout of the memory cell transistors to use for the write assist circuit).

[Second Modification]

Figure 43:
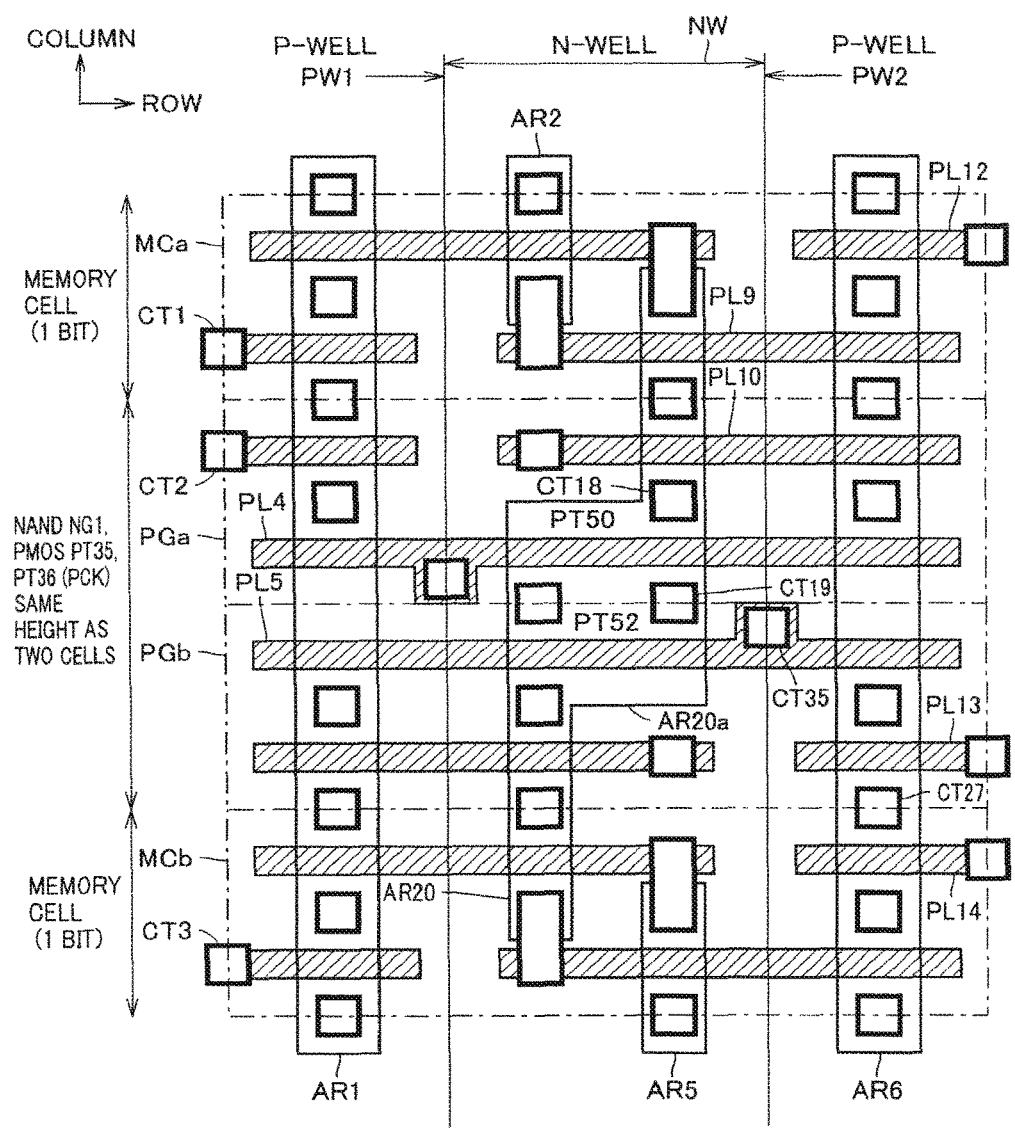
FIG. 43 schematically shows a planar layout of a write assist circuit of a second modification of the thirteenth embodiment of the invention.

FIG. 43 shows a construction of a modification of the thirteenth embodiment of the invention. FIG. 43 shows an interconnection layout formed after forming the polycrystalline silicon interconnection lines and contacts. The interconnection layout shown in FIG. 43 differs from the interconnection layout shown in FIG. 36 in the following points. In N-well NW, an active region AR20 is continuously formed at central portion of regions PGa and PGb. Thus, active regions AR3 and AR4 shown in FIG. 36 are integrally formed such that impurity regions (active regions) extend continuously to be concatenated to form active region AR20. Specifically, in N-well NW, active region AR20 extends continuously in the row direction, and is formed within a region AR20a crossing polycrystalline silicon interconnection lines PL4 and PL5. Therefore, active region AR20 has a region aligned with active region AR2 in the column direction, a region aligned with active region AR5 in the column direction, and a central region AR20a having a width of two columns. The MOS transistor channel width (gate width) formed in this central region AR20a can be increased twice or more. The interconnection layout of active regions AR1, AR2, AR5 and AR6 of the interconnection layout shown in FIG. 43 is the same as the interconnection layout shown in FIG. 36, and the layout of connectors is also the same. Corresponding portions are allotted with the same reference numbers, and description thereof is not repeated.

According to the interconnection layout shown in FIG. 43, MOS transistors PT50 and PT52 of the NAND gate are located in central region AR20a of active region AR20, and are formed in regions PGa and PGb, respectively. In this case, the channel width (gate width W) of each of MOS transistors PT50 and PT52 is increased, e.g., twice as compared with the interconnection layout shown in FIG. 36, and the NAND gate is formed into a ratioless circuit. In this case, a channel length L does not change, and the current driving capabilities of P-channel MOS transistors PT50 and PT52 increase (because W/L increases), so that the input logical threshold of NAND gate NG1 increases. Accordingly, the P-channel MOS transistors are turned on to output the signal at the L level when the potential levels of bit lines BL or /BL are higher than intermediate voltage VDD/2. Thus, divided VDD source lines VDM1 and VDM2 can be set more quickly to the floating state or the desired voltage level (upon switching of the voltage), and the write speed can be increased.

The same interconnection layout as shown in FIGS. 38, 40 and 41 can be used for in the upper layer interconnection layout.

According to the thirteenth embodiment of the invention, as described above, the write assist circuit is arranged in the memory cell array, and adjusts the voltage level of the divided VDD source line arranged corresponding to each memory cell group according to the corresponding bit line potential so that the fast and stable writing can be achieved.

This write assist circuit uses the same transistor arrangement as the transistor arrangement in the memory cell, and also utilizes the same gate interconnection lines as those of the memory cell transistors. Therefore, the write assist circuit can be arranged in the memory cell array while preventing complication of the interconnection layout and manufacturing steps and in addition, preventing influence on the layout of the memory cells.

In this thirteenth embodiment, combinations of the constructions in various previously described embodiments can be utilized for the construction for controlling the voltages on the divided VDD source lines.

The write assist circuit is arranged in the central portion of the memory cell array, i.e., in the central position of the each bit line pair. However, the write assist circuit may be arranged at each end of the bit line pair, and may be arranged corresponding to each divided VDD source line. In this case, the interconnection layout of the memory cells can be utilized to provide the write assist circuit with the layout similar to that of the write assist circuit already described in connection with the thirteenth embodiment.

The write assist circuit may be arranged as a bit line peripheral circuit in view of an arrangement relationship to the bit line load circuit (9) in the order of the write assist circuit, bit line load circuit and the memory cells for each column. The arrangement order of these bit line peripheral circuits are determined to be optimum depending on the circuit construction of the write assist circuit, layout of the interconnection of bit lines and the interconnection of VDD source lines VDM, and interconnection layers. The bit line peripheral circuits (write assist circuits and bit line load circuits) may be arranged in a central portion of a bit line, may be arranged on the opposite ends of the bit line or may be arranged only on one end of the bit line. The bit line load circuit may be arranged only on one end of the bit line pair, and the write assist circuit(s) may be arranged on the opposite ends, central portion or one end of the bit line pair. In this case, the bit line load circuit and the write assist circuit neighboring to each other may be arranged in any of the foregoing arrangement orders.

Fourteenth Embodiment

Figure 44:
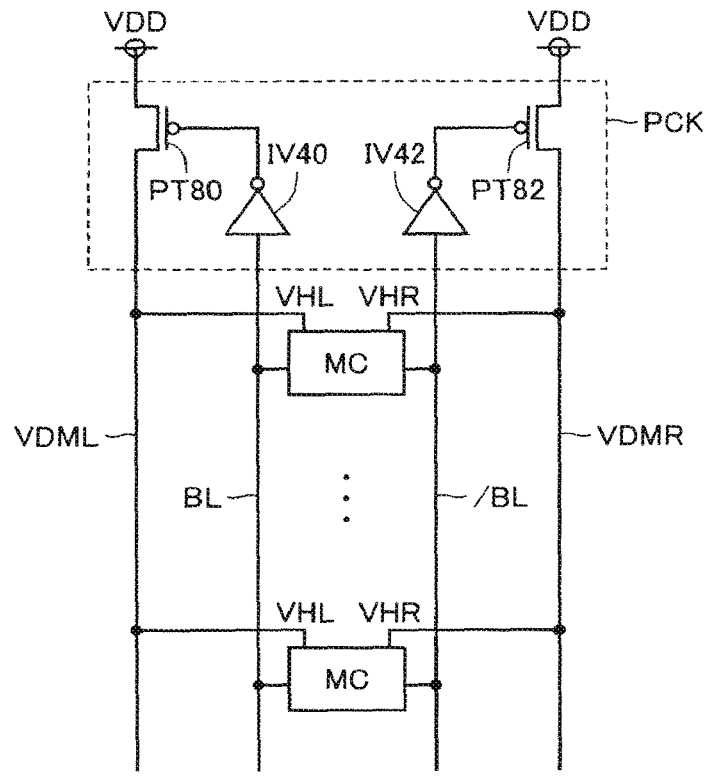
FIG. 44 schematically shows a construction of a main portion of a semiconductor memory device according to a fourteenth embodiment of the invention.

FIG. 44 schematically shows a construction of a memory cell circuit according to a fourteenth embodiment of the invention. FIG. 44 shows a construction of the write assist circuit related to memory cells MC arranged in one column. In FIG. 414, write assist circuit PCK drives VDD source lines VDML and VDMR arranged corresponding to bit lines BL and /BL, respectively. Write assist circuit PCK includes an inverter IV40 receiving the voltage of bit line BL, a P-channel MOS transistor PT80 that is selectively turned on to supply high-side power supply voltage VDD to left VDD source line VDML according to the output signal of inverter IV40, an inverter IV42 receiving the voltage on bit line /BL, a P-channel MOS transistor PT82 that is selectively turned on to supply high-side power supply voltage VDD to right VDD source line VDMR according to the output signal of inverter IV42.

VDD source lines VDML and VDMR are coupled to high-side power supply nodes VHL and VHR of memory cells MC, respectively. VDD source lines VDML and VDMR may have divided VDD source line structure, in which the source line is divided in the column direction corresponding to memory cell groups.

Figure 45:
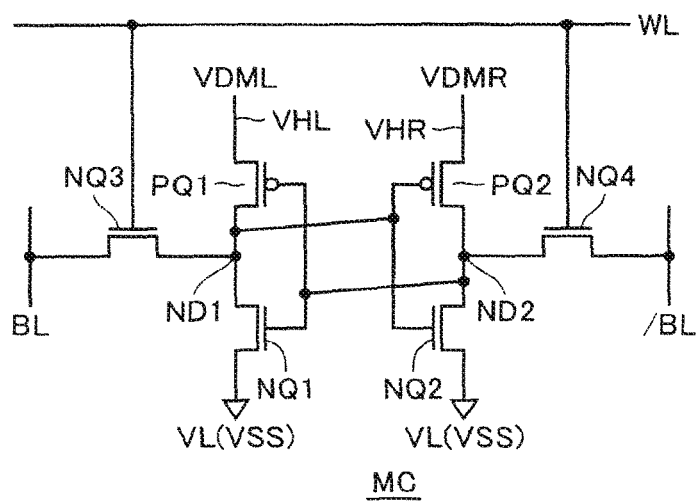
FIG. 45 shows internal interconnection connections of a memory cell shown in FIG. 44.

FIG. 45 schematically shows internal connections of the memory cell in FIG. 44. In memory cell MC, as shown in FIG. 45, high-side power supply nodes VHL and VHR of load transistors PQ1 and PQ2 are coupled to VDD source lines VDML and VDMR, and are individually driven according to the voltages on bit lines BL and /BL, respectively.

Figure 46:
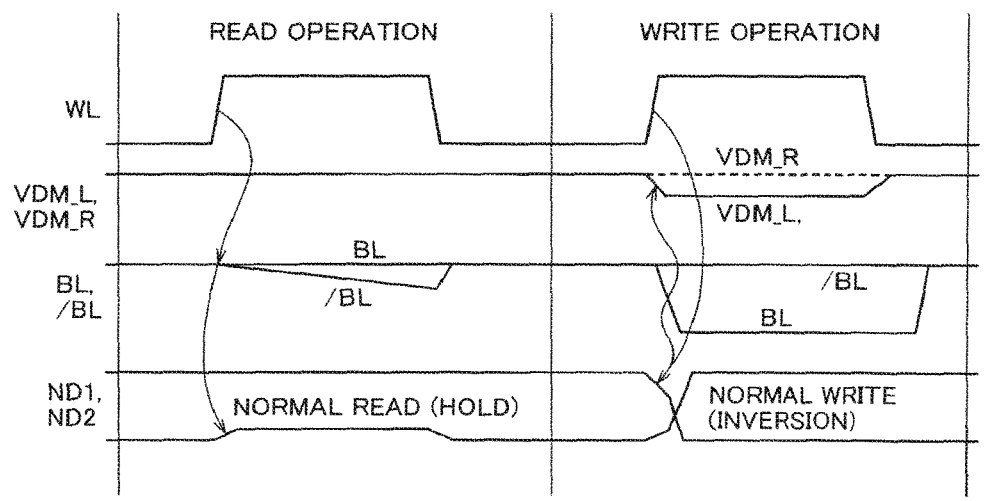
FIG. 46 is a signal waveform diagram representing an operation of the memory cell circuit shown in FIG. 44.

FIG. 46 is a signal waveform diagram representing an operation of the write assist circuit shown in FIG. 44. Referring to FIG. 46, description will now be given of operations of the memory cell circuit shown in FIGS. 44 and 45.

In the read operation, the voltage levels of bit lines BL and /BL change according to the storage data on storage nodes ND1 and ND2 shown in FIG. 45, respectively. In this case, the potential amplitudes of bit lines BL and /BL are small (FIG. 46 shows the case where the potential levels of bit line /BL lowers), and inverters IV40 and IV42 maintain their output signals at the L level because the potentials of bit lines BL and /BL are higher than the input logical thresholds thereof. MOS transistors PT80 and PT82 maintain the on state similarly in the standby state, and VDD source lines VDML and VDMR are maintained at the level of high-side power supply voltage VDD. Therefore, even when the bit line column current raises the voltage level of storage node ND1 or ND2 in the data read operation, the data holding characteristics do not deteriorate, and the data can be stably held.

In the data write operation, the potentials of bit lines BL and /BL change according to the write data. It is now assumed that storage nodes ND1 and ND2 hold the data at H and L levels, respectively, and the data at the opposite logical levels, i.e., L and H levels are to be written onto bit lines BL and /BL, respectively. In this case, when the potential of bit line BL lowers, the output signal of inverter IV40 attains the H level, and responsively, MOS transistor PT80 is turned off, and left VDD source line VDML attains the floating state. Other bit line /BL is at the H level, and the output signal of inverter IV is at the L level. MOS transistor PT82 maintains the on state, and the right VDD source line VDMR is maintained at the level of high-side power supply voltage VDD.

When word line WL is selected, and storage nodes ND1 and ND2 are coupled to bit lines BL and /BL, respectively, the potential levels of storage nodes ND and ND2 change. In this case, the voltage level of left VDD source line VDML in the floating state lowers through discharging of accumulated charges. Therefore, the current driving power of MOS transistor PQ1 becomes smaller than current driving power of MOS transistor PQ2, resulting in imbalance in latching capability between the inverter latches in the memory cell, and the write margin increases. Therefore, bit line /BL receiving the write data at the H level raises the voltage level of storage node ND2 to the H level rapidly. Discharging through MOS transistor NQ1 made conductive by the rising of the voltage level of storage node ND2, the voltage level of storage node ND1 rapidly lowers to the level of low-side power supply voltage VSS. Accordingly, the storage nodes of memory cell MC can be inverted according to the write data, and the accurate data writing can be performed fast.

VDD source lines VDML and VDMR are arranged corresponding to bit lines BL and /BL, and the states (impedance states) of VDD source lines VDML and VDMR are controlled according to the potentials of corresponding bit lines BL and /BL, respectively, so that the latching capabilities of the inverter latches in the memory cell can be set to the imbalance state according to the write data, the write margin can be increased and fast data writing can be performed.

The VDD source line is arranged for each load transistor in the memory cell, and the capacitance of the VDD source line can be smaller than that in the case where a common VDD source line is used for controlling both the power supply nodes of these load transistors. Therefore, the voltage change can occur more rapidly.

For the write assist circuit for the construction of arranging individual source lines for bit lines BL and /BL, respectively, the clamp element or voltage converter means may be employed as is the second to twelfth embodiments already described.

Fifteenth Embodiment

Figure 47:
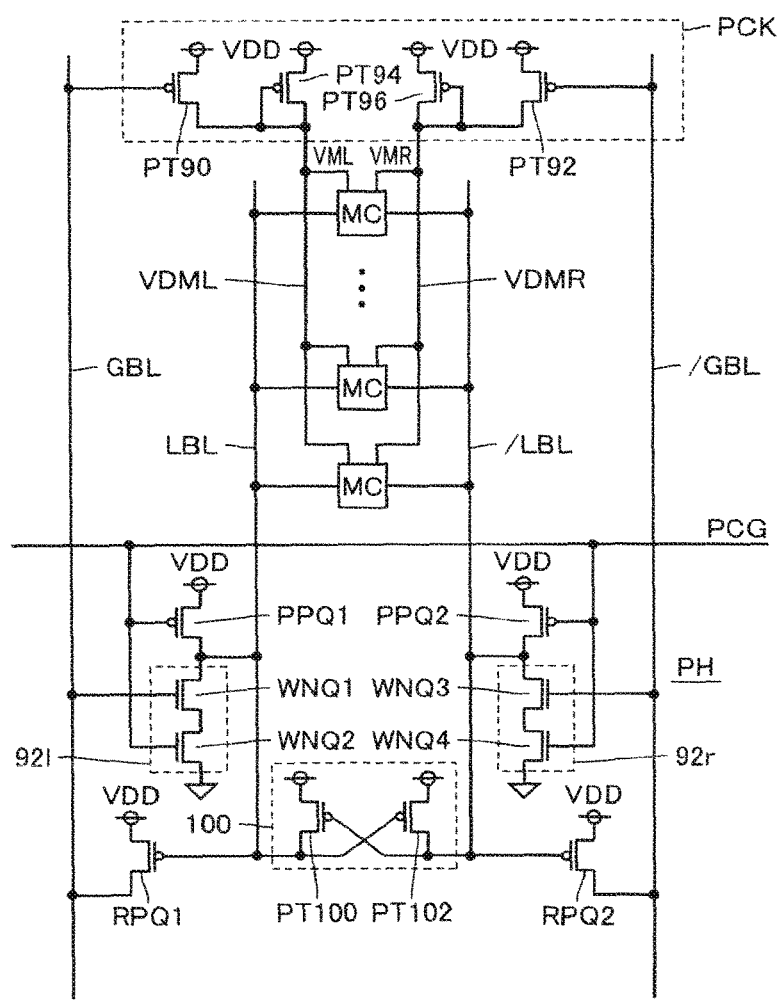
FIG. 47 schematically shows a construction of a main portion of a semiconductor memory device according to a fifteenth embodiment of the invention.

FIG. 47 schematically shows a construction of a main portion of a semiconductor device according to a fifteenth embodiment of the invention. The bit lines have a hierarchical structure including global bit lines GBL and /GBL as well as local bit lines LBL and /LBL. FIG. 47 representatively shows a construction of a portion related to one local bit line pair LBL and /LBL. A plurality of local bit line pairs extending in the column direction are arranged for global bit lines GBL and /GBL.

VDD source lines VDML and VDMR are arranged corresponding to local bit lines LBL and /LBL, respectively. These VDD source lines VDML and VDMR are coupled to high-side power supply nodes VHL and VHR of memory cells MC in the corresponding column. The connection of memory cell MC is the same as the connection of memory cell MC shown in FIG. 45.

Write assist circuit PCK is arranged corresponding to local bit lines LBL and /LBL, and the impedances of these VDD source lines VDML and VDMR are individually adjusted according to the voltages on global bit lines GBL and /GBL, respectively.

Write assist circuit PCK includes a P-channel MOS transistor PT90 transmitting high-side power supply voltage VDD to left VDD source line VDML according to the voltage on a global bit line GBL, a P-channel MOS transistor PT92 transmitting high-side power supply voltage VDD to right VDD source line VDMR according to the voltage on global bit line /GBL, and P-channel MOS transistors PT94 and PT96 clamping the lower limits of the voltage levels of VDD source lines VDML and VDMR at the voltage level of (VDD−Vthp), respectively. Vthp represents an absolute value of the threshold voltage of MOS transistors PT94 and PT96. MOS transistors PT94 and PT96 are diode-connected, and operate in a diode mode.

For performing write/read of data on local bit lines LBL and /LBL, a local bit line write/read circuit is employed as a peripheral circuit PH. The local bit line write/read circuit includes P-channel MOS transistors PPQ1 and PPQ2 transmitting high-side power supply voltage VDD onto local bit lines LBL and /LBL according to a precharge instruction signal PCG, write N-channel MOS transistors WNQ1 and WNQ3 (N-channel MOS transistors for writing) having gates connected to global bit lines GBL and /GBL, respectively, and writing N-channel MOS transistors WNQ2 and WNQ3 selectively made conductive according to precharge instruction signal PCG, to connect MOS transistors WNQ1 and WNQ3 to the low-side power supply node (VSS), respectively.

MOS transistors WNQ1 and WNQ2 form a write circuit 92l that writes data onto local bit line LBL according to the voltage on global bit line GBL, and MOS transistors WNQ3 and WNQ4 form a write circuit 92r that writes data onto local bit line /LBL according to the potential on global bit line /GBL.

The data read section includes a P-channel MOS transistor RPQ1 that transmits high-side power supply voltage VDD onto global bit line GBL according to the potential of local bit line LBL, a P-channel MOS transistor RPQ2 that is selectively turned on according to the potential of local bit line /LBL, to transmit high-side power supply voltage VDD onto global bit line /GBL, and a potential holding circuit 100 for holding the voltage level of local bit lines LBL and /LBL.

Potential holding circuit 100 includes P-channel MOS transistors PT100 and PT102 having gates and drains cross-coupled, and maintains the voltage on the local bit line of a higher potential between local bit lines LBL and /LBL at the level of high-side power supply voltage VDD.

With the construction of the semiconductor device shown in FIG. 47, in the standby state, precharge instruction signal PCG is at the L level, and MOS transistors PPQ1 and PPQ2 maintain local bit lines LBL and /LBL at the H level, respectively. Global bit lines GBL and /GBL are at the L level, MOS transistors PT92 and PT90 in write assist circuit PCK are in the on state, and VDD source lines VDML and VDMR are maintained at the level of high-side power supply voltage VDD.

In the data read operation, when the memory cell connected to local bit lines LBL and /LBL is selected (the word line is selected), precharge instruction signal PCG attains the H level, and precharging MOS transistors PPQ1 and PPQ2 are turned off to stop the precharging of local bit lines LBL and /LBL. Subsequently, voltage changes depending on the storage data of the selected memory cell appear on local bit lines LBL and /LBL in accordance with the selection of the word line. Potential holding circuit 100 maintains the local bit line at the higher potential between local bit lines LBL and /LBL at the level of high-side power supply voltage VDD. Therefore, the discharging via the selected memory cell gradually lowers the local bit line potential of the lower potential bit line.

According to the lowering of the voltage level of the local bit line, one of P-channel MOS transistors RPQ1 and RPQ2 for reading is turned on to raise the voltage level of global bit line GBL or /GBL. For the sake of simplicity, it is assumed that the voltage level of global bit line GBL, rises. Global bit line /GBL maintains the precharged L level because MOS transistor RPQ2 maintains the off state. When the voltage level of global bit line GBL rises in the above state, MOS transistor WNQ1 for writing in a write circuit 92l is turned on to drive the voltage level of local bit line LBL toward the low-side power supply voltage, and responsively, MOS transistor RPQ1 for reading is quickly turned on to raise rapidly the potential level of global bit line GBL.

In write circuit 92r, global bit line /GBL is at the L level, MOS transistor WNQ3 is off and local bit line /LBL maintains the H level. When the voltage level of global bit line GBL rises in the data read operation, the voltage rising width of global bit line GBL is small (voltage level higher than the threshold voltage of MOS transistor WNQ1). More specifically, global bit line GBL has a large interconnection capacitance, and the voltage level thereof neither swings fully to the level of voltage VDD nor rises to the level of voltage of (VDD−Vthp). Therefore, MOS transistor PT90 maintains the on state, both VDD source lines VDML and VDMR maintain the level of high-side power supply voltage so that the data can be read stably and fast without destroying the data.

In the data write operation, global bit lines GBL and /GBL are precharged to the L level before the writing, and write assist circuit PCK precharges VDD source lines VDML and VDMR to the level of high-side power supply voltage VDD. Precharge instruction signal PCG instructs the precharging of local bit lines LBL and /LBL to the H level.

In the data write operation, global bit lines GBL and /GBL fully swing to the H and L levels according to the write data, respectively. Thus, in write assist circuit PCK, MOS transistor PT90 or PT92 corresponding to the global bit line receiving the H level data is turned off. It is now assumed that global bit line GBL receives the H level data. In this case, local bit line LBL is discharged to the low-side power supply voltage level via MOS transistors WNQ1 and WNQ2. MOS transistor WNQ3 in write circuit 92r is off, and maintains local bit line /LBL at the H level.

In write assist circuit PCK, MOS transistor PT90 is turned off, and VDD source line VDML enters the floating state. When the reverse data (data at the logical level reverse to that of the held data) is to be written into selected memory cell MC, the through current of each inverter in the memory cell lowers the voltage level of left VDD source line VDML. In this state, potential holding circuit 100 maintains local bit line /LBL at the level of high-side power supply voltage VDD, and drives local bit line LBL to the L level. In this case, the latching capability of the inverter latch in the memory cell lowers according to the lowering of the voltage level of VDD source line VDML, and accordingly, the write margin increases, so that the data writing into the selected memory cell can be performed fast. In this data write operation, the load transistor connected to high-side power supply node VHR is quickly turned on according to the L level data supplied from local bit line LBL, to drive the corresponding storage node to the H level, to turn off the other load transistor. Consequently, each storage node is rapidly driven to the voltage level corresponding to the write data.

Therefore, even when the VDD source line arranged corresponding to the local bit line receiving the L level data enters the floating state, the latching capabilities of inverter latches in memory cell MC are made imbalanced, and the current driving capability on the side of the inverter driving the H level is increased, so that fast writing can be achieved.

MOS transistors PT94 and PT96 suppresses such a state that when the data writing takes a long time, the voltage levels of VDD source lines VDML and VDMR lower excessively to lower the data holding characteristics of the memory cells on the selected column and the unselected rows. However, when the writing is performed fast in a short time, and the voltage level drop of VDD source lines VDML and VDMR does not adversely affect the data held in the memory cells on the selected column and the unselected rows, it is not particularly necessary to employ MOS transistors PT94 and PT96 for clamping.

Instead of transistors PT94 and PT96 for clamping, the construction of switching the power supply voltages or the construction of one-shot pulse driving as described in the foregoing embodiments may be employed.

Figure 48:
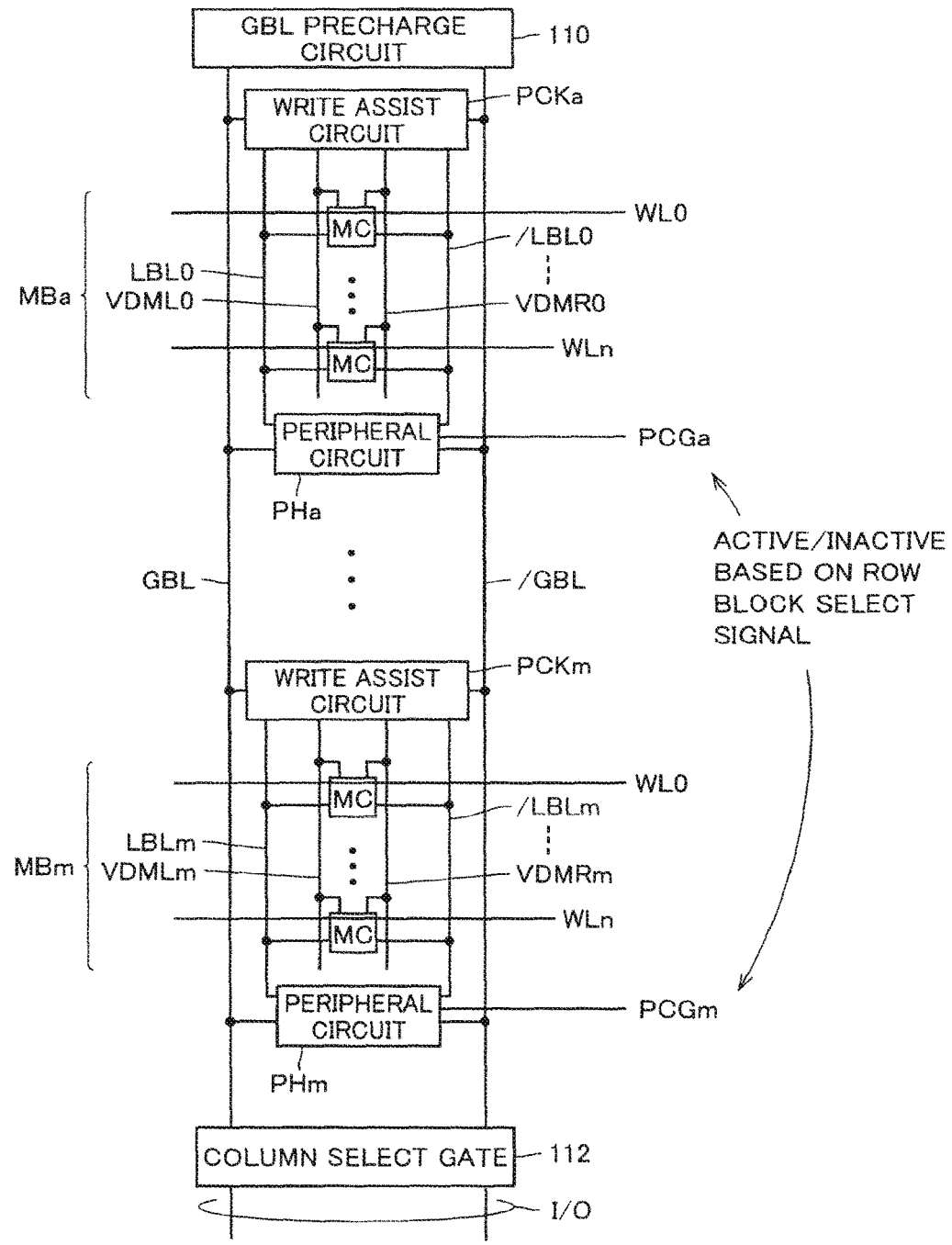
FIG. 48 schematically shows a construction of a portion related to one global bit line in the semiconductor memory device according to the fifteenth embodiment of the invention.

FIG. 48 schematically shows a portion of the semiconductor memory device according to the fifteenth embodiment of the invention, and specifically shows a construction related to the global bit line pair. Memory cells in a plurality of row blocks MBa-MBm are arranged for global bit lines GBL and /GBL. Word lines WL0-WLn are arranged in each of row blocks MBa-MBm. For example, each of row blocks MBa-MBm includes the memory cells in 16 rows or 32 rows. The load on the local bit lines is reduced, and in addition, the memory cells are not connected to the global bit line so that the load on the global bit lines is reduced and the writing/reading of data can be performed fast.

Local bit line pairs LBL0 and /LBL0-LBLm and /LBLm are arranged corresponding to row blocks MBa-MBm, respectively. VDD source line pairs VDML0 and VDMR0-VDMLm and VDMRm are arranged corresponding to local bit line pairs LBL0 and /LBL0-LBLm and /LBLm, respectively.

Write assist circuits PCKa-PCKm are arranged corresponding to row blocks MBa-MBmn, respectively. These row blocks MBa-MBm control the voltage levels (impedances) of corresponding VDD source lines LBL0 and /LBL0-LBLm and /LBLm according to the potential levels of global bit lines GBL and /GBL.

Peripheral circuits PHa-PHm that perform the writing/reading of internal data between the global bit lines and the corresponding local bit lines are arranged corresponding to row blocks MBa-MBm, respectively. Each of these peripheral circuits PHa-PHm has substantially the same construction as peripheral circuit PH shown in FIG. 47, and performs the writing/reading of internal data.

Peripheral circuits PHa-PHm are supplied with precharge instruction signals PCGa-PCGm, respectively. Activation and deactivation of precharge instruction signals PCGa-PCGm are controlled based on the row block selection signal specifying the row block including a selected row. The precharge instruction signal maintains the inactive state for the unselected row blocks, and the corresponding local bit lines maintain the precharged state. Therefore, even when each of write assist circuits PCKa-PCKm sets VDD source lines VDML and VDMR in the corresponding block to the floating state according to the change in voltage level of global bit lines GBL and /GBL, the corresponding word line is unselected, and the path of current flow in memory cell MC is cut off. In the memory cell on an unselected row and the selected column, the data is stably held. The unselected memory cells in one selected row block hold the data as in the foregoing embodiments. Thus, in the write assist circuit for the selected row and an unselected column, both global bit lines GBL and /GBL are at the L level, and VDD source lines VDML and VDMR are maintained at the level of high-side power supply voltage VDD.

According to the fifteenth embodiment of the invention, as described above, in the bit line hierarchical structure including the global and local bit lines, the high-side power supply line of the memory cell are formed into the divided structure according to the local bit lines, and the write assist circuit is arranged for each divided VDD source line. In addition, the high-side power supply nodes of the memory cells are individually driven. Accordingly, the loads on VDD source lines VDML and VDMR are reduced, and the potentials of VDD source lines VDML and VDMR can rapidly change in the data write operation, so that the fast writing can be achieved. The VDD source line potential changes according to the global bit line potential, and therefore the voltage level of the VDD source line can change at a faster timing, so that the fast writing can be achieved. The timing of power supply line control is set according to the voltage on the global bit line, and the operation control is performed according to so-called self-timing, which simplifies the timing control.

Sixteenth Embodiment

Figure 49:
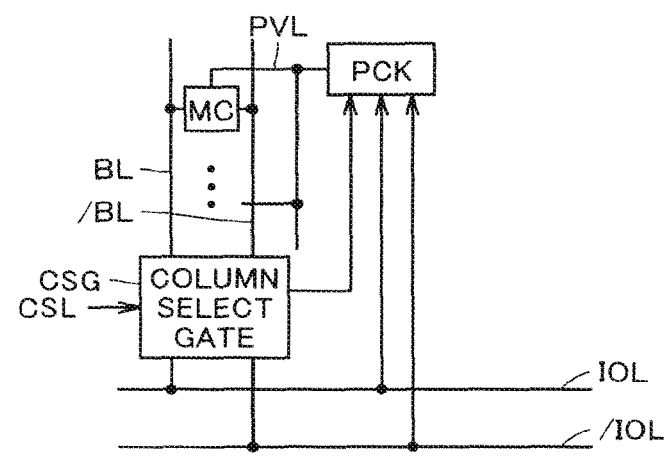
FIG. 49 schematically shows a construction of a main portion of a semiconductor memory device according to a sixteenth embodiment of the invention.

FIG. 49 schematically shows a construction of a main portion of a semiconductor memory device according to a sixteenth embodiment of the invention. FIG. 49 schematically shows a construction related to memory cells MC arranged for bit lines BL and /BL. Cell power supply line PVL is arranged in each column for bit line pair BL and /BL, and is isolated from those in the other columns. Write assist circuit PCK is arranged for cell power supply line PVL (the VDD source line, VSS source line or well). Write assist circuit PCK controls the voltage level (impedance) of cell power supply line PVL on the selected column according to the potentials of internal data lines IOL and /IOL as well as column select signal CSL.

Bit lines BL and /BL are coupled to internal data lines IOL and /IOL through column select gate CSG, respectively. In the write operation, the voltage level of internal data lines IOL and /IOL change at a faster timing than on bit lines BL and /BL. Therefore, by adjusting the voltage level (impedance) of cell power supply line PVL for the selected column according to column select signal CSL, the write margin of the memory cell can be increased at a fast timing in the write operation, and accordingly, the fast writing can be achieved.

The data read operation is substantially the same as those of the embodiments already described.

In the construction shown in FIG. 49, however, it is required to use column select signal CSL, and a portion for generating column select signal CSL is required to have a large driving power, so that the layout area and power consumption slightly increase. However, the voltage impedance control of the cell power supply line is performed according to the self-timing scheme, and the construction of the control circuit is made simple to suppress significant increase in layout area and power consumption.

According to the sixteenth embodiment of the invention, as described above, the voltage level of the cell power supply line is adjusted on a column-by-column basis according to the voltage on the internal data line, and the data writing can be performed fast.

Seventeenth Embodiment

Figure 50:
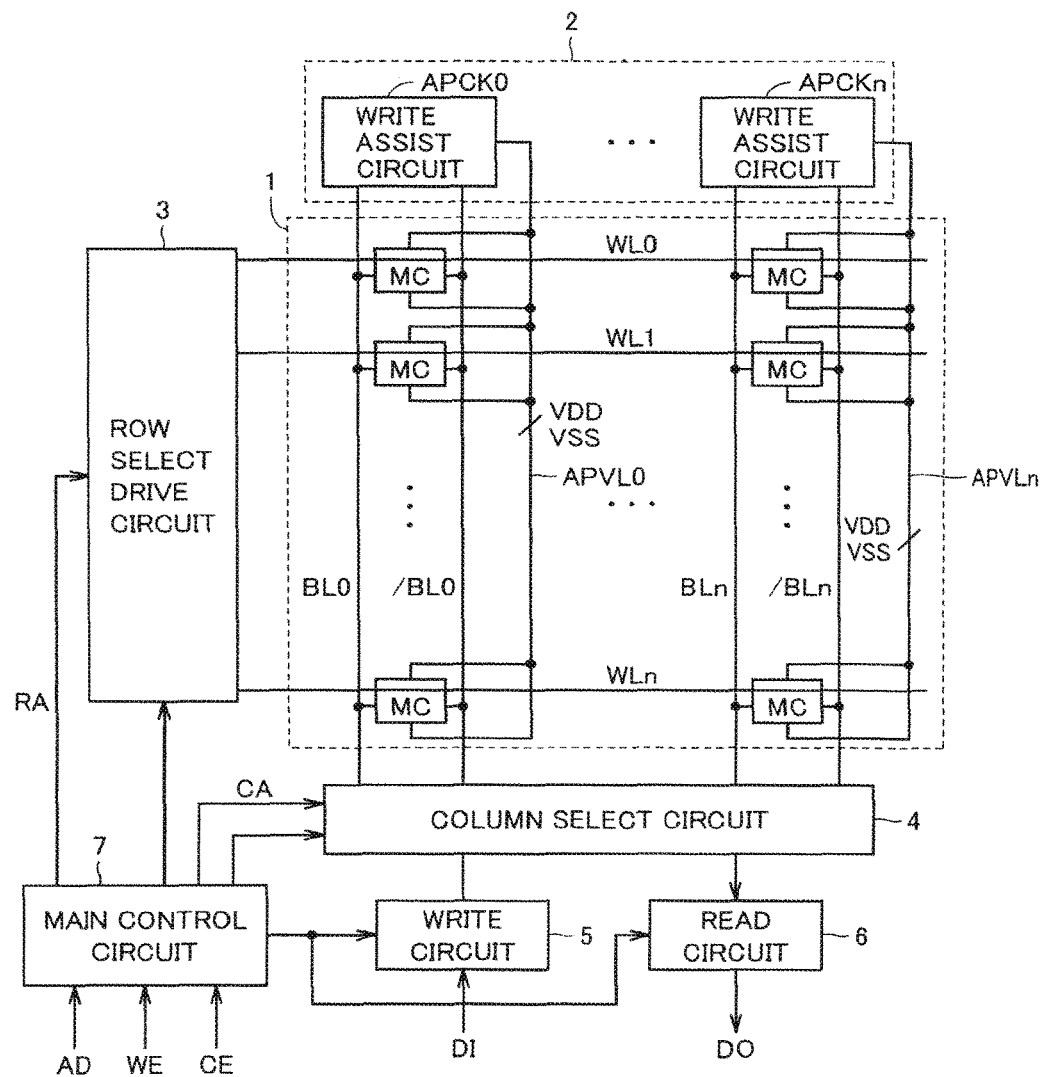
FIG. 50 schematically shows a construction of a main portion of a semiconductor memory device according to a seventeenth embodiment of the invention.

FIG. 50 schematically shows a whole construction of a semiconductor memory device according to a seventeenth embodiment of the invention. In the semiconductor memory device shown in FIG. 50, cell power supply control unit 2 includes write assist circuits APCK0, . . . and APCKn arranged corresponding to respective bit line pairs BL0 and /BL0, . . . , and BLn and /BLn. In the data write operation, these write assist circuits APCK0-APCKn set the voltage levels on cell power supply line pairs APVL0-APVLn arranged for the corresponding columns (bit line pairs) to the voltage levels different from those in the data read operation, respectively.

These cell power supply line pairs APVL0-APVLn are arranged corresponding to the memory cell columns, respectively, and each includes cell power supply lines (first and second power supply lines) transmitting cell high-side power supply voltage VDD and cell low-side power supply voltage VSS.

In the write operation, write assist circuits APCK0-APCKn set the voltage levels of cell power supply voltages VDD and VSS transmitted via corresponding cell power supply line pairs APVL0-APVLn to the intermediate voltage levels between power supply voltages VDD and VSS. Thus, the selected memory cell MC becomes instable in the write operation, and the fast writing is performed.

Other constructions of the semiconductor memory device shown in FIG. 50 are the same as those of the semiconductor memory device shown in FIG. 1. Corresponding portions are allotted with the same reference numerals, and description thereof is not repeated.

The write assist circuits APCK0-APCKn shown in FIG. 50 change both power supply voltages VDD and VSS on cell power supply line pairs APVL0-APVLn in the write operation. Therefore, the memory cell can enter the instable state more quickly (the noise margin can be further reduced, and thus the write margin can be further increased) as compared with the case where the voltage level of only one of VDD and VSS source lines is changed, and fast writing can be performed.

Figure 51:
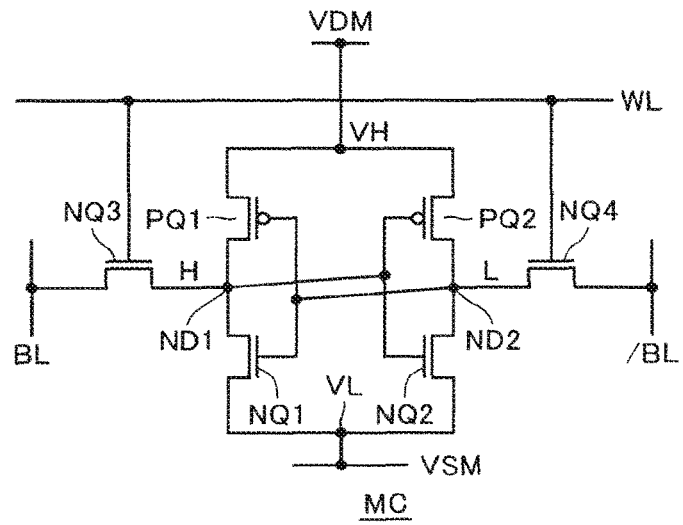
FIG. 51 shows, by way of example, a configuration of a memory cell shown in FIG. 50.

FIG. 51 shows an example of the construction of memory cell MC shown in FIG. 50. Memory cell MC shown in FIG. 51 differs from the memory cell shown in FIG. 2 in the following construction. In memory cell MC, low-side power supply node VI is coupled to VSS source line VSM. Low-side power supply node VL is connected commonly to the sources of MOS transistors NQ1 and NQ2 for data storage. Other configurations of memory cell MC shown in FIG. 51 are the same as those of the memory cells shown in FIG. 5. Corresponding portions are allotted with the same reference numerals, and description thereof is not repeated.

High-side power supply node VH and low-side power supply node VL are coupled to VDD cell power supply line (VDD source line) VDM and VSS cell power supply line (VSS source line) VSM included in cell power supply line pair APCK. Both the high- and low-side power supply nodes VH and VL of the memory cell have the voltage levels changed in the data write operation.

Figure 52:
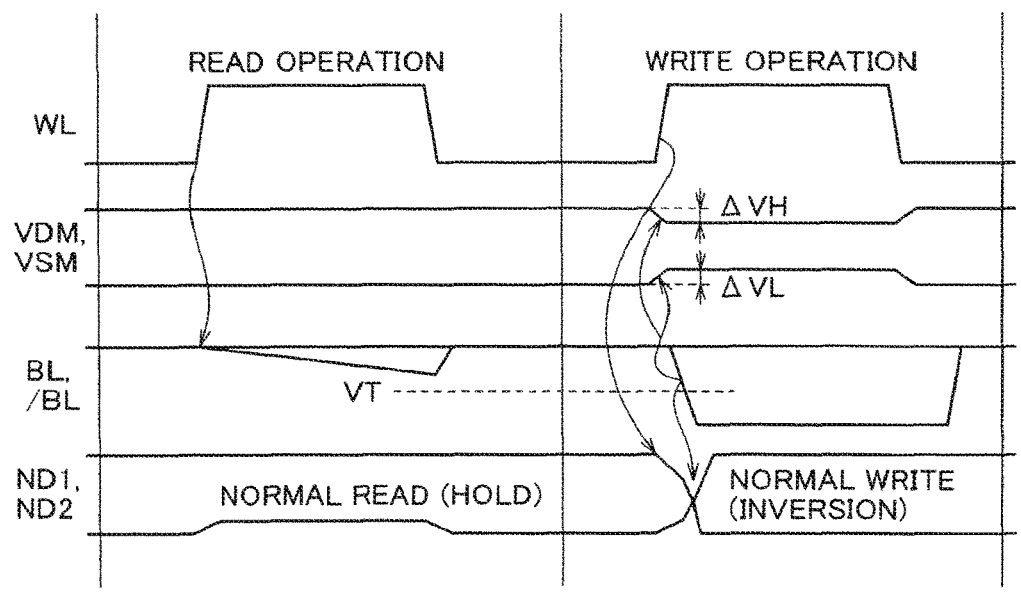
FIG. 52 is a signal waveform diagram representing an operation of the semiconductor memory device shown in FIG. 50.

FIG. 52 is a signal waveform diagram representing an operation of the semiconductor memory device shown in FIG. 50. FIG. 52 represents the operation in a case when data at the H and L levels are held at storage nodes ND1 and ND2 of memory cell MC shown in FIG. 51, respectively.

In the data read operation, when word line WL is driven to the selected state, and MOS transistors NQ3 and NQ4 in memory cell MC are turned on to connect storage nodes ND1 and ND2 to bit lines BL and /BL, respectively. Accordingly, a potential difference is developed between bit lines BL and /BL according to the storage data of memory cell MC. The potential difference of bit lines BL, and /BL is higher than a voltage level VT initiating the potential changing operation of write assist circuits APCK0-APCKn shown in FIG. 1. Therefore, the voltage levels of VDD and VSS source lines VDM and VSM are maintained at high- and low-side power supply voltages VDD and VSS, respectively.

The voltage at the L level on storage node ND2 in memory cell MC is raised through connection to complementary bit line /BL, but the voltage levels of high- and low-side power supply nodes VH and VL are at the levels of high- and low-side power supply voltages VDD and VSS, respectively, so that the data can be stably held and read.

In the data write operation, word line WL is selected, and the voltage levels of bit lines BL and /BL fully swing to power supply voltages VDD and VSS according to the write data, respectively. In this write operation, when one of bit lines BL and /BL has the voltage level lower than input logical threshold voltage VT of the write assist circuit, write assist circuits APCK0-APCKn shown in FIG. 50 turns active to change the voltage levels of VDD and VSS source lines VDM and VSM. Responsively, the voltage level of VDD source line VDM lowers by a voltage of $\Delta$VH, and the voltage level of VSS source line VSM rises by a voltage $\Delta$VL. Accordingly, the potential difference between high- and low-side power supply nodes VH and VL in memory cell MC decreases by a voltage of ($\Delta$VH+$\Delta$VL), and the voltage levels on storage nodes ND1 and ND2 in memory cell MC rapidly change according to the write data transmitted onto bit lines BL and /BL (storage nodes ND1 and ND2 are driven to the L and H levels, respectively).

In the data write operation, therefore, the voltage levels of high- and low-side power supply nodes VH and VL of the memory cell are changed to reduce the voltage difference therebetween, whereby the static noise margin decreases, and fast data writing can be performed.

VDD and VSS source lines VDM and VSM are each coupled to the power supply nodes of the memory cells in the corresponding column, and the parasitic capacitances thereof are substantially the same. Therefore, the potential changes of substantially the same magnitude can readily occur on source lines VDM and VSM.

In this construction, source lines VDM and VSM are arranged corresponding to the memory cell column, and the voltage levels of these source lines VDM and VSM are changed. Therefore, it is not necessary to arrange a separate dummy power supply line so that an interconnection area can be small, and the interconnection layout can be simple.

For the construction of arranging the VDD and VSS source lines corresponding to each memory cell column, substantially the same construction as that of arranging the VDD source line and the dummy source line in the foregoing embodiments can be employed. It is merely required to replace dummy source line DVSM with the VSS source line.

[First Specific Construction of Write Assist Circuit]

Figure 53:
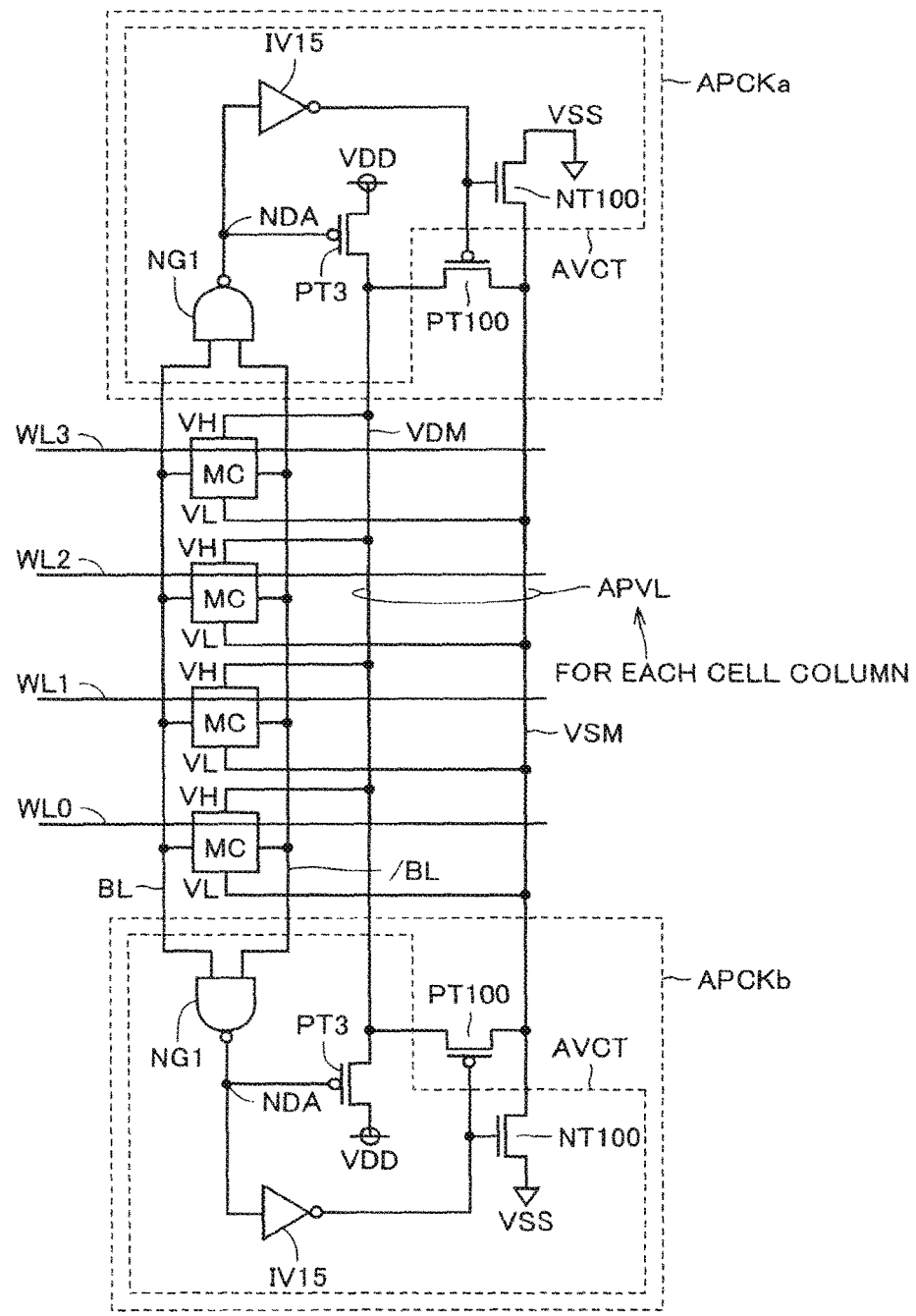
FIG. 53 shows a first construction of a write assist circuit according to the seventeenth embodiment of the invention.

FIG. 53 shows a specific construction of a write assist circuit of a semiconductor memory device according to a seventeenth embodiment of the invention. FIG. 53 shows a construction of a portion related to memory cells MC aligned in one column. Write assist circuits APCK (APCKa and APCKb) shown in FIG. 53 are arranged corresponding to each memory cell column. In FIG. 53, write assist circuits APCKa and APCKb are arranged corresponding to the memory cell column, and opposingly at the opposite ends of the bit line pair, respectively. Write assist circuits APCKa and APCKb have the same construction, and corresponding portions are allotted with the same reference numerals.

Each of write assist circuits APCKa and APCKb includes a cell power supply control section AVCT for controlling the power supply to cell power supply line pair APVL according to the potentials of bit lines BL and /BL on the corresponding column, and a P-channel MOS transistor PT100 for electrically coupling VDD and VSS source lines VDM and VSM together according to the output signal of cell power supply control section AVCT.

VDD and VSS source lines VDM and VSM included in cell power supply line pair APVL are arranged corresponding to each memory cell column, and are coupled to high- and low-side power supply nodes VI and VL of memory cells MC on the corresponding column, respectively.

Cell power supply control section AVCT has substantially the same construction as cell power supply control section VCT shown in FIG. 24, and includes NAND gate NG1 receiving voltages on bit lines BL and /BL, inverter IV15 receiving the output signal of NAND gate NG1, P-channel MOS transistor PT3 selectively isolating VDD source line VDM from the power supply node (VDD) according to the output signal of NAND gate NG1, and an N-channel MOS transistor NT100 selectively isolating VSS source line VSM from the ground node according to the output signal of inverter IV15.

P-channel MOS transistor PT100 is selectively turned on to couple electrically VDD and VSS source lines VDM and VSM together according to the output signal of inverter IV15. P-channel MOS transistor PT100 has a relatively high on-resistance, and the potentials of source lines VDM and VSM change according to movement of charges on source lines VDM and VSM even when P-channel MOS transistor PT100 is on. However, the potentials of source lines VDM and VSM do not become equal to each other, and the potential difference is present between them in a limited finite time. Assuming that MOS transistor PT100 has an on-resistance of Z, and each of VDD and VSS source lines VDM and VSM has an interconnection capacitance of C, the potential change rate of each of these source lines VDM and VSM is proportional to (VDD−ΔVH−ΔVL)/(R·C). When the potential difference between source lines VDM and VSM is large, the potential change speed is high, and will gradually decreases. In the write operation, therefore, a large potential change is initially present between VDD and VSS source lines VDM and VSM, and the operation margin in the write operation can be large. Further, VDD and VSS source lines VDM and VSM have substantially the same interconnection capacitance, and voltage changes ΔVH and ΔVL are substantially equal to each other. Therefore, the potential change caused between power supply node VL and VH can be nearly double the potential change caused in the case where the potential change is caused on one of cell power supply lines, and the memory cell can be rapidly set instable to increase the write margin.

FIG. 53 representatively shows four word lines WL0-WL3, and word lines are arranged corresponding to the respective memory cells arranged in one column.

Figure 54:
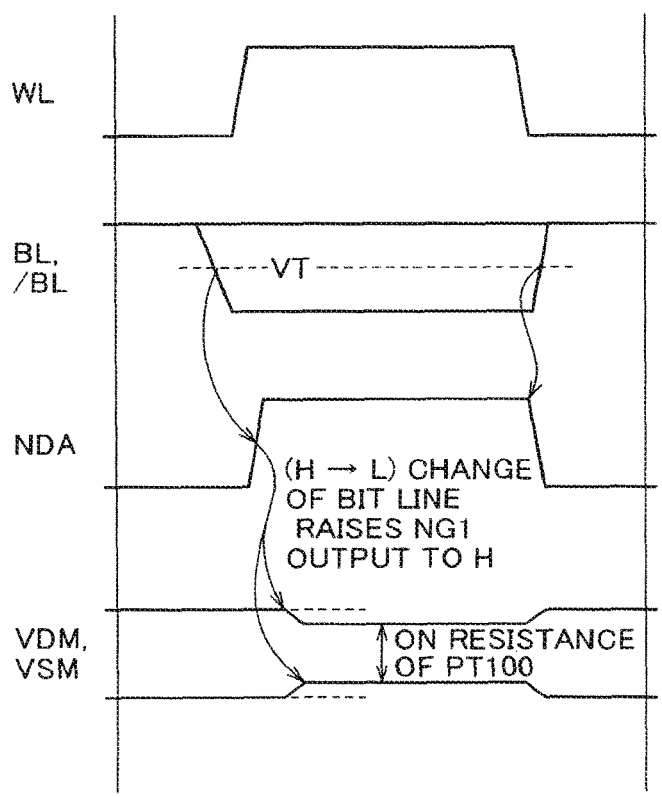
FIG. 54 is a signal waveform diagram representing an operation of the write assist circuit shown in FIG. 53.

FIG. 54 is a signal waveform diagram representing an operation for data writing of the construction shown in FIG. 53. Referring to FIG. 54, description will now be given of the operations of the write assist circuit shown in FIG. 53.

Before the data writing, bit lines BL and /BL are in a standby state. Bit lines BL and /BL are provided with a bit line load circuit (not shown). In the standby state, bit lines BL and /BL are precharged by the bit line load circuit to the power supply voltage level or a level close to it, and are at the H level. In this state, output node NDA of NAND gate NG1 is at the L level, and both MOS transistors PT3 and NT100 are in an on state, so that VDD and VSS source lines VDM and VSM are coupled to the power supply node and the ground node, and are at the levels of power supply voltages VDD and VSS, respectively.

In the data write operation, the potentials of bit lines BL and /BL change according to the write data. When one of the potentials of bit lines BL and /BL exceeds input logical threshold VT of NAND gate NG1, the output signal of NAND gate NG1 attains the H level, MOS transistors PT3 and NT100 are turned off, and source lines VDM and VSM are isolated from high- and low-side power supply nodes to attain the floating state, respectively. Concurrently, P-channel MOS transistor PT100 is turned on to couple electrically VDD source line VDM to VSS source line VSM.

P-channel MOS transistor PT100 has a relatively large on resistance (channel resistance and source/drain diffusion resistance), and the potentials of VDD and VSS source lines VDM and VSM are not equalized within a finite time even when charges move from VDD source line VDM in the floating state to VSS source line VSM in the floating state. Thus, the voltage level of VDD source line VDM slightly lowers from power supply voltage VDD, and the voltage level of VSS source line VSM rises slightly above low-side power supply voltage VSS (the voltage change speed is initially large, and will gradually decreases).

Owing to the changes in voltage levels of source lines VDM and VSM, the latching capability of memory cell MC is reduced, and the write margin increases so that the data writing can be performed fast. The changes in voltage level of source lines VDM and VSM are small, and the unselected memory cells on the selected cell column are ensured of a sufficiently large static noise margin, and can stably hold the data. Likewise, a memory cell on an unselected column and the selected row maintains the same state as that in the read operation, and can stably hold the data as in the read operation.

In the data read operation and standby state, the voltage levels of bit lines BL and /BL are higher than input logical threshold VT of NAND gate NG1, MOS transistors PT3 and NT100 are in an on state and MOS transistor PT100 is in an off state. Therefore, VDD and VSS source lines VDM and VSM reliably maintain high- and low-side power supply voltages VDD and VSS, respectively, and the data can be stably held and read.

According to the seventeenth embodiment, as described above, VDD and VSS source lines arranged corresponding to each memory cell column are used for changing both the voltage levels thereof in the data write operation, and the dummy source line as shown in FIG. 24 is not required so that the interconnection layout area can be further reduced. Further, only one MOS transistor is used instead of the CMOS transmission gate so that the layout area can be reduced.

The arrangement of source lines VDM and VSM in the seventeenth embodiment of the invention is achieved by providing P-, N- and P-wells for each memory cell column and arranging the VDD and VSS source lines extending in the column direction in each well region (e.g., by using third metal interconnection lines).

When cell power supply control section AVCT utilizes the same transistor layout as the two memory cells aligned in the column direction, it is possible to achieve the circuit construction of NAND gate NG1, inverter IV15 and MOS transistors PT3 and NT100. In this layout, merely P-channel MOS transistor PT100 for electrically coupling VDD source line VDM and VSS source line VSM is further required.

[Second Construction of Write Assist Circuit]

Figure 55:
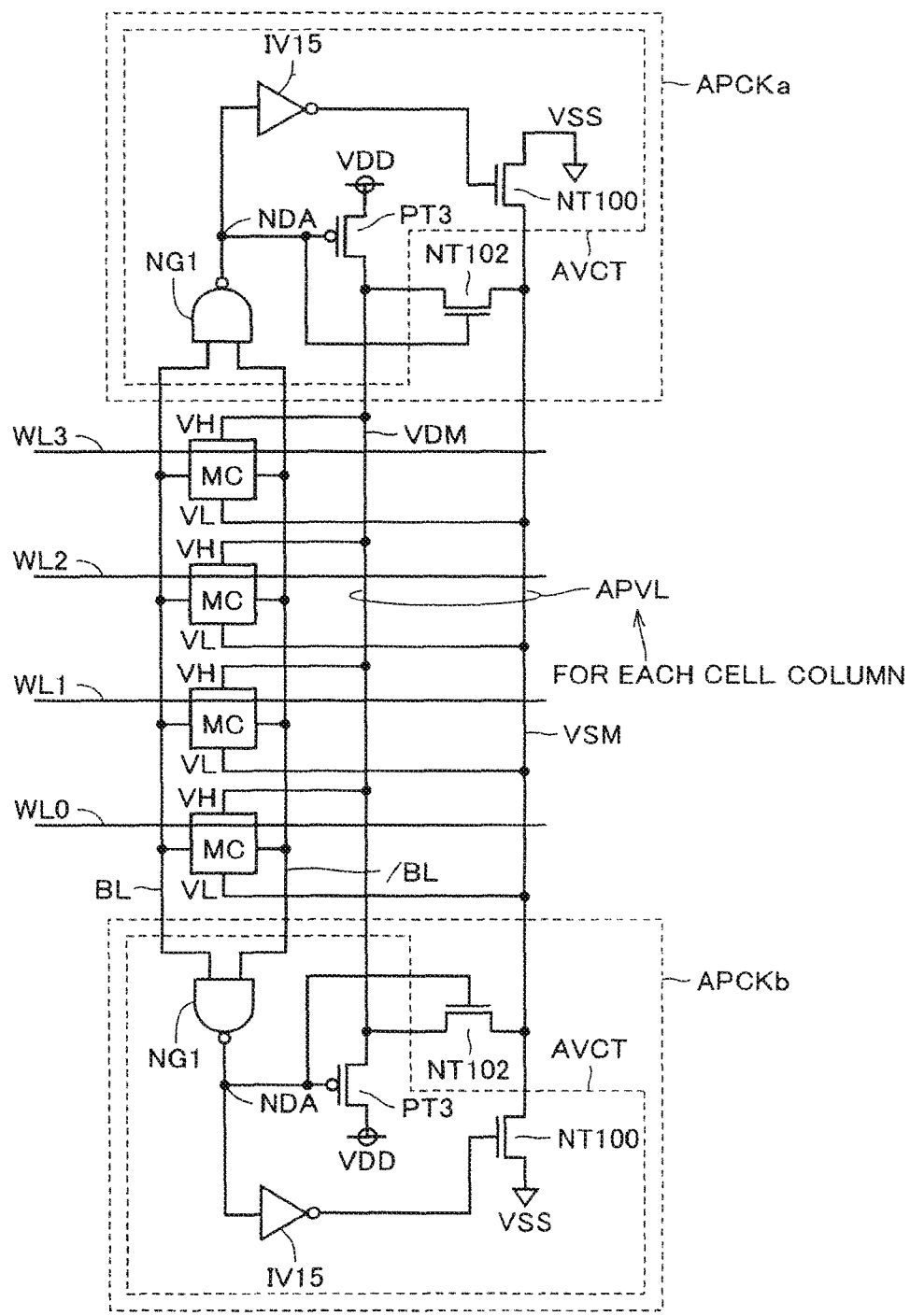
FIG. 55 shows a second construction of the write assist circuit according to the seventeenth embodiment of the invention.

FIG. 55 shows a second construction of the write assist circuit according to the seventeenth embodiment of the invention. Write assist circuits APCKa and APCKb shown in FIG. 55 are different in construction from the write assist circuits shown in FIG. 53 in the following points. An N-channel MOS transistor NT102 that is selectively turned on according to the signal on node NDA is used as the transistor element for electrically coupling VDD source line VDM to VSS source line VSM. Other constructions of write assist circuits APCKa and APCKb shown in FIG. 55 are the same as those of write assist circuits APCKa and APCKb shown in FIG. 53. Corresponding portions are allotted with the same reference numerals, and description thereof is not repeated.

The arrangement of memory cells MC, word lines WL0-WL3 and cell power supply line pair APVL is the same as that shown in FIG. 53. Thus, cell power supply line pair APVL (source lines VDM and VSM) is arranged for each memory cell column.

In the data write operation, in write assist circuits APCKa and APCKb shown in FIG. 55, one of the potentials of bit lines BL and /BL, attains the voltage level lower than input logical threshold VT (see FIG. 54) of NAND gate NG1. When the output signal of NAND gate NG1 attains the H level, N-channel MOS transistor NT102 is turned on, and MOS transistors PT3 and NT100 are turned off N-channel MOS transistor NT102 has a large on resistance, and suppresses movement of charges between VDD and VSS source lines VDM and VSM. The potentials of VDM and VSS source lines are not equalized, and a voltage difference is present. Similarly to the signal waveform diagram of FIG. 54, the potential level of VDD source line VDM slightly lowers, and the voltage level of VSS source line VSM slightly rises. Thereby, the memory cell MC is forced into an instable state, to increase the write margin.

Accordingly, in the construction using N-channel MOS transistor NT102 as the element for electrically coupling VDD and VSS source lines in the data write operation, the operation margin in the writing can be improved as in the construction of the write assist circuit shown in FIG. 53, and effect similar to that by the construction shown in FIG. 53 can be provided.

In the construction of the write assist circuit shown in FIG. 55, it is possible to implement the write assist circuit by utilizing the transistors of the layout similar to that of the memory cells of two columns. Thus, the transistor corresponding to the access transistor of the memory cell can be utilized as N-channel MOS transistor NT102 for electrical coupling, and therefore, the write assist circuit can be arranged by regularly and repetitively arranging the transistor formation region, although there is a difference in internal interconnection layout.

[Third Construction of Write Assist Circuit]

Figure 56:
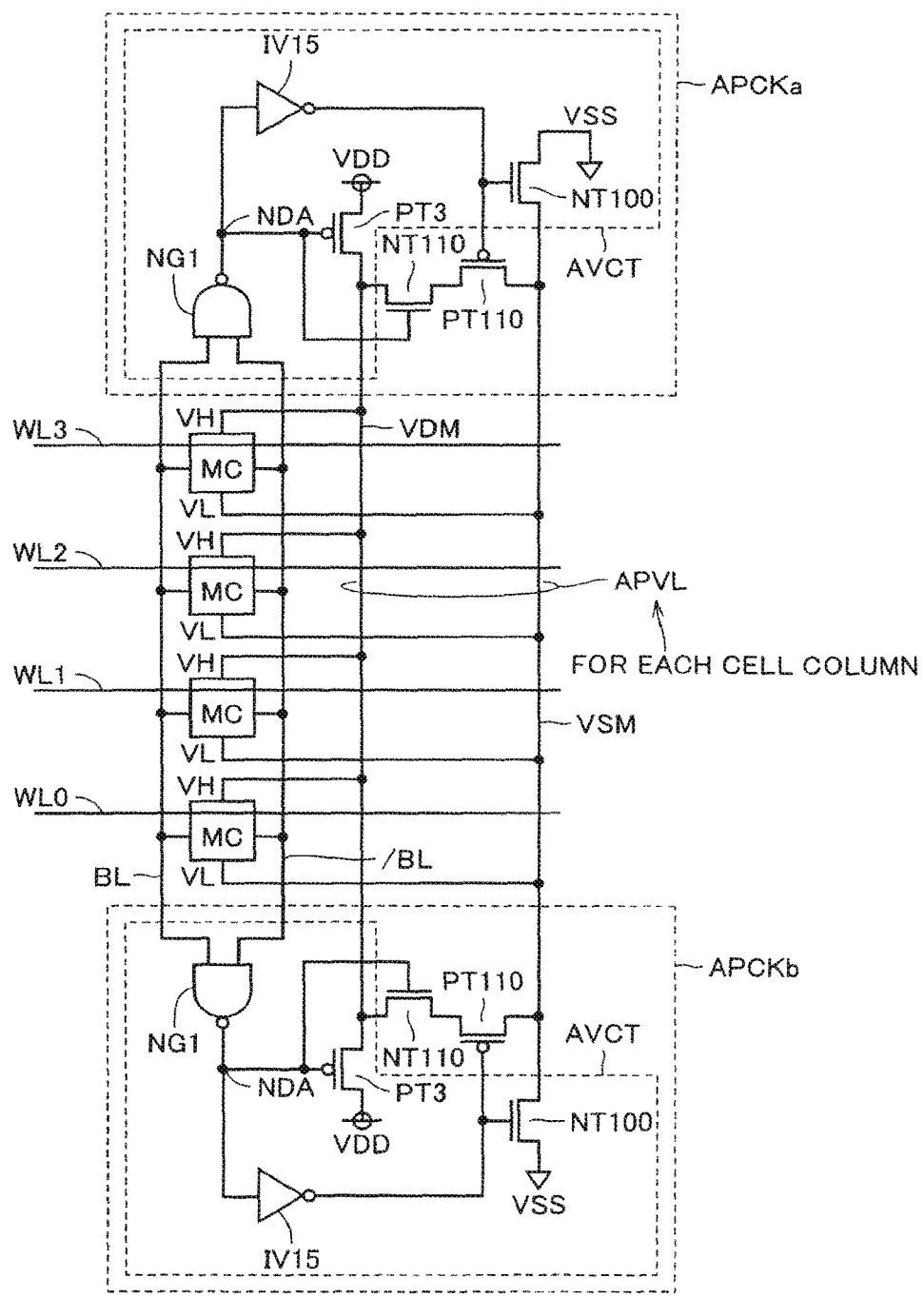
FIG. 56 shows a third construction of the write assist circuit according to the seventeenth embodiment of the invention.

FIG. 56 shows a third construction of the write assist circuit according to the seventeenth embodiment of the invention. The write assist circuits shown in FIG. 56 differ in construction from write assist circuits APCKa and APCKb shown in FIGS. 53 and 54 in the following points. N- and P-channel MOS transistors NT110 and PT110 are arranged in series between VDD and VSS source lines VDM and VSM. N-channel MOS transistor NT110 has a gate coupled to node NDA, and MOS transistor PT110 has a gate receiving the output signal of inverter IV15. N- and P-channel MOS transistors NT110 and PT110 are coupled to VDD and VSS source lines VDM and VSM, respectively.

Other constructions of the write assist circuit shown in FIG. 56 and the arrangement of memory cells are the same as those shown in FIG. 53 or 55. Corresponding portions are allotted with the same reference numerals, and description thereof is not repeated.

Figure 57:
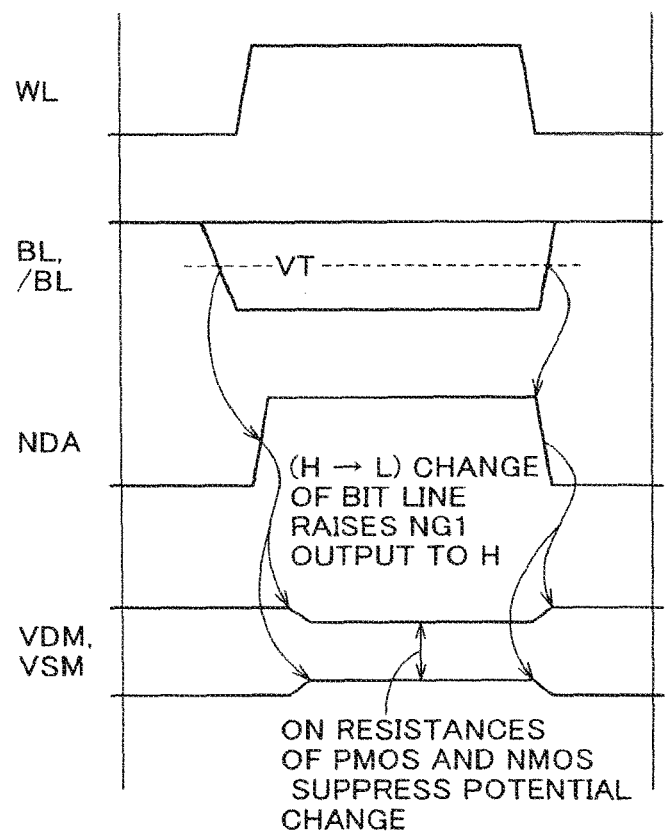
FIG. 57 is a signal waveform diagram representing an operation of the write assist circuit shown in FIG. 56.

FIG. 57 is a signal waveform diagram representing an operation of the write assist circuit shown in FIG. 56 in the data write operation. Referring to FIG. 57, description will now be given of an operation of the write assist circuit shown in FIG. 56.

In the data writing, when the potentials of bit lines BL and /BL change according to the write data, and the potential of one of the bit lines becomes lower than input logical threshold VT of NAND gate NG1, node NDA attains the H level. Responsively, MOS transistors PT3 and NT100 are turned off, and MOS transistors NT110 and PT110 are turned on. VDD and VSS source lines VDM and VSM that are in the floating state are electrically coupled via MOS transistors PT110 and NT110. A combined resistance of the on-resistances of MOS transistors PT110 and NT110 is much larger than the on-resistance of one MOS transistor, and therefore movement of the charges between source lines VDM and VSM in the floating state is suppressed. As shown in FIG. 57, therefore, the potential changes of VDD and VSS source lines VDM and VSM are suppressed to a greater extent than in the case of using one MOS transistor.

Thereby, such a situation is avoided that excessive rising of the potential of VSS source line VSM or excessive lowering of the potential of VDD source line VDM occurs to deteriorate the data holding characteristics of the memory cell, leading to data destruction. Thereby, the write operation margin can be increased more safely while suppressing lowering of the data holding characteristics.

[Modification]

Figure 58:
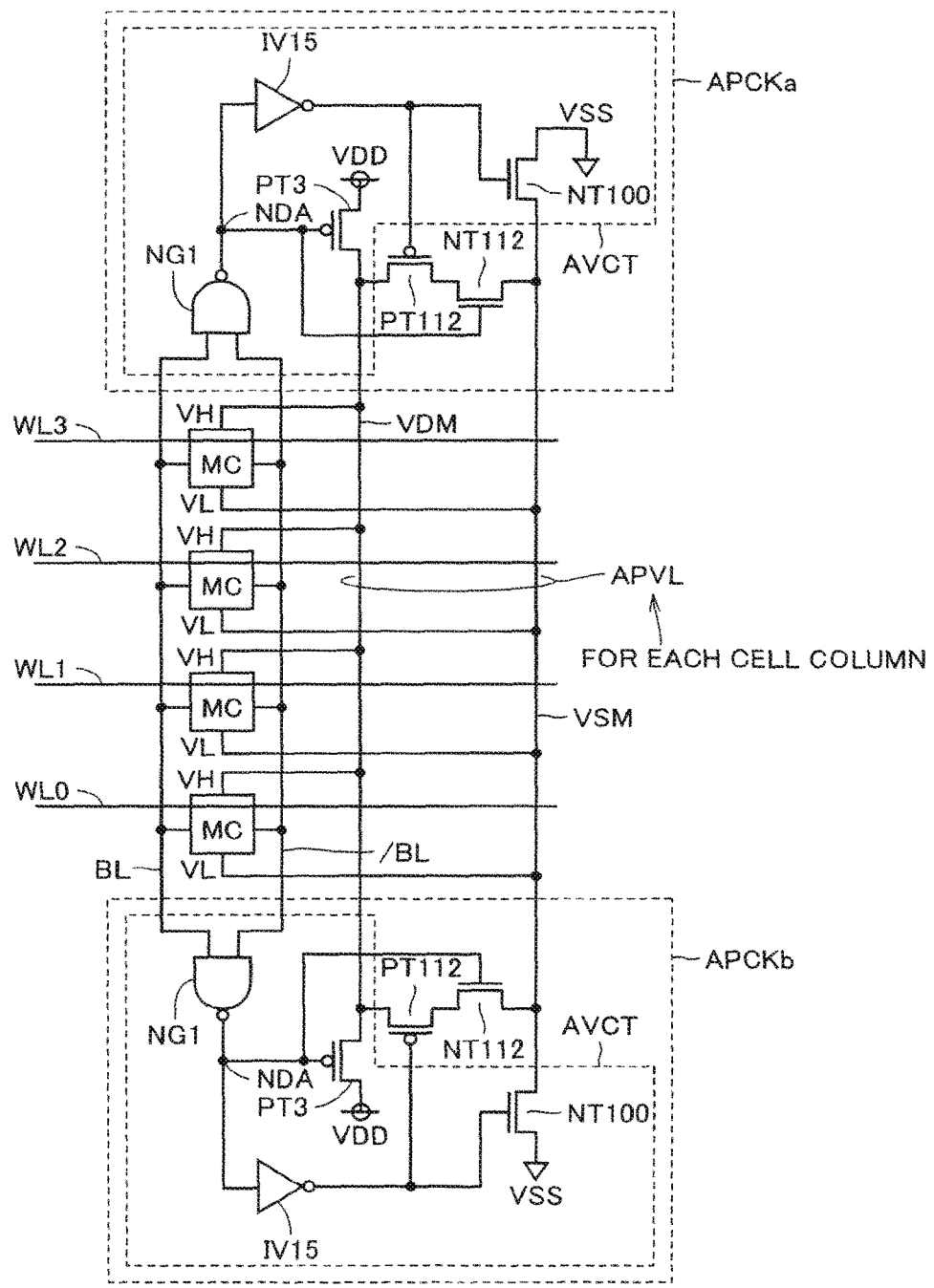
FIG. 58 shows a fourth construction of the write assist circuit according to the seventeenth embodiment of the invention.

FIG. 58 shows a construction of a modification of the third construction of the write assist circuit. In each of write assist circuits APCKa and APCKb, P- and N-channel MOS transistors PT112 and NT112 are connected in series between VDD and VSS source lines VDM and VSM. P-channel MOS transistor PT112 has a gate receiving the output signal of inverter IV15, and N-channel MOS transistor NT112 has a gate coupled to node NDA. P- and N-channel MOS transistors PT112 and NT112 are coupled to VDD and VSS source lines VDM and VSM, respectively.

Other constructions of the write assist circuit, arrangement of memory cells and arrangement of the cell power supply lines shown in FIG. 58 are the same as those shown in FIG. 56. Corresponding portions are allotted with the same reference numerals, and description thereof is not repeated.

The MOS transistors for electrically coupling VDD and VSS source lines VDM and VSM change positions, as compared with the transistor elements in the write assist circuit shown in FIG. 56. Therefore, with the construction shown in FIG. 58, substantially the same effect can be achieved as the construction of the write assist circuit shown in FIG. 56. Thus, the amount of potential changes of VDD and VSS source lines can be suppressed, to suppress deterioration of the data holding characteristics of the memory cell, and data can be stably held.

In the construction of the seventeenth embodiment described above, the write assist circuits are arranged on the opposite sides of the bit lines. However, the write assist circuit may be arranged at a central portion of the bit lines. If the bit line has a hierarchical structure including local and global bit lines, the write assist circuit may be arranged for each local bit line.

It has been described that cell power supply line pairs APVL0-APVLn (VDD and VSS source lines VDM and VSM) are individually arranged corresponding to the memory cell columns, respectively. However, these VDD and VSS source lines VDM may be arranged commonly to the memory array blocks, and the high- and low-side power supply voltages may be adjusted in units of memory array blocks.

According to the seventeenth embodiment of the invention, as described above, high- and low-side power supply lines (VDD and VSS source lines) arranged in the memory cell array are forced into floating state and are electrically coupled in the data write operation so that the voltage between the power supply nodes in the memory cell can be reduced further reliably in the data writing, and the operation margin in the writing operation can be increased. Since the cell power supply line is isolated from the power supply node, and the charges move merely between the VDD and VSS source lines VDM and VSM, so that it is possible to prevent flowing of a through current between the high- and low-side power supply nodes and thus to reduce the current consumption.

Eighteenth Embodiment

Figure 59:
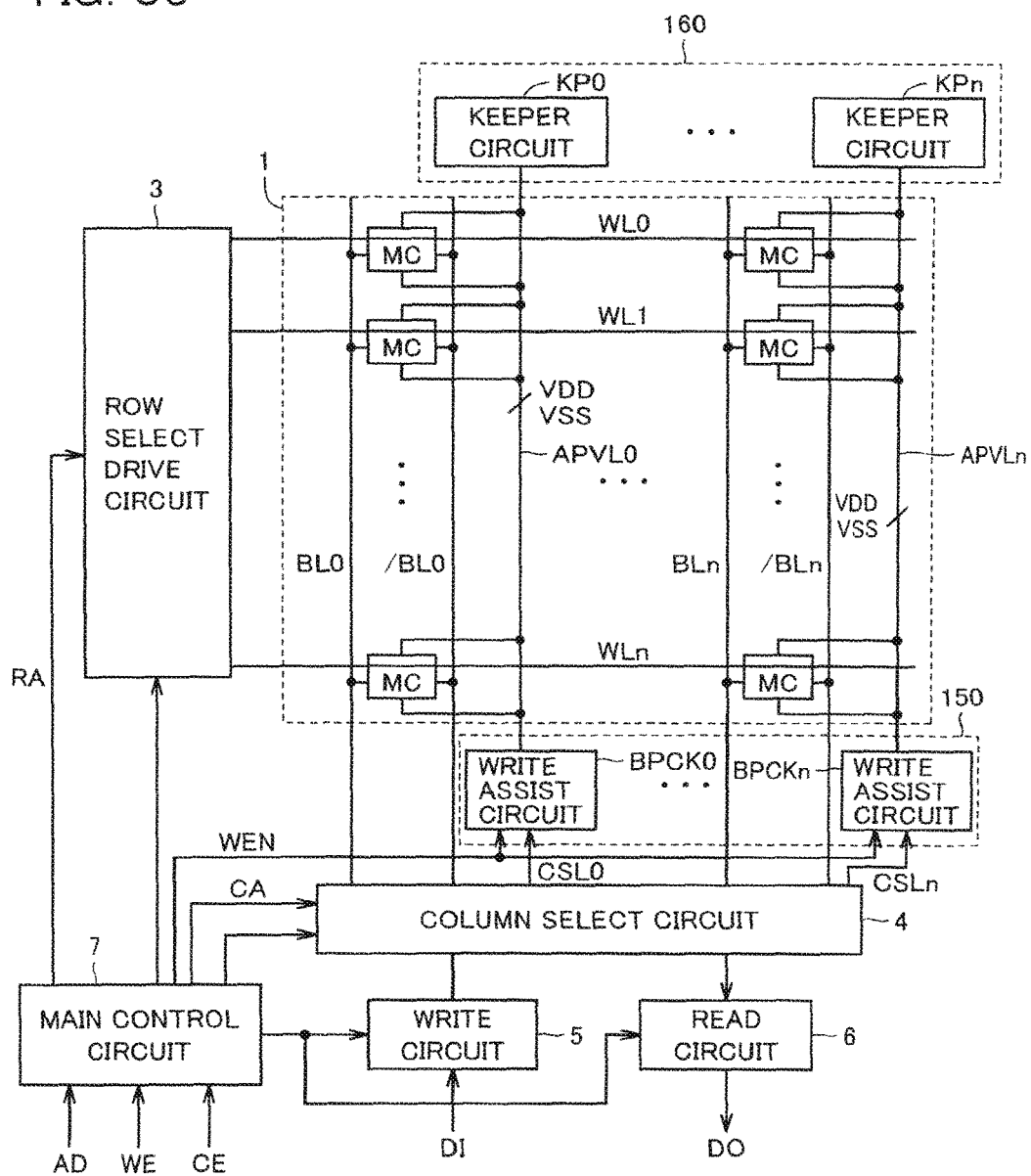
FIG. 59 schematically shows a construction of a main portion of a semiconductor memory device according to an eighteenth embodiment of the invention.

FIG. 59 schematically shows a construction of a main portion of a semiconductor memory device according to an eighteenth embodiment of the invention. The semiconductor memory device shown in FIG. 59 differs in construction from the semiconductor memory device shown in FIG. 50 in the following points.

A cell power supply control circuit 150 includes write assist circuits BPCK0-BPCKn arranged corresponding to cell power supply line pairs APVL0-APVLn arranged corresponding to the bit line pairs, respectively. These write assist circuits BPCK0-BPCKn change the voltage levels of the cell power supply line pairs arranged corresponding to a selected column according to column select signals CSL0-CSLn applied from column select circuit 4 and a write instruction signal WEN applied from main control circuit 7.

Column select signals CSL0-CSLn applied from column select circuit 4 correspond to the column select signal (CSL) applied from the column decoder (4a) as shown in FIG. 8, and are produced according to column address signal CA. Write instruction signal WEN is produced by main control circuit 7 according to a write enable signal WE and chip enable signal CE, and is made active in the data write operation.

A potential holding circuit 160 is arranged for cell power supply line pairs APVL0-APVLn at ends remote from cell power supply control circuit 150. Potential holding circuit 160 includes keeper circuits KP0-KPn arranged corresponding to cell power supply line pairs APVL0-APVLn, respectively. Keeper circuits KP0-KPn clamp the lower limit values of high-side power supply voltages VDD and the upper limit values of low-side power supply voltages VSS on corresponding cell power supply line pairs APVL0-APVLn at the predetermined voltage levels, respectively. With such configuration, excessive changes in potential of cell power supply line pairs APVL0-APVLn are suppressed in the data write operation.

Other constructions of the semiconductor memory device shown in FIG. 59 are the same as those of the semiconductor memory device shown in FIG. 50.

Corresponding portions are allotted with the same reference numerals, and description thereof is not repeated.

In the construction shown in FIG. 59, write assist circuits BPCK0-BPCKn adjust the voltage levels of corresponding cell power supply line pairs APVL0-APVLn according to write instruction signal WEN and column select signals CSL0-CSLn, respectively. Therefore, the voltage levels of cell power supply line pairs APVL0-APVLn can be adjusted before the change of the bit line potentials, and the data writing can be completed at a faster timing.

By arranging cell power supply control circuit 150 near the column select circuit, the column select signals can be transmitted to the respective write assist circuits while suppressing increase in interconnection length of the column select signal lines. Write assist circuits BPCK0-BPCKn merely adjust the potentials of the cell power supply lines (VDD and VSS source lines VDM and VSM) according to the potentials of the corresponding bit line pairs, respectively, and the loads are small as compared with the potential control of the substrate region (well region), so that the transistor size can be reduced, and increase in circuit layout area can be suppressed.

Figure 60:
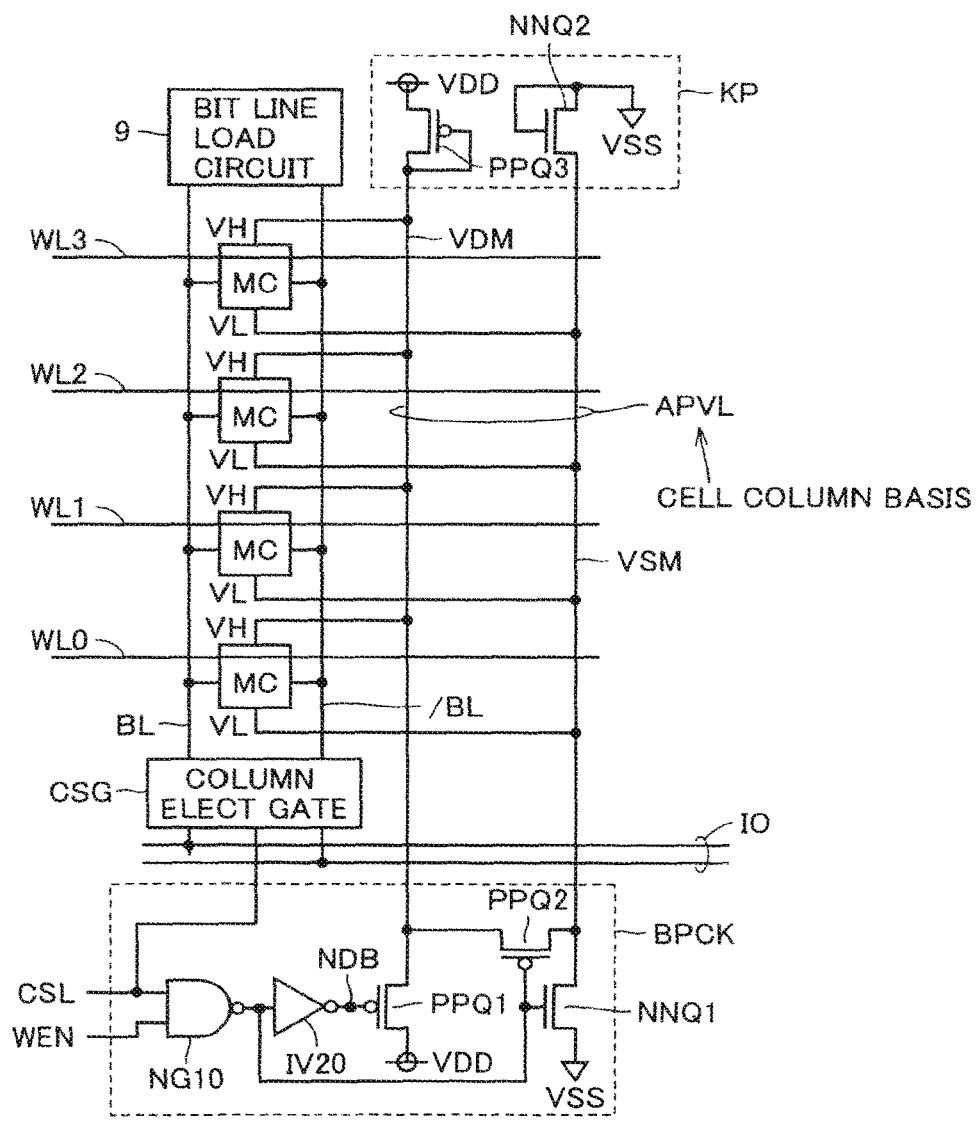
FIG. 60 shows, by way of example, constructions of a write assist circuit and a potential holding circuit shown in FIG. 59.

FIG. 60 shows, by way of example, specific constructions of keeper circuits KP0-KPn and write assist circuits BPCK0-BPCKn shown in FIG. 59. FIG. 60 representatively shows a construction of a portion related to the memory cells in one column. Word lines WL0-WL3 are arranged corresponding to memory cells MC, respectively. The memory cells aligned in one column may be greater in number than those shown in FIG. 60. The construction shown in FIG. 60 is arranged corresponding to each memory cell column.

At one end of bit line pair BL and /BL, there are arranged bit line load circuit 9 that precharges the bit lines to a predetermined voltage level equal to or lower than the power supply voltage, and supplies a column current to the bit lines as well as column select gate CSG that is made conductive according to column select signal CSL, to couple corresponding bit lines BL and /BL to internal data line pair IO.

Write assist circuit BPCK includes an NAND gate NG10 receiving column select signal CSL and write instruction signal WEN, an inverter IV20 inverting the output signal of NAND gate NG10, P-channel MOS transistor PPQ1 coupling VDD source line VDM to the high-side power supply node (VDD node) according to the output signal of inverter IV20, N-channel MOS transistor NNQ1 coupling VSS source line VSM to the low-side power supply node (VSS node) according to the output signal of NAND gate NG1, and P-channel MOS transistor PPQ2 electrically coupling source lines VDM and VSM according to the output signal of NAND gate NG10.

Write instruction signal WEN is set to the H level when made active (in the data write operation). Column select signal CSL is at the H level when a corresponding column is selected. Therefore, NAND gate NG10 outputs the signal at the L level when column select signal CSL designates the corresponding column.

Keeper circuit KP includes a diode-connected P-channel MOS transistor PPQ3 connected between VDD source line VDM and the high-side power supply node (VDD node), and a diode-connected N-channel MOS transistor NNQ2 connected between VSS source line VSM and the low-side power supply node (VSS node).

MOS transistor PPQ3 has a gate coupled to VDD source line V/DM, and clamps the lower limit value of the voltage on VDD source line VDM at the voltage level of (VDD−Vthp). MOS transistor NNQ2 has a gate coupled to the low-side power supply node, and clamps the upper limit value of the voltage on VSS source line VSM at the voltage level of (Vthn+VSS). Here, Vthp and Vthn represent the absolute values of the threshold voltages of MOS transistors PPQ3 and NNQ2, respectively.

Figure 61:
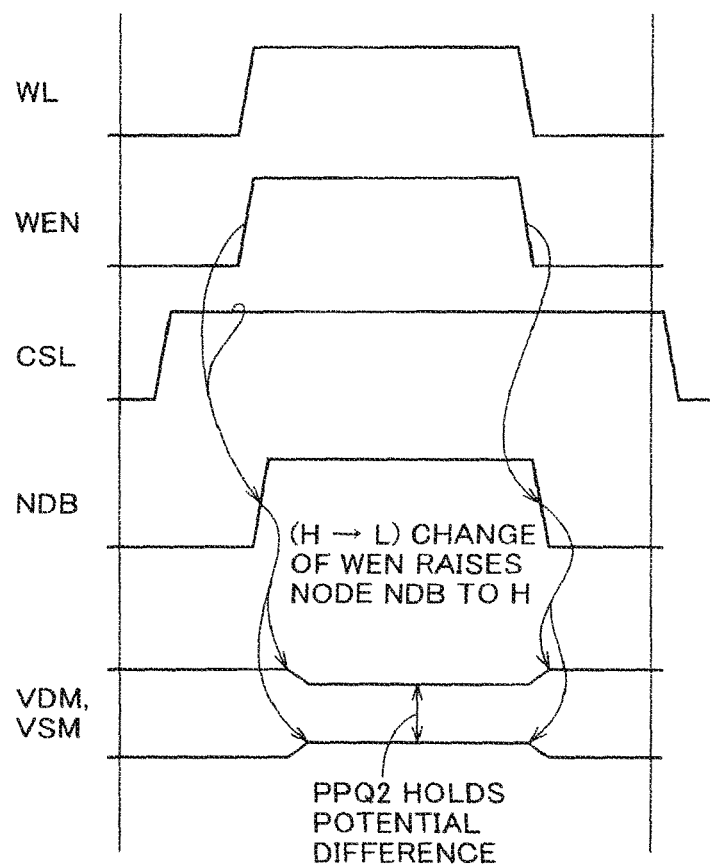
FIG. 61 is a signal waveform diagram representing an operation of the circuits shown in FIG. 60.

FIG. 61 is a signal waveform diagram representing an operation for data writing of the construction shown in FIG. 60. Referring to FIG. 61, description will now be given of an operation of the write assist circuit shown in FIG. 60.

In the standby state and the data read operation, write instruction signal WEN is at the L level, the output signal of NAND gate NG10 is at the H level, and the output signal of inverter IV20 is at the L level. In this state, therefore, both MOS transistors PPQ1 and NNQ1 are in an on state, and MOS transistor PPQ2 is in an off state. Therefore, VDD and VSS source lines VDM and VSM are maintained at the levels of high- and low-side power supply voltages VDD and VSS, respectively. In this state, clamping MOS transistors PPQ3 and NNQ3 in keeper circuit KP are in the reversely biased state, and both are in an off state.

In the data write operation, write instruction signal WEN is activated according to write enable signal WE. In this state, when column select signal CSL is in the selected state of the H level, the output signal of NAND gate NG10 is at the L level, so that the output signal of inverter IV20 attains the H level. In this state, both MOS transistors PPQ1 and NNQ1 are in an off state, and MOS transistor PPQ2 is in an on state. Accordingly, VDD and VSS source lines VDM and VSM are isolated from the corresponding power supply node, and are electrically coupled via MOS transistor PPQ2 to change the voltage levels thereof. When the MOS transistor PPQ2 has a small on-resistance, and the voltage levels of VDD and VSS source lines VDM and VSM change significantly, MOS transistors PPQ3 and NNQ2 of keeper circuit KP clamp the respective voltage levels, to prevent excessive changes in voltage on these VDD and VSS source lines VDM and VSM beyond the voltages of (VDD-Vthp) and (VSS+Vthn). Consequently, it is possible to prevent such a situation that power supply voltages VH and VL of the memory cell change significantly to degrade the data holding characteristics.

In this case, therefore, the voltage levels of VDD and VSS source lines VDM and VSM can be changed according to write instruction signal WEN before the potential change depending on the write data occurs on bit lines BL and /BL, and the writing can be performed according to the write data with the noise margin of the memory cells in the selected column kept small. Therefore, the fast writing can be achieved.

In the data write operation, column select signal CSL for the memory cells on an unselected columns is in the unselected state of the L level. Therefore, the output signal of NAND gate NG10 is at the H level, and the VDD- and VSS-source lines VDM and VSM maintain the same levels as those in the reading operation and the standby state, and thus maintain the levels of high- and low-side power supply voltages VDD and VSS, respectively. The level of the memory cell power supply voltage is adjusted on only the memory cell column of a target of data writing, and erroneous writing on the memory cells in an unselected column is reliably prevented.

For the memory cells on the selected column and unselected rows, the changes in voltage level of VDD and VSS source lines VDM and VSM are small, and deterioration of the data holding characteristics is suppressed, so that the data can be reliably held. The potentials of cell power supply lines VDM and VSM for the unselected columns do not change, and the potential change occurs only on the cell power supply lines in the selected column. The restoring of the voltage on the cell power supply line is delayed until the selected column turns into the unselected column, and it is not necessary to restore the voltages on the cell power supply lines in all the columns, and the current consumption is reduced.

For the construction of write assist circuit BPCK shown in FIG. 60, an N-channel MOS transistor may be employed instead of P-channel MOS transistor PPQ2 electrically coupling the source lines VDM and VSM with each other. In this construction, the output signal of inverter IV20 is applied to a gate of this potential change promoting N-channel MOS transistor.

[Modification]

Figure 62:
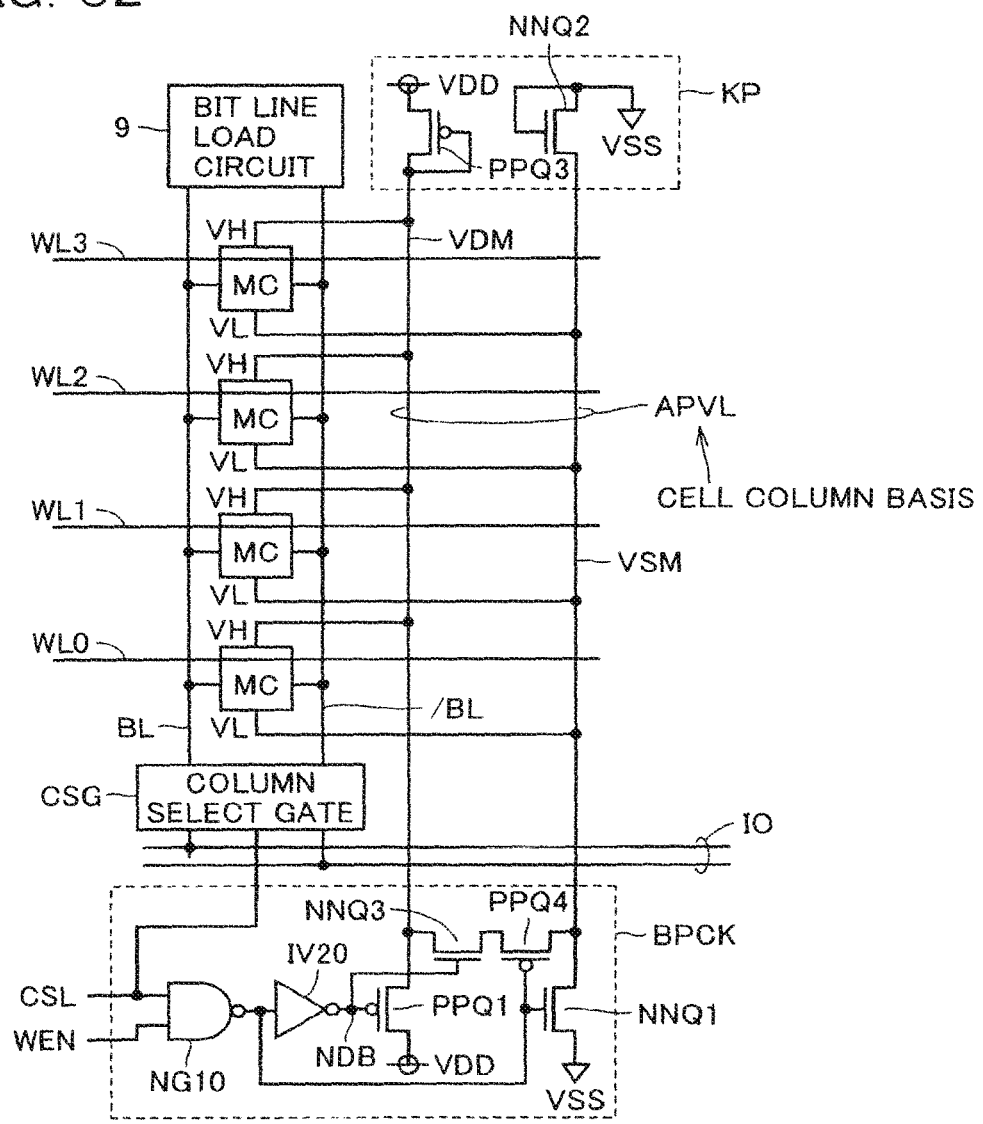
FIG. 62 shows another construction of the write assist circuit according to the eighteenth embodiment of the invention.

FIG. 62 shows a construction of a modification of the write assist circuit according to the eighteenth embodiment of the invention. In write assist circuit BPCK shown in FIG. 62, N- and P-channel MOS transistors NNQ3 and PPQ4 are arranged in series between VDD and VSS source lines VDM and VSM. MOS transistor NNQ3 has a gate coupled to node NDB, and MOS transistor PPQ4 has a gate coupled to the output of NAND gate NG10.

Other constructions of the write assist circuit shown in FIG. 62, the arrangement of the memory cells and the construction of keeper circuit KP are the same as those shown in FIG. 60. Corresponding portions are allotted with the same reference numerals, and description thereof is not repeated.

A serial connection body of MOS transistors NNQ3 and PPQ4 can couple VDD and VSS source lines VDM and VSM via a larger on-resistance than that of one switching transistor (transfer gate). Accordingly, it is possible to reduce the amounts of potential changes of VDD and VSS source lines VDM and VSM arranged corresponding to the selected column in the data write operation, and the write operation margin can be reliably increased to suppress destruction of the held data of the unselected memory cells.

In the construction shown in FIG. 62, N-channel MOS transistors NNQ3 and PPQ4 may be replaced with each other. When MOS transistors NNQ3 and PPQ4 have sufficient on-resistances, to make the amounts of the potential changes of VDD and VSS source lines VDM and VSM small, it is not particularly necessary to provide keeper circuit KP.

According to the eighteenth embodiment of the invention, as described above, the voltage levels of the cell power supply lines provided for the selected column are adjusted in the write operation, so that the write operation margin can be made large, and the data writing can be performed fast.

When the potential changes, electrical coupling is merely made between VDD and VSS source lines VDM and VSM in the floating state. Even when the write cycle is long, and charges move between the cell power supply lines, flowing of a DC current (through current) between the power supply node and the ground node can be prevented. The effect of suppressing the DC current when the write cycle is long can be also achieved in the eighteenth embodiment.

In the eighteenth embodiment, the bit line may e formed into a hierarchical structure including local and global bit lines. Each write assist circuit may be arranged for the local bit line.

Similarly to the seventeenth embodiment, write assist circuit BPCK may be achieved by arranging and interconnecting NAND gate NG10, inverter IV20 and MOS transistors PPQ1 and NNQ1, using a transistor formation region having a transistor layout similar to that of the two memory cells.

By applying the present invention to a static type semiconductor memory device, the write characteristics can be improved even with a low power supply voltage, and the power supply voltage values providing the lower limit characteristics of writing and reading can be utilized, which allows the lowered power supply voltage operation. Therefore, by utilizing the invention as a merged type memory in a highly integrated semiconductor device such as a System On Chip (SOC), it is possible to implement the semiconductor memory device that operates fast and stably with low power consumption.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a power supply node for a power supply voltage;
   a pair of bit lines;
   a plurality of word lines;
   a plurality of memory cells coupled to the pair of bit lines and the plurality of word lines so that one memory cell is coupled to one word line and the pair of bit lines;
   a cell power supply line coupled to the plurality of memory cells;
   a pair of data lines;
   a column select gate coupled to receive a column select signal and for coupling the pair of bit lines to the pair of data lines, respectively, based on the column select signal; and a p-channel type MOS transistor connected between the power supply node and the cell power supply line, wherein the p-channel type MOS transistor is controlled according to the column select signal, and wherein, among the plurality of memory cells, a memory cell coupled to the p-channel type MOS transistor via the cell power supply line is coupled to the column select gate via the pair of bit lines.

2. The semiconductor device according to claim 1, wherein the p-channel type MOS transistor disconnects the power supply node to the cell power supply line when data are written to the plurality of memory cells.

3. The semiconductor device according to claim 1, wherein the p-channel type MOS transistor disconnects the power supply node to the cell power supply line based on the column select signal when the column select gate couples the pair of bit lines to the pair of data lines for writing data to one of the plurality of memory cells based on the column select signal.

4. The semiconductor device according to claim 1, wherein the column select gate couples the pair of bit lines to the pair of data lines based on an active of the column select signal, and wherein the p-channel type MOS transistor connects the power supply node to the cell power supply line based on a non-active of the column select signal.

5. The semiconductor device according to claim 1, wherein the p-channel type MOS transistor disconnects the power supply node to the cell power supply line based on the active of the column select signal and a signal active on a write operation to a memory cell.

6. The semiconductor device according to claim 1, wherein each of the plurality of memory cells includes:

a first inverter having an input coupled to a first storage node and an output coupled to a second storage node, a second inverter having an input coupled to the second storage node and an output coupled to the first storage node, a first access transistor having a gate coupled to one of the plurality of word lines and a source-drain path coupled between one of the pair of bit lines and the first storage node;

a second access transistor having a gate coupled to the one of the plurality of word lines and a source-drain path coupled between the other of the pair of bit lines and the second storage node;

wherein the first inverter includes:

a first load transistor coupled between the second storage node and the cell power supply line and having a gate electrode coupled to the first storage node, and a first drive transistor coupled to the second storage node and having a gate electrode coupled to the first storage node; and wherein the second inverter includes:

a second load transistor coupled between the first storage node and the cell power supply line and having a gate electrode coupled to the second storage node, and a second drive transistor connected to the first storage node and having a gate electrode connected to the second storage node.

\* \* \* \* \*